(12) United States Patent
Tavakoli et al.

(10) Patent No.: US 12,347,476 B1
(45) Date of Patent: Jul. 1, 2025

(54) APPARATUS AND METHOD TO IMPROVE SENSING NOISE MARGIN IN A NON-LINEAR POLAR MATERIAL BASED BIT-CELL

(71) Applicant: Kepler Computing Inc., San Francisco, CA (US)

(72) Inventors: Ahmad Tavakoli, San Francisco, CA (US); Rajeev Kumar Dokania, Beaverton, OR (US); Mustansir Yunus Mukadam, Seattle, WA (US); Amrita Mathuriya, Portland, OR (US); Debo Olaosebikan, San Francisco, CA (US); Tanay Gosavi, Portland, OR (US); Noriyuki Sato, Hillsboro, OR (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 119 days.

(21) Appl. No.: 18/146,864

(22) Filed: Dec. 27, 2022

(51) Int. Cl.
*G11C 11/22* (2006.01)
*H10B 53/30* (2023.01)

(52) U.S. Cl.
CPC ........ *G11C 11/221* (2013.01); *G11C 11/2273* (2013.01); *H10B 53/30* (2023.02)

(58) Field of Classification Search
None
See application file for complete search history.

(56) References Cited

U.S. PATENT DOCUMENTS

| | | | |
|---|---|---|---|
| 4,506,351 A * | 3/1985 | Scheuerlein | ........ G11C 11/4097 365/207 |
| 4,715,015 A * | 12/1987 | Mimoto | ............. G11C 11/4091 365/207 |
| 4,809,225 A | 2/1989 | Dimmler et al. | |
| 4,853,893 A | 8/1989 | Eaton, Jr. et al. | |
| 5,086,412 A | 2/1992 | Jaffe et al. | |
| 5,218,566 A | 6/1993 | Papaliolios | |
| 5,270,967 A | 12/1993 | Moazzami et al. | |
| 5,381,364 A | 1/1995 | Chern et al. | |
| 5,383,150 A | 1/1995 | Nakamura et al. | |

(Continued)

FOREIGN PATENT DOCUMENTS

| | | |
|---|---|---|
| JP | H10255484 A | 9/1998 |
| JP | 2003123465 A | 4/2003 |

(Continued)

OTHER PUBLICATIONS

1st Office Action notified Dec. 11, 2020 for Taiwan Patent Application No. 109106095.

(Continued)

*Primary Examiner* — J. H. Hur
(74) *Attorney, Agent, or Firm* — MUGHAL GAUDRY & FRANKLIN PC

(57) ABSTRACT

Described herein is a memory sensing scheme that improves noise margin. In at least one embodiment, one or more circuitries are described that are coupled to a bit-cell, wherein the bit-cell is coupled to a plate-line and a bit-line, wherein the one or more circuitries are to sense a bit-value stored in the bit-cell based, at least in part, on a first floating charge on a plate-line and a second floating charge on a bit-line.

19 Claims, 28 Drawing Sheets

(56) References Cited

U.S. PATENT DOCUMENTS

| | | | |
|---|---|---|---|
| 5,539,279 A | 7/1996 | Takeuchi et al. |
| 5,541,872 A | 7/1996 | Lowrey et al. |
| 5,638,318 A | 6/1997 | Seyyedy |
| 5,640,030 A | 6/1997 | Kenney |
| 5,719,813 A * | 2/1998 | Seyyedy | G11C 11/4074 365/205 |
| 5,760,432 A | 6/1998 | Abe et al. |
| 5,917,746 A | 6/1999 | Seyyedy |
| 5,926,413 A | 7/1999 | Yamada et al. |
| 5,969,380 A | 10/1999 | Seyyedy |
| 6,002,608 A | 12/1999 | Tanabe |
| 6,028,784 A | 2/2000 | Mori et al. |
| 6,031,754 A | 2/2000 | Derbenwick et al. |
| 6,043,526 A | 3/2000 | Ochiai |
| 6,147,895 A | 11/2000 | Kamp |
| 6,346,741 B1 | 2/2002 | Buskirk et al. |
| 6,358,810 B1 | 3/2002 | Dornfest et al. |
| 6,388,281 B1 | 5/2002 | Jung et al. |
| 6,483,737 B2 | 11/2002 | Takeuchi et al. |
| 6,500,678 B1 | 12/2002 | Aggarwal et al. |
| 6,515,957 B1 | 2/2003 | Newns et al. |
| 6,548,343 B1 | 4/2003 | Summerfelt et al. |
| 6,587,367 B1 | 7/2003 | Nishimura et al. |
| 6,590,245 B2 | 7/2003 | Ashikaga |
| 6,610,549 B1 | 8/2003 | Aggarwal et al. |
| 6,643,163 B2 | 11/2003 | Takashima |
| 6,646,906 B2 | 11/2003 | Salling |
| 6,656,301 B2 | 12/2003 | Kirby |
| 6,656,748 B2 | 12/2003 | Hall et al. |
| 6,713,342 B2 | 3/2004 | Celii et al. |
| 6,717,838 B2 | 4/2004 | Hosoi |
| 6,720,600 B2 | 4/2004 | Okita |
| 6,728,128 B2 | 4/2004 | Nishimura et al. |
| 6,734,477 B2 | 5/2004 | Moise et al. |
| 6,795,331 B2 | 9/2004 | Noro |
| 6,798,686 B2 | 9/2004 | Takashima |
| 6,809,949 B2 | 10/2004 | Ho |
| 6,819,584 B2 | 11/2004 | Noh |
| 6,856,534 B2 | 2/2005 | Rodriguez et al. |
| 6,873,536 B2 | 3/2005 | Komatsuzaki |
| 6,906,944 B2 | 6/2005 | Takeuchi et al. |
| 6,924,997 B2 | 8/2005 | Chen et al. |
| 7,029,925 B2 | 4/2006 | Celii et al. |
| 7,173,844 B2 | 2/2007 | Lee et al. |
| 7,405,959 B2 | 7/2008 | Kolde et al. |
| 7,426,130 B2 | 9/2008 | Jeon |
| 7,514,734 B2 | 4/2009 | Aggarwal et al. |
| 7,642,099 B2 | 1/2010 | Fukada et al. |
| 7,791,922 B2 | 9/2010 | Doumae et al. |
| 7,812,385 B2 | 10/2010 | Noda |
| 8,129,200 B2 | 3/2012 | Kang |
| 8,177,995 B2 | 5/2012 | Kobayashi et al. |
| 8,300,446 B2 | 10/2012 | Qidwai |
| 8,508,974 B2 | 8/2013 | Clinton et al. |
| 8,665,628 B2 | 3/2014 | Kawashima |
| 8,717,800 B2 | 5/2014 | Clinton et al. |
| 8,865,628 B2 | 10/2014 | Manabe et al. |
| 9,472,560 B2 | 10/2016 | Ramaswamy et al. |
| 9,786,348 B1 | 10/2017 | Kawamura et al. |
| 9,818,468 B2 | 11/2017 | Müller |
| 9,830,969 B2 | 11/2017 | Slesazeck et al. |
| 10,043,567 B2 | 8/2018 | Slesazeck et al. |
| 10,354,712 B2 | 7/2019 | Derner et al. |
| 10,600,808 B2 | 3/2020 | Schröder |
| 10,847,201 B2 | 11/2020 | Manipatruni et al. |
| 10,872,905 B2 | 12/2020 | Müller |
| 10,963,776 B2 | 3/2021 | Mulaosmanovic et al. |
| 10,998,025 B2 | 5/2021 | Manipatruni et al. |
| 11,482,270 B1 | 10/2022 | Dokania et al. |
| 2002/0079520 A1 | 6/2002 | Nishihara et al. |
| 2002/0153550 A1 | 10/2002 | An et al. |
| 2003/0112650 A1 | 6/2003 | Kang |
| 2003/0119211 A1 | 6/2003 | Summerfelt et al. |
| 2003/0129847 A1 | 7/2003 | Celii et al. |
| 2004/0027873 A1 | 2/2004 | Nishihara |
| 2004/0104754 A1 | 6/2004 | Bruchhaus et al. |
| 2004/0129961 A1 | 7/2004 | Araujo et al. |
| 2004/0245547 A1 | 12/2004 | Stipe |
| 2005/0012126 A1 | 1/2005 | Udayakumar et al. |
| 2005/0214954 A1 | 9/2005 | Maruyama et al. |
| 2005/0230725 A1 | 10/2005 | Aggarwal et al. |
| 2005/0244988 A1 | 11/2005 | Wang et al. |
| 2006/0001070 A1 | 1/2006 | Park et al. |
| 2006/0002170 A1 | 1/2006 | Kumura et al. |
| 2006/0006447 A1 | 1/2006 | Kim et al. |
| 2006/0073613 A1 | 4/2006 | Aggarwal et al. |
| 2006/0073614 A1 | 4/2006 | Hara |
| 2006/0134808 A1 | 6/2006 | Summerfelt et al. |
| 2006/0258113 A1 | 11/2006 | Sandhu et al. |
| 2007/0298521 A1 | 12/2007 | Obeng et al. |
| 2008/0073680 A1 | 3/2008 | Wang |
| 2008/0081380 A1 | 4/2008 | Celii et al. |
| 2008/0107885 A1 | 5/2008 | Alpay et al. |
| 2008/0191252 A1 | 8/2008 | Nakamura et al. |
| 2009/0003042 A1 | 1/2009 | Lee et al. |
| 2012/0127776 A1 | 5/2012 | Kawashima |
| 2012/0307545 A1 | 12/2012 | McAdams et al. |
| 2012/0313218 A1 | 12/2012 | Fujimori et al. |
| 2013/0147295 A1 | 6/2013 | Shimizu |
| 2014/0208041 A1 | 7/2014 | Hyde et al. |
| 2015/0069481 A1 | 3/2015 | Sun et al. |
| 2015/0294702 A1 | 10/2015 | Lee et al. |
| 2017/0277459 A1 | 9/2017 | Rodriguez et al. |
| 2017/0345831 A1 | 11/2017 | Chavan et al. |
| 2018/0082981 A1 | 3/2018 | Gowda |
| 2018/0286987 A1 | 10/2018 | Lee et al. |
| 2018/0323309 A1 | 11/2018 | Ando et al. |
| 2019/0051642 A1 | 2/2019 | Hyde et al. |
| 2019/0051815 A1 | 2/2019 | Kakinuma et al. |
| 2019/0115353 A1 | 4/2019 | O'Brien et al. |
| 2019/0138893 A1 | 5/2019 | Sharma et al. |
| 2020/0004583 A1 | 1/2020 | Kelly et al. |
| 2020/0051607 A1 | 2/2020 | Pan et al. |
| 2021/0111179 A1 | 4/2021 | Shivaraman et al. |
| 2021/0398580 A1 | 12/2021 | Yuh |

FOREIGN PATENT DOCUMENTS

| | | |
|---|---|---|
| JP | 2005057103 A | 3/2005 |
| TW | 200718237 A | 5/2007 |
| TW | 200919705 A | 5/2009 |
| TW | 200935151 A | 8/2009 |
| TW | 201227879 A | 7/2012 |
| TW | 201725736 A | 7/2017 |
| WO | 20130147295 | 10/2013 |
| WO | 2015167887 A1 | 11/2015 |

OTHER PUBLICATIONS

1st Taiwan Office Action notified Mar. 3, 2022 for Taiwan Patent Application No. 110129115.
Advisory Action notified Nov. 16, 2021 for U.S. Appl. No. 16/287,953.
Advisory Action notified Nov. 16, 2021 for U.S. Appl. No. 16/288,004.
Advisory Action notified Nov. 16, 2021 for U.S. Appl. No. 16/288,006.
Chandler, T. "An adaptive reference generation scheme for 1T1C FeRAMs", 2003 Symposium on VLSI Circuits. Digest of Technical Papers (IEEE Cat. No. 03CH37408), Kyoto, Japan, 2003, pp. 173-174.
Final Office Action notified Aug. 15, 2022 for U.S. Appl. No. 17/346,083.
Final Office Action notified Oct. 7, 2021 for U.S. Appl. No. 16/287,953.
Final Office Action notified Oct. 7, 2021 for U.S. Appl. No. 16/288,004.
Final Office Action notified Oct. 7, 2021 for U.S. Appl. No. 16/288,006.
Final Office Action notified Sep. 12, 2022 for U.S. Appl. No. 17/367,217.
International Preliminary Report on Patentability notified Sep. 10, 2021 for PCT Patent Application No. PCT/US2020/018870.
International Preliminary Report on Patentability notified Sep. 10, 2021 for PCT Patent Application No. PCT/US2020/066963.

(56) References Cited

OTHER PUBLICATIONS

International Search Report & Written Opinion notified Jun. 19, 2020 for U.S. Patent Application No. PCT/US2020/018879.
International Search Report & Written Opinion notified Jun. 24, 2020 for PCT Patent Application No. PCT/US2020/018870.
Jung, D. et al., "Highly manufacturable 1T1C 4 Mb FRAM with novel sensing scheme," International Electron Devices Meeting 1999. Technical Digest (Cat. No. 99CH36318), Washington, DC, USA, 1999, pp. 279-282., International Electron Devices Meeting 1999. Technical Digest (Cat. No. 99CH36318), Washington, DC, USA, 1999, pp. 279-282.
Non-Final Office Action notified Aug. 5, 2020 for U.S. Appl. No. 16/287,953.
Non-Final Office Action notified Aug. 5, 2020 for U.S. Appl. No. 16/288,004.
Non-Final Office Action notified Aug. 5, 2020 for U.S. Appl. No. 16/288,006.
Non-Final Office Action notified Aug. 16, 2022 for U.S. Appl. No. 17/367,217.
Non-Final Office Action notified Dec. 20, 2021 for U.S. Appl. No. 16/288,004.
Non-Final Office Action notified Jan. 18, 2022 for U.S. Appl. No. 16/287,953.
Non-Final Office Action notified Jan. 19, 2022 for U.S. Appl. No. 16/288,006.
Non-Final Office Action notified Jun. 15, 2022 for U.S. Appl. No. 17/367,101.
Non-Final Office Action notified Jun. 26, 2020 for U.S. Appl. No. 16/287,876.
Non-Final Office Action notified Mar. 7, 2022 for U.S. Appl. No. 17/339,850.
Non-Final Office Action notified Nov. 4, 2022 for U.S. Appl. No. 17/530,362.
Non-Final Office Action notified Nov. 28, 2022 for U.S. Appl. No. 17/532,552.
Non-Final Office Action notified Oct. 12, 2022 for U.S. Appl. No. 17/530,365.
Non-Final Office Action notified Oct. 26, 2022 for U.S. Appl. No. 17/531,577.
Non-Final Office Action notified Sep. 1, 2022 for U.S. Appl. No. 17/339,850.
Non-Final Office Action notified Sep. 7, 2022 for U.S. Appl. No. 17/530,360.
Notice of Allowance notified Aug. 8, 2022 for U.S. Appl. No. 17/529,258.
Notice of Allowance notified Aug. 17, 2022 for U.S. Appl. No. 17/346,087.
Notice of Allowance notified Aug. 22, 2022 for U.S. Appl. No. 7/390,791.
Notice of Allowance notified Aug. 25, 2022 for U.S. Appl. No. 17/367,101.
Notice of Allowance notified Aug. 31, 2022 for U.S. Appl. No. 17/359,325.
Notice of Allowance notified Jan. 12, 2021 for U.S. Appl. No. 16/287,876.
Notice of Allowance notified Jul. 27, 2020 for U.S. Appl. No. 16/287,927.
Notice of Allowance notified Jun. 23, 2022 for U.S. Appl. No. 17/367,172.
Notice of Allowance notified Jun. 23, 2022 for U.S. Appl. No. 17/367,210.
Notice of Allowance notified Nov. 17, 2022 for U.S. Appl. No. 17/530,363.
Notice of Allowance notified Nov. 22, 2022 for U.S. Appl. No. 17/530,362.
Notice of Allowance notified Nov. 25, 2022 for U.S. Appl. No. 17/531,577.
Notice of Allowance notified Oct. 31, 2022 for U.S. Appl. No. 17/390,796.
Notice of Allowance notified Sep. 13, 2022 for U.S. Appl. No. 17/530,364.
Notice of Allowance notified Sep. 14, 2022 for U.S. Appl. No. 17/530,360.
Notice of Allowance notified Sep. 21, 2022 for U.S. Appl. No. 17/530,366.
Notice of Allowance notified Sep. 23, 2022 for U.S. Appl. No. 17/339,850.
Notice of Allowance notified Sep. 26, 2022 for U.S. Appl. No. 17/367,217.
Notice of Allowance notified Sep. 27, 2022 for U.S. Appl. No. 17/346,083.
Notice of Grant notified May 18, 2021 for Taiwan Patent Application No. 109106095.
Ogiwara, R. et al., "A 0.5-/spl mu/m, 3-V 1T1C, 1-Mbit FRAM with a variable reference bit-line voltage scheme using a fatigue-free reference capacitor", in IEEE Journal of Solid-State Circuits, vol. 35, No. 4, pp. 545-551, Apr. 2000.
Oh, S. et al. "Noble FeRAM technologies with MTP cell structure and BLT ferroelectric capacitors", IEEE International Electron Devices Meeting 2003, Washington, DC, USA, 2003, pp. 34.5.1-34.5.4.
Restriction Requirement notified Aug. 5, 2022 for U.S. Appl. No. 17/359,325.
Run-Lan et al., "Study on Ferroelectric Behaviors and Ferroelectric Nanodomains of YMno3 Thin Film", Acta Phys. Sin. vol. 63, No. 18 (2014). Supported by the National Natural Science Foundation of China. DOI: 10.7498/aps.187701. 6 pages.
Tanaka, S. et al., "FRAM cell design with high immunity to fatigue and imprint for 0.5 /spl mu/m 3 V 1T1C 1 Mbit FRAM", in IEEE Transactions on Electron Devices, vol. 47, No. 4, pp. 781-788, Apr. 2000.
Yamaoka, K. et al., "A 0.9-V 1T1C SBT-based embedded nonvolatile FeRAM with a reference voltage scheme and multilayer shielded bit-line structure", in IEEE Journal of Solid-State Circuits, vol. 40, No. 1, pp. 286-292, Jan. 2005.

\* cited by examiner

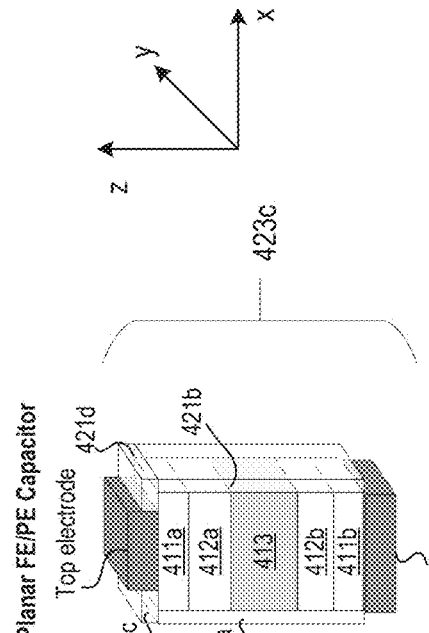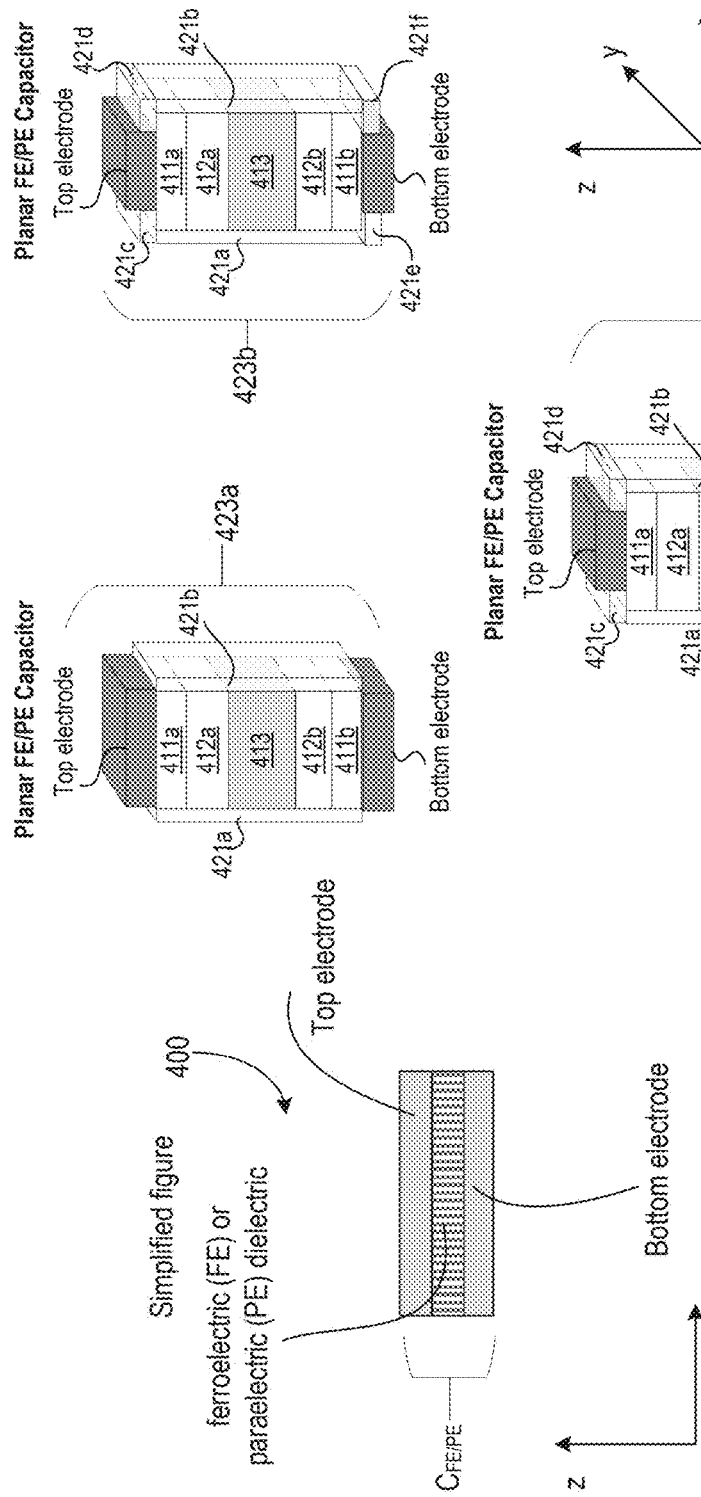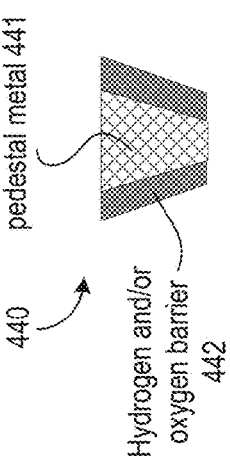
Fig. 4A
Fig. 4B
Fig. 4C

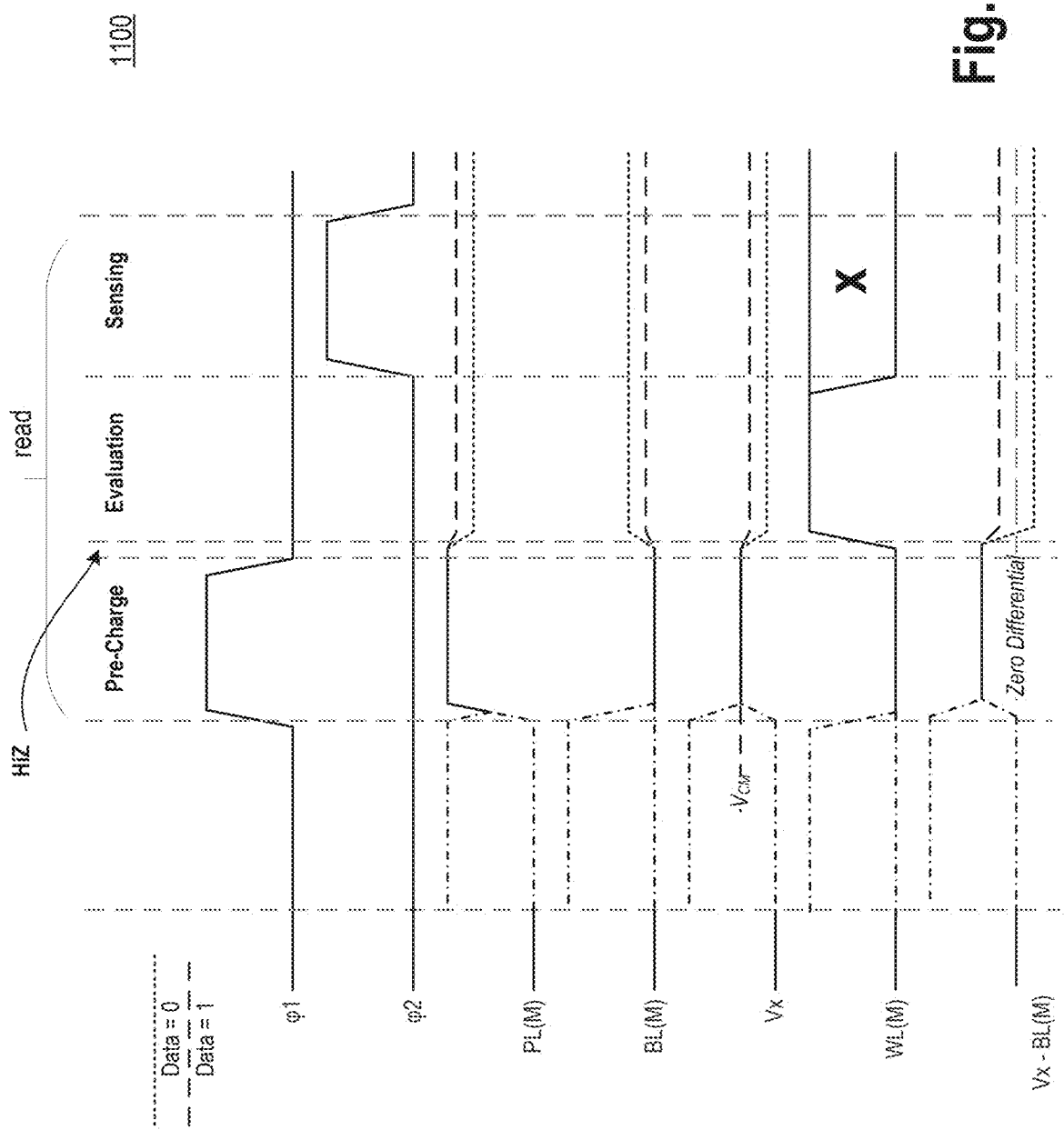

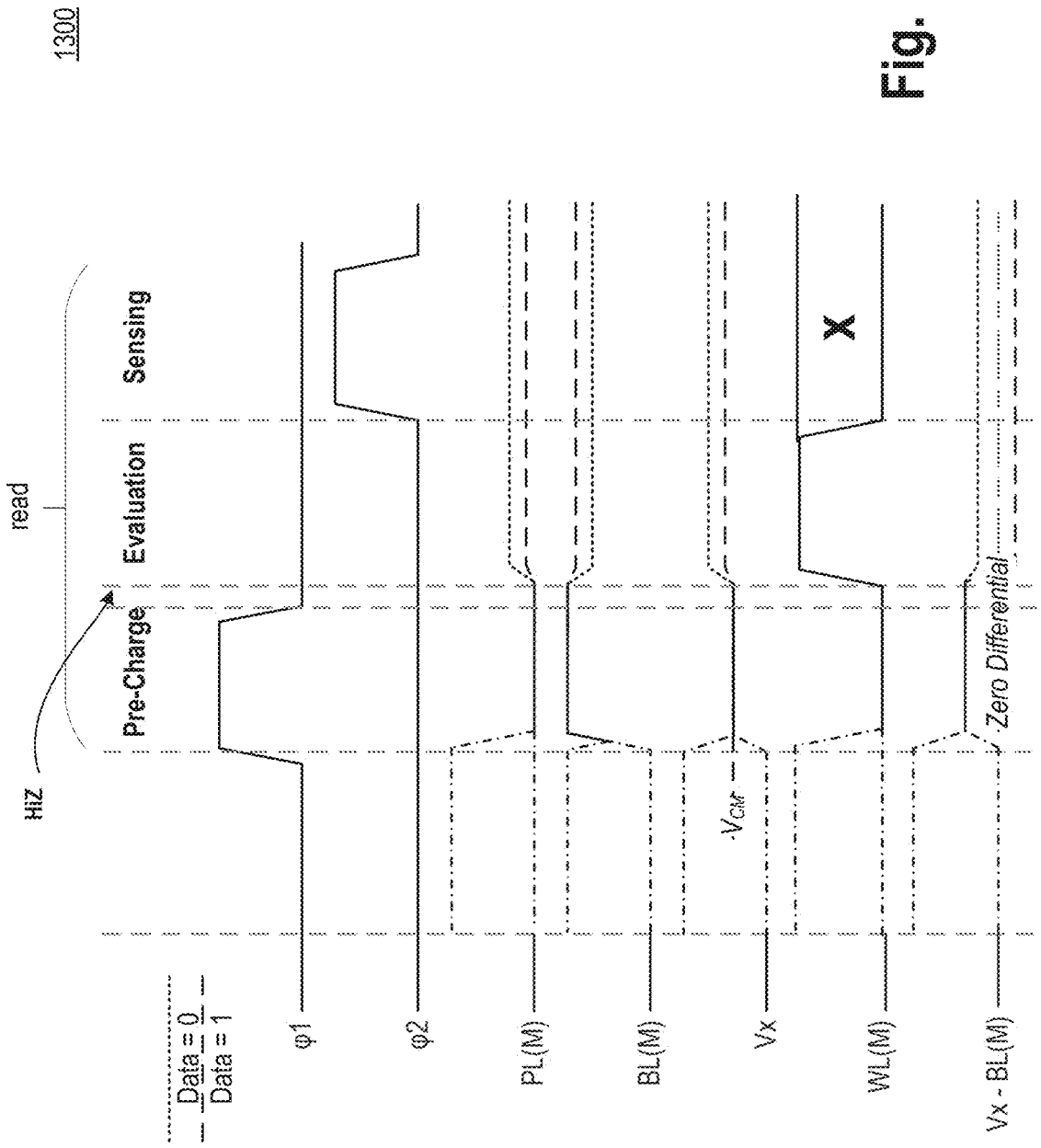

APPARATUS AND METHOD TO IMPROVE SENSING NOISE MARGIN IN A NON-LINEAR POLAR MATERIAL BASED BIT-CELL

BACKGROUND

Memory bit-cells are arranged in rows and columns that form segments, arrays, or banks. To access a bit-cell in a bank or array, a word-line is asserted to select a row or column in the bank or array where the bit-cell resides. To read from a bit-cell, a bit-line coupled to the bit-cell is pre-charged or pre-discharged and then floated to determine a voltage developed on the bit-line. A sense amplifier coupled to the bit-line senses the voltage developed on the bit-line. When a bit-cell includes a capacitive device for storing charge, the charge or voltage developed on the bit-line is approximately a ratio of charge on the capacitive device and capacitance of the bit-line. Routing bit-lines through large arrays adds capacitance to the bit-lines. For example, the capacitance of the bit-line increases as the length of the bit-line increases. Higher capacitance on the bit-line slows the accessing of the bit-cell. Also, higher capacitance on the bit-line slows the sensing on the voltage developed on the bit-line. For example, higher capacitance on the bit-line means lower sensing margin between sensing a 0 or a 1 logic value stored in the bit-cell. Lower sensing margin may restrict size of a memory array from growing.

The background description provided here is for the purpose of generally presenting the context of the disclosure. Unless otherwise indicated here, the material described in this section is not prior art to the claims in this application and are not admitted as prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 4A illustrates a planar ferroelectric or a paraelectric capacitor structure, in accordance with at least one embodiment.

FIG. 4B illustrates three planar ferroelectric or paraelectric capacitor structures, respectively, in accordance with at least one embodiment.

FIG. 4C illustrates a pedestal that connects to the top and/or bottom electrodes of the planar ferroelectric or paraelectric capacitor, in accordance with at least one embodiment.

FIG. 11A illustrates a timing diagram that shows operation of sensing circuitry of FIG. 10, in accordance with at least one embodiment.

FIG. 13A illustrates a timing diagram that shows operation of sensing circuitry of FIG. 12, in accordance with at least one embodiment.

DETAILED DESCRIPTION

Figure 1:
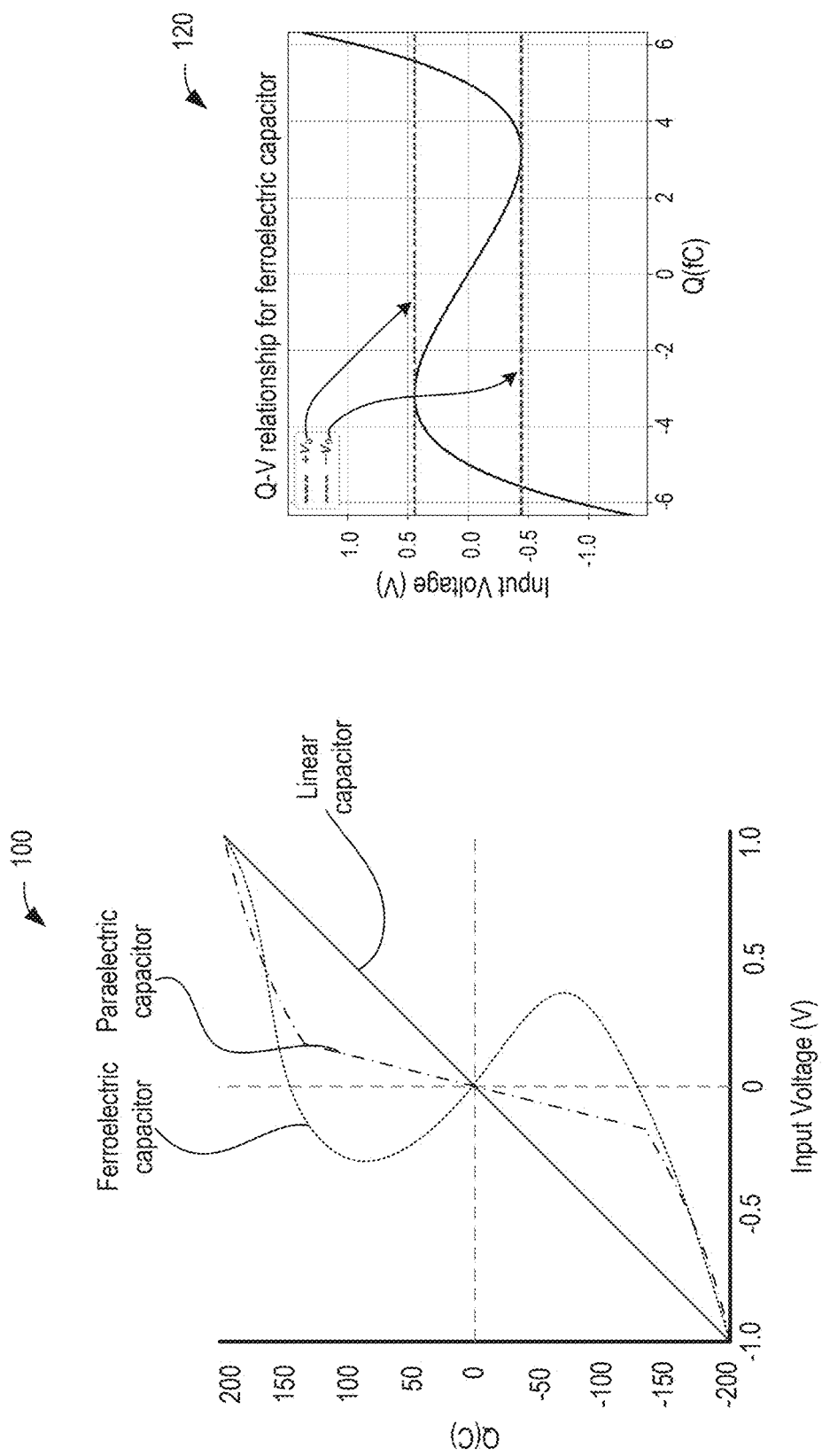
FIG. 1 illustrates a set of plots that show behavior of a ferroelectric capacitor, a paraelectric capacitor, and a linear capacitor.

In at least one embodiment, for a bit-cell which is controlled by a word-line (WL), a plate-line (PL), and a bit-line (BL), sensing data in bit-cell can be performed using PL and BL. In at least one embodiment, PL is parallel to BL. In at least one embodiment, WL is used to control a gate terminal of a transistor of a bit-cell. In at least one embodiment, a sense circuitry is provided which is coupled to PL and BL. In at least one embodiment, sense circuitry is to sense a bit-value stored in bit-cell based, at least in part, on a first floating charge on PL and a second floating charge on BL. In at least one embodiment, a first switch is provided which is coupled to PL and a first reference voltage. In at least one embodiment, a second switch is provided which is coupled to BL and a second reference voltage. In at least one embodiment, first switch is to pre-charge or pre-discharge PL to first reference voltage before sense circuitry is to sense first floating charge on PL. In at least one embodiment, second switch is to pre-charge or pre-discharge BL to second reference voltage before sense circuitry is to sense second floating charge on BL. In at least one embodiment, sense circuitry is to detect a difference between first floating charge and second floating charge. In at least one embodiment, WL is enabled (to turn on a transistor of bit-cell which is coupled to PL and BL) to allow development of voltages on PL and BL for sensing. In at least one embodiment, when PL is pre-charged to a higher voltage than BL, PL discharges through a capacitor of bit-cell, and this discharge passes through BL. In at least one embodiment, after PL discharges, PL develops a floating voltage. In at least one embodiment, voltage difference between PL and BL indicates stored value in bit-cell.

In at least one embodiment, bit-cell is a one-transistor one-capacitor (1T1C) bit-cell. In at least one embodiment, bit-cell is a two-transistor one-capacitor (2T1C) bit-cell. In at least one embodiment, bit-cell is a one-transistor and n-capacitor (1TnC) bit-cell. In at least one embodiment, bit-cell is a two-transistor and n-capacitor (2TnC) bit-cell. In at least one embodiment, a capacitor in bit-cell is replaced with a memory element. In at least one embodiment, a memory element is one of a magnetic tunneling junction (MTJ), a resistive device, a phase-change device, etc. In at least one embodiment, a capacitor of bit-cell comprises a non-linear polar material. In at least one embodiment, a non-linear polar material is one of a ferroelectric, a paraelectric, or a non-linear dielectric material. In at least one embodiment, non-linear polar material is doped one or more elements of a 3d, 4d, 5d, 6d, 4f, and 5f series of a periodic table.

In at least one embodiment, by using PL and BL to sense charge stored in a bit-cell, sense margin improves. In at least one embodiment, by improving sense margin, charge and polarization density requirement for a bit-cell having nonlinear polar material is reduced. In at least one embodiment, by improving sense margin, memory array size is increased which allows larger loads on PL and BL. In at least one embodiment, by improving sense margin, sensitivity of a sense amplifier and potentially size of a sense amplifier to sense BL and PL is reduced.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of the figures having the same reference numbers (or names) as the elements of any other figure can operate or function in any manner like that described but are not limited to such.

FIG. 1 illustrates a set of plots showing behavior of a ferroelectric capacitor, a ferroelectric capacitor, and a linear capacitor, in accordance with at least one embodiment. Plot 100 compares transfer function for a linear capacitor, a paraelectric (PE) capacitor (a nonlinear capacitor) and a ferroelectric (FE) capacitor (a nonlinear capacitor). Here, x-axis is input voltage or voltage across a capacitor, while y-axis is charge on a capacitor. In at least one embodiment, ferroelectric (FE) material can be any suitable low voltage FE material that allows FE material to switch its state by a low voltage (e.g., 100 mV). In at least one embodiment, threshold in FE material has a highly nonlinear transfer function in polarization versus voltage response. In at least one embodiment, threshold is related to: a) nonlinearity of switching transfer function; and b) squareness of FE switching. In at least one embodiment, nonlinearity of switching transfer function is width of derivative of polarization versus voltage plot. In at least one embodiment, squareness is defined by a ratio of remnant polarization to saturation polarization, where perfect squareness will show a value of 1. In at least one embodiment, squareness of FE switching can be suitably manipulated with chemical substitution. For example, in $PbTiO_3$ a P-E (polarization-electric field) square loop can be modified by La or Nb substitution to create an S-shaped loop. In at least one embodiment, shape can be systematically tuned to ultimately yield a nonlinear dielectric. In at least one embodiment, squareness of FE switching can also be changed by granularity of an FE layer. In at least one embodiment, a perfectly epitaxial, single crystalline FE layer may show higher squareness (e.g., ratio is closer to 1) compared to a polycrystalline FE. In at least one embodiment, perfect epitaxial can be accomplished using lattice matched bottom and top electrodes. In at least one embodiment, BiFeO (BFO) can be epitaxially synthesized using a lattice matched $SrRuO_3$ bottom electrode yielding P-E loops that are square. In at least one embodiment, progressive doping with La may reduce squareness.

Plot 120 shows charge and voltage relationship for a ferroelectric capacitor, in accordance with at least one embodiment. In at least one embodiment, a capacitor with ferroelectric material is a nonlinear capacitor with its potential $V_F(Q_F)$ as a cubic function of its charge. Plot 120 illustrates characteristics of an FE material, in accordance with at least one embodiment. Plot 120 is a charge-voltage (Q-V) plot for a block of $Pb(Zr_{0.5}Ti_{0.5})O_3$ of area $(100 \text{ nm})^2$ and thickness 30 nm (nanometer), in accordance with at least one embodiment. Plot 120 shows local extrema at $+/-V_o$ indicated by dashed lines. Here, $V_c$ is coercive voltage. In applying a potential V across an FE material, its charge can be unambiguously determined for $|V|>V_o$. Otherwise, charge of an FE material is subject to hysteresis effects.

In at least one embodiment, FE material comprises a perovskite of type $ABO_3$, where 'A' and 'B' are two cations of different sizes, and 'O' is oxygen which is an anion that bonds to both cations. Generally, size of atoms of A is larger than size of B atoms. In at least one embodiment, FE material can be replaced with a non-linear polar material. In at least one embodiment, non-linear polar material is one of a ferroelectric, a paraelectric, or a non-linear dielectric material. In at least one embodiment, non-linear polar material is doped with one or more elements of a 3d, 4d, 5d, 6d, 4f, and 5f series of a periodic table. In at least one embodiment, non-linear polar material includes perovskite that can be doped (e.g., by La or lanthanides). In least one embodiment, non-linear polar material includes lead zirconium titanate (PZT) or PZT with a first doping material, wherein the first doping material is one of La or Nb. In least one embodiment, non-linear polar material includes bismuth ferrite (BFO) with a second doping material, wherein the second doping material is one of lanthanum, one or more elements from lanthanide series of a periodic table, or one or more elements of a 3d, 4d, 5d, 6d, 4f, and 5f series of periodic table.

In at least one embodiment, non-linear polar material includes a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST). In at least one embodiment, non-linear polar material includes a hexagonal ferroelectric which includes one of: $YMnO_3$ or $LuFeO_3$. In at least one embodiment, non-linear polar material includes hexagonal ferroelectrics of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides or their alloyed oxides.

In at least one embodiment, non-linear polar material includes hafnium oxide of a form $Hf_{1-x}E_xO_z$, wherein 'x' denotes a fraction, and E includes one of Al, Ca, Ce, Dy, Er, Gd, Ge, La, Sc, Si, Sr, Sn, Zr, or Y. In at least one embodiment, non-linear polar material includes $HfO_2$ doped with $E_y$, where E includes one of Al, Ca, Ce, Dy, Er, Gd, Ge, La, Sc, Si, Sr, Sn, or Y, and wherein 'y' is a fraction. In at least one embodiment, non-linear polar material includes Al(1−x)Sc(x)N, Ga(1−x)Sc(x)N, Al(1−x)Y (x)N or Al(a)M g(b)Nb(c)N, wherein a, b, and c are respective compositional fractions. In at least one embodiment, non-linear polar material includes niobate type compounds including $LiNbO_3$, $LiTaO_3$, $LiTaO_2F_2$, and $Sr_xBa_{1-x}Nb_2O_6$ where $0.32 \leq x \leq 0.8$, or $KSr_2Nb_5O_{15}$. In at least one embodiment, non-linear polar material includes an improper ferroelectric material which comprises an epitaxial bilayer stack including one of: [barium titanate/strontium titanate]n or [lanthanum aluminate/strontium titanate]n, wherein 'n' represents a number of bilayers, and wherein 'n' is between 1 and 100. In at least one embodiment, non-linear polar material includes a paraelectric material that comprises $SrTiO_3$, Ba(x)Sr(y)TiO3, $HfZrO_2$, Hf—Si—O, or a PMN-PT based relaxor ferroelectrics.

In at least one embodiment, FE material is perovskite, which includes one or more of: La, Sr, Co, Sr, Ru, Y, Ba, Cu, Bi, Ca, or Ni. In at least one embodiment, metallic perovskites such as $(La,Sr)CoO_3$, $SrRuO_3$, $(La,Sr)MnO_3$, $YBa_2Cu_3O_7$, $Bi_2Sr_2CaCu_2O_8$, $LaNiO_3$, $BaTiO_3$, $KNbO_3$, or $NaTaO_3$, etc., may be used as FE material. In at least one embodiment, perovskites can be suitably doped to achieve a spontaneous distortion in a range of 0.3% to 2%. In at least one embodiment, for chemically substituted lead titanate such as Zr in Ti site; and La or Nb in Ti site, concentration of these substitutes is such that it achieves spontaneous distortion in range of 0.3% to 2%. In at least one embodiment, for chemically substituted BiFeO 3, BrCrO3, or BuC oO3 class of materials, La, or rare earth substitution into Bi site can tune spontaneous distortion. In at least one embodiment, FE material is contacted with a conductive metal oxide that includes one of conducting perovskite metallic oxides exemplified by: La—Sr—C oO3, $SrRuO_3$, La—Sr—MnO3, Y Ba2C u3O7, Bi2Sr2C aC u2O8, and L aNiO3.

In at least one embodiment, FE material comprises a stack of layers including low voltage FE material between conductive oxides. In at least one embodiment, when FE material is a perovskite, conductive oxides are of type AA'BB'O$_3$. A' is a dopant for atomic site A, it can be an element from lanthanides series. B' is a dopant for atomic site B, it can be an element from transition metal elements, such as Sc, Ti, V, Cr, Mn, Fe, Co, Ni, Cu, or Zn. In at least one embodiment, A' may have same valency of site A, with a different ferroelectric polarizability. In at least one embodiment, when metallic perovskite is used for FE material, conductive oxides can include one or more of: $IrO_2$, $RuO_2$, $PdO_2$, $OsO_2$, or $ReO_3$. In at least one embodiment, perovskite is doped with La or lanthanides. In at least one embodiment, thin layer (e.g., approximately 10 nm) perovskite template conductors such as SrRuO3 coated on top of IrO2, RuO2, PdO2, and PtO2, which have a non-perovskite structure but higher conductivity to provide a seed or template for growth of pure perovskite ferroelectric at low temperatures, are used as conductive oxides. In at least one embodiment, conductive oxides include one or more of: Ir, In, Fe, Ru, Pd, Os, or Re.

In at least one embodiment, ferroelectric materials are doped with s-orbital material (e.g., materials for first period, second period, and ionic third and fourth periods). In at least one embodiment, f-orbital materials (e.g., lanthanides) are doped to ferroelectric material to make paraelectric material. In at least one embodiment, room temperature paraelectric materials include: SrTiO3, Ba(x)Sr(y)TiO3 (where x may be, for example, −0.05 or 0.5, and y may be, for example, 0.95), HfZrO2, Hf—Si—O, La-substituted PbTiO3, or PMN-PT based relaxor ferroelectrics.

In at least one embodiment, FE material comprises one or more of: hafnium (Hf), zirconium (Zr), aluminum (Al), silicon (Si), their oxides, or their alloyed oxides. In at least one embodiment, FE material includes one or more of: Al(1−x)Sc(x)N, G a(1−x)Sc(x)N, Al(1−x)Y(x)N or Al(1−x−y)M g(x)Nb(y)N, y doped HfO 2, where x includes one of: Al, Ca, Ce, Dy, Er, Gd, Ge, La, Sc, Si, Sr, Sn, or Y, wherein 'x' or 'y' is a fraction. In at least one embodiment, FE material includes one or more of: bismuth ferrite (BFO), lead zirconate titanate (PZT), BFO with a first doping material, or PZT with a second doping material, wherein doping material is one of Nb or La; and relaxor ferroelectrics such as PMN-PT.

In at least one embodiment, FE material includes bismuth ferrite (BFO) or BFO with a first doping material wherein the first doping material is one of Lanthanum, any element from lanthanide series of periodic table, or one or more elements of a 3d, 4d, 5d, 6d, 4f, and 5f series of periodic table. In at least one embodiment, FE material includes lead zirconium titanate (PZT), or PZT with a second doping material, wherein doping material is one of La or Nb. In at least one embodiment, FE material includes a relaxor ferroelectric which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST).

In at least one embodiment, FE material includes hafnium oxides of form, Hf(1−x)ExOy where E can be Al, Ca, Ce, Dy, Er, Gd, Ge, La, Sc, Si, Sr, Sn, or Y. In at least one embodiment, FE material includes niobate type compounds LiNbO3, LiTaO3, lithium iron tantalum oxy fluoride, barium strontium niobate, sodium barium niobate, or potassium strontium niobate.

In at least one embodiment, FE material comprises multiple layers. In at least one embodiment, alternating layers of [Bi2O2]2+, and pseudo-perovskite blocks (Bi4Ti3O12 and related Aurivillius phases), with perovskite layers that are 'n' octahedral layers in thickness can be used. In at least one embodiment, FE material comprises organic material. In at least one embodiment, FE material comprises polyvinylidene fluoride or polyvinylidene difluoride (PVDF).

In at least one embodiment, FE material comprises hexagonal ferroelectrics of type h-RM nO 3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). In at least one embodiment, ferroelectric phase is characterized by a buckling of layered M nO5 polyhedra, accompanied by displacements of Y ions, which lead to a net electric polarization. In at least one embodiment, hexagonal FE includes one of: Y M nO 3 or L uFeO3. In at least one embodiment, when FE material comprises hexagonal ferroelectrics, conductive oxides are of A2O3 (e.g., In2O3, Fe2O3) and ABO3 type, where 'A' is a rare earth element and B is Mn.

In at least one embodiment, FE material comprises improper FE material. An improper ferroelectric is a ferroelectric where primary order parameter is an order mechanism such as strain or buckling of atomic order. In at least one embodiment, improper FE material are LuFeO3 class of materials or super lattice of ferroelectric and paraelectric materials PbTiO3 (PTO) and SnTiO3 (STO), respectively, and LaAlO3 (LAO) and STO, respectively. In at least one embodiment, a super lattice of [PTO/STO]n or [LAO/STO] n, where 'n' is between 1 and 100. In at least one embodiment, paraelectric material includes one of: SrTiO3, Ba(x) Sr(y)TiO3 (where x may be, for example, −0.5, and y may be, for example, 0.95), BaTiO3, HfZrO2, Hf—Si—O, La-substituted PbTiO3, or PMN-PT based relaxor ferroelectrics.

Figure 2:
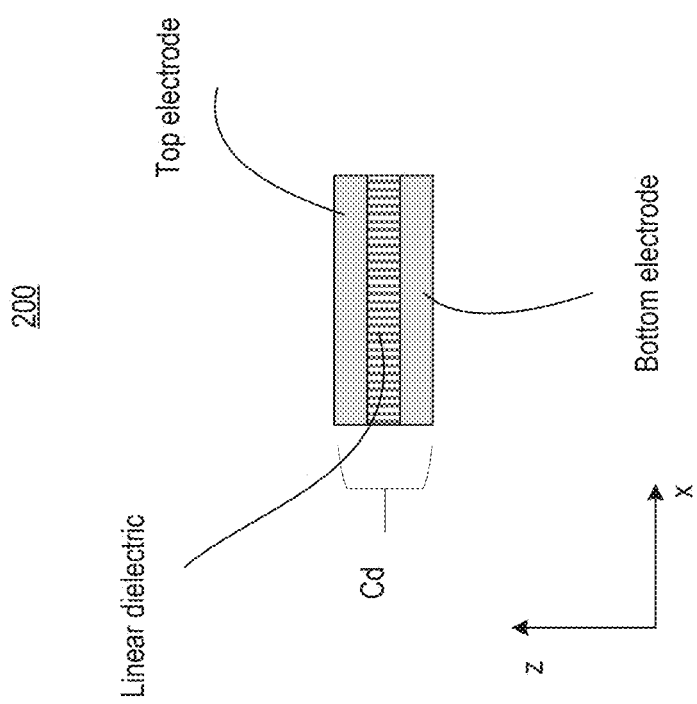
FIG. 2 illustrates a planar linear capacitor structure, in accordance with at least one embodiment.

FIG. 2 illustrates planar capacitor structure 200, in accordance with at least one embodiment. In at least one embodiment, capacitors for multi-input capacitive structures are linear capacitors. In at least one embodiment, capacitors can take any planar form. One such form is illustrated in FIG. 2, in accordance with at least one embodiment. In at least one embodiment, planar capacitor structure 200 is a metal-insulator-metal (MIM) capacitor comprising a bottom electrode, a top electrode, and a linear dielectric between top electrode and bottom electrode as shown. In at least one embodiment, conductive oxide layer(s) are formed between a bottom electrode and a linear dielectric. In at least one embodiment, conductive oxide layer(s) are formed between top electrode and linear dielectric. In at least one embodiment, conductive oxides include: $IrO_2$, $RuO_2$, $PdO_2$, $OsO_2$, or $ReO_3$. In at least one embodiment, conductive oxides are of form A2O3 (e.g., In2O3, Fe2O3) and ABO3 type, where 'A' is a rare earth element and 'B' is Mn.

In at least one embodiment, dielectric layer includes one or more of: $SiO2$, $Al_2O_3$, $Li_2O$, $HfSiO_4$, $Sc_2O_3$, $SrO$, $HfO_2$, $ZrO_2$, $Y_2O_3$, $Ta_2O_5$, $BaO$, $WO_3$, $MoO_3$, or $TiO_2$. In at least one embodiment, any suitable conductive material may be used for top electrode and bottom electrode. In at least one embodiment, material or electrode may include one or more of: Cu, Al, Ag, Au, W, or Co. In at least one embodiment, thickness along z-axis of top electrode and bottom electrode is in a range of 1 nm to 30 nm. In at least one embodiment, thickness along z-axis of dielectric is in a range of 1 nm to 30 nm. In at least one embodiment, thickness along z-axis of conductive oxide is in a range of 1 nm to 30 nm.

Figure 3A:
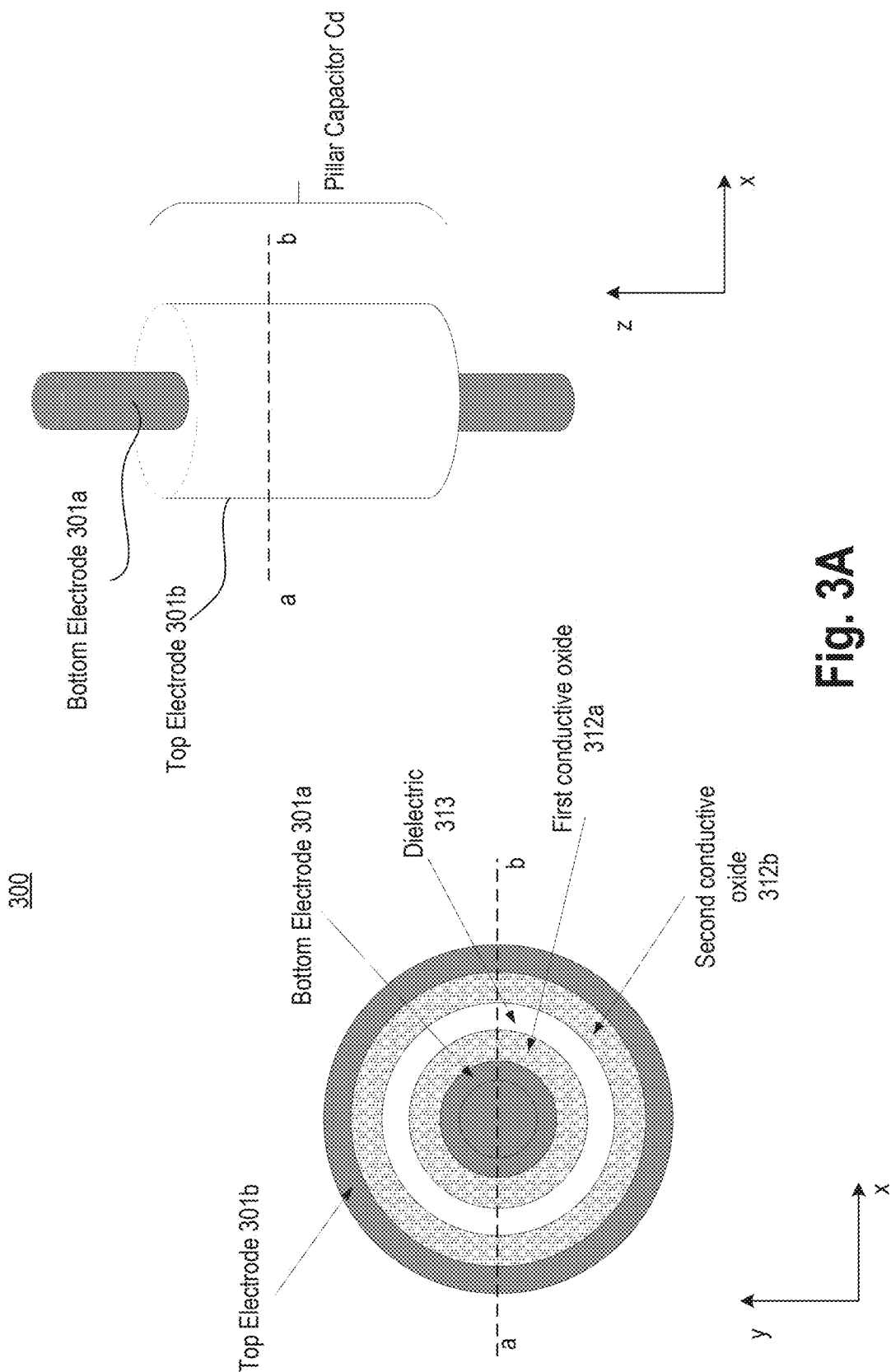
FIG. 3A illustrates a non-planar linear capacitor structure, in accordance with at least one embodiment.

FIG. 3A illustrates non-planar capacitor structure 300, in accordance with at least one embodiment. In at least one embodiment, non-planar capacitor structure 300 is rectangular in shape. Taking cylindrical shaped case, in at least one embodiment, layers of non-planar capacitor structure 300 from center going outwards include bottom electrode 301a, first conductive oxide 312a, dielectric material 313, second conductive oxide 312b, and top electrode 301b. A cross-sectional view along "ab" dashed line is illustrated in middle of FIG. 3A. In at least one embodiment, conducting oxides are removed and linear dielectric is directly connected to top electrode 301b and bottom electrodes 301a. In at least one embodiment, dielectric material 313 can include any suitable linear dielectric, where thickness of dielectric film is a range of 1 nm to 20 nm. In at least one embodiment, linear dielectric material 313 comprises a higher-K dielectric material. In at least one embodiment, linear dielectrics include one of: $SiO_2$, $Al_2O_3$, $Li_2O$, $HfSiO_4$, $Sc_2O_3$, $SrO$, $HfO_2$, $ZrO_2$, $Y_2O_3$, $Ta_2O_5$, $BaO$, $WO_3$, $MoO_3$, or $TiO_2$. In at least one embodiment, high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in gate dielectric layer include one or more of: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, or zirconium silicon oxide.

In at least one embodiment, first conductive oxide 312a is conformally deposited over bottom electrode 301a. In at least one embodiment, dielectric material 313 is conformally deposited over first conductive oxide 312a. In at least one embodiment, second conductive oxide 312b is conformally deposited over dielectric material 313. In at least one embodiment, top electrode 301b is conformally deposited over second conductive oxide 312b. In at least one embodiment, bottom electrode 301a is in center while top electrode 301b is on an outer circumference of non-planar capacitor structure 300.

In at least one embodiment, material for bottom electrode 301a may include one or more of: Cu, Al, Ag, Au, W, or Co, or their alloys. In at least one embodiment, material for first conductive oxide 312a include: $IrO_2$, $RuO_2$, $PdO_2$, $OsO_2$, or $ReO_3$. In at least one embodiment, conductive oxides are of form $A_2O_3$ (e.g., $In_2O_3$, $Fe_2O_3$) and $ABO_3$ type, where 'A' is a rare earth element and 'B' is Mn. In at least one embodiment, material for second conductive oxide 312b may be same as material for first conductive oxide 312a. In at least one embodiment, material for top electrode 301b may include one or more of: Cu, Al, Ag, Au, W, or Co, or their alloys.

In at least one embodiment, a first refractive intermetallic layer (not shown) is formed between dielectric material 313 and first conductive oxide 312a. In at least one embodiment, second refractive intermetallic layer (not shown) is formed between dielectric capacitor material 313 and second conductive oxide 312b. In at least one embodiment, first and second refractive intermetallic layers are directly adjacent to their respective conductive oxide layers and to dielectric capacitor material 313. In at least one embodiment, refractive intermetallic maintains capacitive properties of dielectric capacitor material 313. In at least one embodiment, refractive intermetallic comprises Ti and Al (e.g., TiAl compound). In at least one embodiment, refractive intermetallic comprises one or more of Ta, W, and/or Co.

In at least one embodiment, refractive intermetallic includes a lattice of Ta, W, and Co. In at least one embodiment, refractive intermetallic includes one of: Ti—Al such as $Ti_3Al$, TiAl, and $TiAl_3$; Ni—Al such as $Ni_3Al$, $NiAl_3$, NiAl; Ni—Ti, Ni—Ga, and $Ni_2MnGa$; FeGa, $Fe_3Ga$; borides, carbides, or nitrides. In at least one embodiment, TiAl material comprises Ti-(45-48)Al-(1-10)M (at X trace amount %), with M being at least one element from: V, Cr, Mn, Nb, Ta, W, and Mo, and with trace amounts of 0.1% to 5% of Si, B, and/or Mg. In at least one embodiment, TiAl is a single-phase alloy γ(TiAl). In at least one embodiment, TiAl is a two-phase alloy γ(TiAl)+α2(Ti3Al). In at least one embodiment, single-phase γ alloys contain third alloying elements such as Nb or Ta that promote strengthening and additionally enhance oxidation resistance. In at least one embodiment, a role of third alloying elements in two-phase alloys is to raise ductility (V, Cr, Mn), oxidation resistance (Nb, Ta), or combined properties. In at least one embodiment, additions such as Si, B and Mg can markedly enhance other properties. In at least one embodiment, thicknesses of layers of non-planar capacitor structure 300 in x-axis are in range of 1 nm to 30 nm. In at least one embodiment, refractive intermetallic layers are not used for non-planar capacitor structure 300.

Figure 3B:
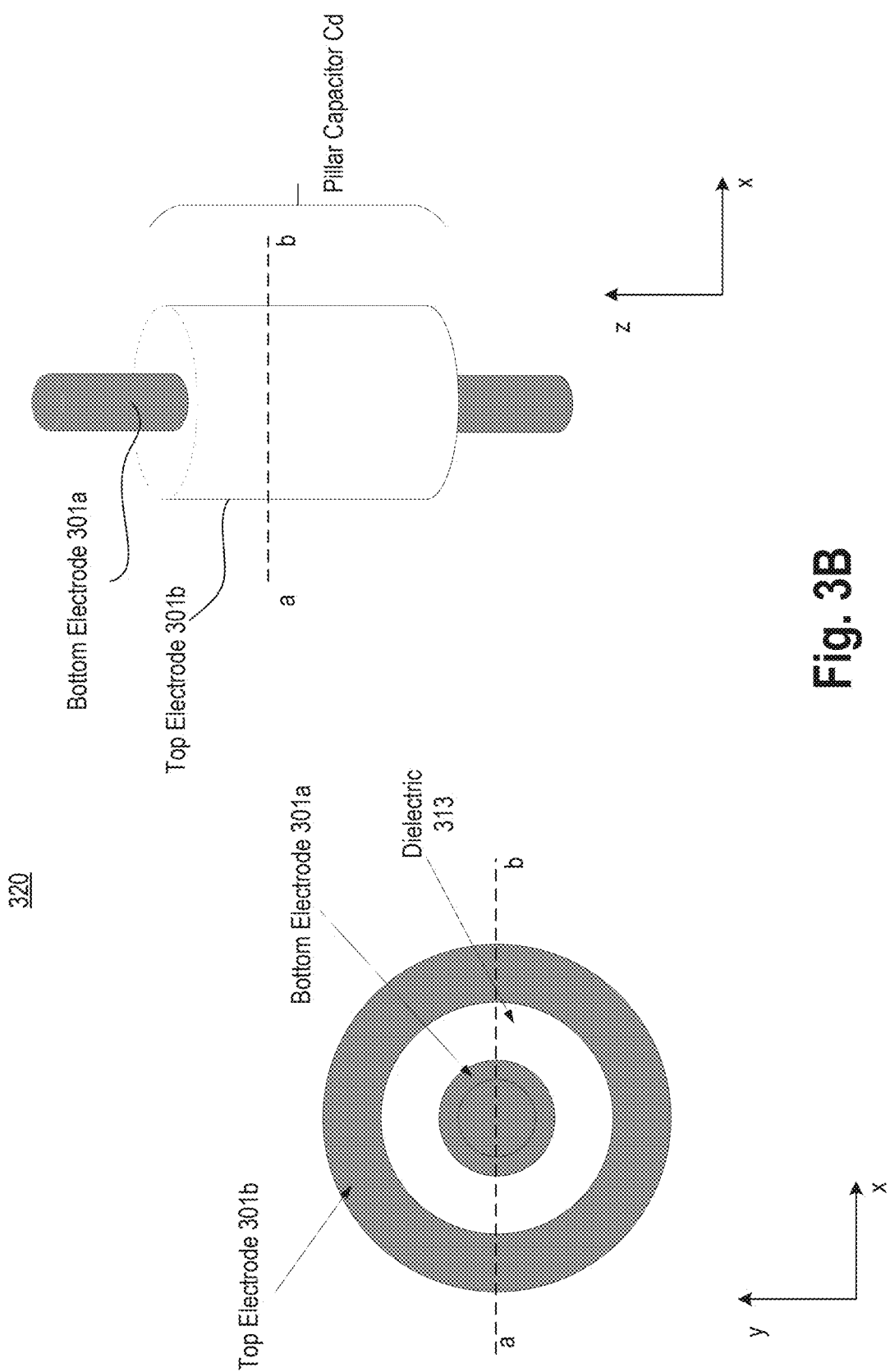
FIG. 3B illustrates a non-planar linear capacitor structure without conductive oxides, in accordance with at least one embodiment.

FIG. 3B illustrates a non-planar linear capacitor structure 320 without conductive oxides, in accordance with at least one embodiment. Compared to FIG. 3A, in at least one embodiment, linear dielectric is adjacent to top electrode and bottom electrode.

FIG. 4A illustrates a planar ferroelectric or paraelectric capacitor structure, in accordance with at least one embodiment. FIG. 4B illustrates three planar ferroelectric or paraelectric capacitor structures, respectively, in accordance with at least one embodiment.

In at least one embodiment, capacitors are ferroelectric or paraelectric capacitors. In at least one embodiment, capacitors can take any planar form. One such simplified form is illustrated in FIG. 4A, in accordance with at least one embodiment. In at least one embodiment, planar capacitor structure 400 is a metal-insulator-metal (MIM) capacitor comprising a bottom electrode, a top electrode, and a ferroelectric dielectric between top electrode and bottom electrode as shown. In at least one embodiment, conductive oxide layer(s) are formed between bottom electrode and ferroelectric dielectric.

In at least one embodiment, planar capacitor 423a includes encapsulation portions 421a and 421b (also referred to as sidewall barrier seal) that are adjacent to side walls of plurality of layers of planar capacitor. In at least one embodiment, planar capacitor 423c includes encapsulation portions 421c and 421d that are partially adjacent to encapsulation portions 421a and 421b, and refractive intermetallic 411a. In at least one embodiment, encapsulation portions 421a and 421b extend in z-plane. In at least one embodiment, encapsulation portions 421c and 421d terminate into a via (not shown). In at least one embodiment, material for encapsulation portions 421c and 421d is same as those for encapsulation portions 421a and 421b. In at least one embodiment, barrier material for encapsulation portions 421a and 421b includes one or more of an oxide of: Ti, Al, or Mg.

In at least one embodiment, planar capacitor 423b includes encapsulation portions 421e and 421f that are partially adjacent to encapsulation portions 421a and 421b, and refractive intermetallic 411b. In at least one embodiment, encapsulation portions 421e and 421f terminate into a via (not shown). In at least one embodiment, encapsulation portions 421e and 421f extend in an x-plane. In at least one embodiment, material for encapsulation portions 421e and 421f is same as those for encapsulation portions 421a and 421b. In at least one embodiment, material for encapsulation portions 421a and 421b includes one or more of: Ti—Al—O, $Al_2O_3$, MgO, or nitride. In at least one embodiment, material for encapsulation portions 421a and 421b is a sidewall barrier (e.g., insulative material) that protects stack of layers from hydrogen and/or oxygen diffusion. In at least one embodiment, sidewall barrier material is not an interlayer dielectric (ILD) material. In at least one embodiment, lateral thickness (along x-axis) of encapsulation portions 421a and 421b (insulating material) is in a range of 0.1 nm to 20 nm. In at least one embodiment, sidewall barriers are in direct contact with ILD.

In at least one embodiment, planar capacitors 423a, 423b, and 423c comprise several layers stacked together to form a planar capacitor. In at least one embodiment, these layers may extend in an x-plane when capacitor is a planar capacitor. In at least one embodiment, stack of layers includes refractive intermetallic 411a and refractive intermetallic 411b as a barrier material, conductive oxides 412a, conductive oxide 412b, and ferroelectric material 413. In at least one embodiment, ferroelectric material 413 can be any of ferroelectric materials discussed herein. In at least one embodiment, refractive intermetallic 411a and refractive intermetallic 411b are removed, and electrodes are in direct contact with conductive oxide 412a and conductive oxide 412b.

In at least one embodiment, refractive intermetallic 411a and refractive intermetallic 411b maintains ferroelectric properties of ferroelectric capacitors. In absence of refractive intermetallic 411a and refractive intermetallic 411b, ferroelectric material 413 of a capacitor may lose its potency. In at least one embodiment, refractive intermetallic 411a and refractive intermetallic 411b comprises Ti and Al (e.g., TiAl compound). In at least one embodiment, refractive intermetallic 411a and refractive intermetallic 411b comprises one or more of Ta, W, and/or Co. In at least one embodiment, refractive intermetallic 411a and refractive intermetallic 411b includes a lattice of Ta, W, and Co.

In at least one embodiment, refractive intermetallic 411a and refractive intermetallic 411b is part of a barrier layer which is a super lattice of a first material and a second material, wherein first material includes Ti and Al (e.g., TiAl), and second material includes Ta, W, or Co (e.g., layers of Ta, W, and Co together). In at least one embodiment, lattice parameters of barrier layer are matched with lattice parameters of conductive oxides and/or ferroelectric material 413.

In at least one embodiment, refractive intermetallic 411a and refractive intermetallic 411b includes one of: Ti—Al such as $Ti_3Al$, TiAl, and $TiAl_3$; Ni—Al such as $Ni_3Al$, $NiAl_3$, and NiAl; Ni—Ti, Ni—Ga, and $Ni_2MnGa$; FeGa, and $Fe_3Ga$; and borides, carbides, or nitrides. In at least one embodiment, TiAl material comprises Ti-(45-48) Al-(1-10)M (at X trace amount %), with M being at least one element from: V, Cr, Mn, Nb, Ta, W, or Mo, and with trace amounts of 0.1% to 5% of Si, B, and/or Mg. In at least one embodiment, TiAl is a single-phase alloy γ(TiAl). In at least one embodiment, TiAl is a two-phase alloy γ(TiAl)+α2 (Ti3Al). In at least one embodiment, single-phase γ alloys contain third alloying elements such as Nb or Ta that promote strengthening and additionally enhance oxidation resistance. In at least one embodiment, a role of third alloying elements in two-phase alloys is to raise ductility (V, Cr, Mn), oxidation resistance (Nb, Ta) or combined properties. In at least one embodiment, additions such as Si, B, and Mg can markedly enhance other properties. In at least one embodiment, encapsulation portion 421a is coupled to a top electrode. In at least one embodiment, encapsulation portions 421a and 421b (insulating material) is placed around refractive intermetallic 411a, conductive oxide 412a, ferroelectric material 413, conductive oxide 412b, and refractive intermetallic 411b along while top and bottom surfaces of refractive intermetallic 411a and refractive intermetallic 411b are exposed for coupling to metal layers, vias, or a metallic pedestal.

In at least one embodiment, conductive oxide layer(s) are formed between top electrode and ferroelectric dielectric. In at least one embodiment, conductive oxides include: $IrO_2$, $RuO_2$, $PdO_2$, $OsO_2$, or $ReO_3$. In at least one embodiment, conductive oxides are of form A2O3 (e.g., $In_2O_3$, $Fe_2O_3$) and $ABO_3$ type, where 'A' is a rare earth element and 'B' is Mn. In at least one embodiment, any suitable conductive material may be used for top electrode and bottom electrode. In at least one embodiment, material or electrode may include one or more of: Cu, Al, Ag, Au, W, or Co. In at least one embodiment, thickness along z-axis of top electrode and bottom electrode is in a range of 1 nm to 30 nm. In at least one embodiment, thickness along z-axis of dielectric is in a range of 1 nm to 30 nm. In at least one embodiment, thickness along z-axis of conductive oxide is in a range of 1 nm to 30 nm.

FIG. 4C illustrates pedestal 440 that connects to top and/or bottom electrodes of planar ferroelectric or paraelectric capacitor, in accordance with at least one embodiment. In at least one embodiment, pedestal 440 comprises pedestal metal 441 and sidewall barrier 442. In at least one embodiment, barrier 442 includes materials to protect hydrogen and/or oxygen from interacting with pedestal metal 441. In at least one embodiment, barrier 442 comprises Ti—Al—O, $Al_2O_3$, MgO, or nitride. In at least one embodiment, pedestal metal 441 includes one of Cu, Al, Ag, Au, W, or Co.

Figure 5A:
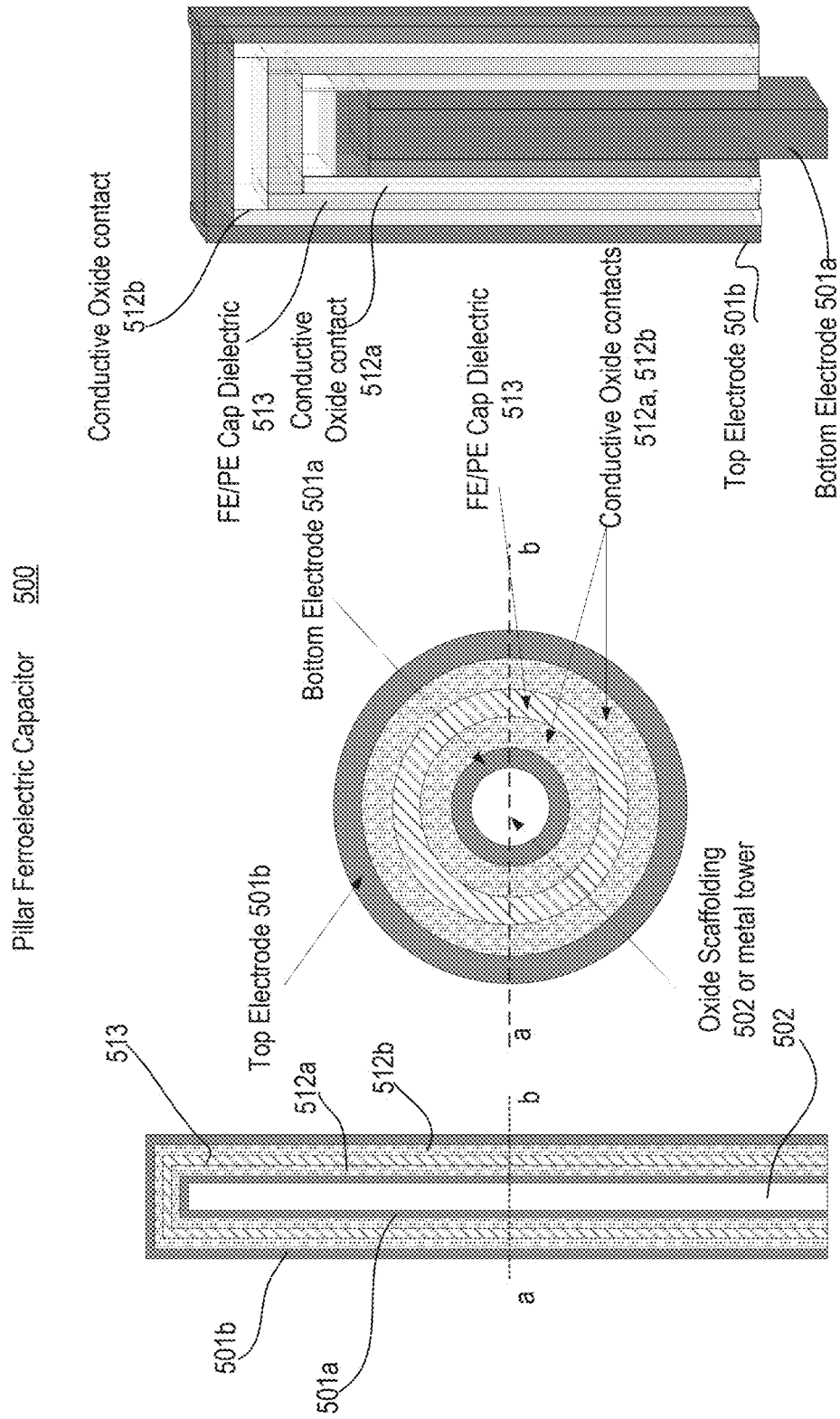
FIG. 5A illustrates a non-planar ferroelectric or a paraelectric capacitor structure, in accordance with at least one embodiment.

FIG. 5A illustrates a non-planar ferroelectric (FE) or paraelectric (PE) capacitor structure, in accordance with at least one embodiment. In at least one embodiment, non-planar capacitor structure 500 is rectangular in shape. Taking cylindrical shaped case, in at least one embodiment, layers of non-planar capacitor structure 500 from center going outwards include a bottom electrode 501a, a first conductive oxide 512a, a ferroelectric (FE) or paraelectric (PE) dielectric material 513, a second conductive oxide 512b, and a top electrode 501b. In at least one embodiment, conducting oxides are removed and FE/PE dielectric is directly connected to top electrode 501b and bottom electrode 501a. In at least one embodiment, ferroelectric dielectric material 513 can include any suitable dielectric, where thickness of ferroelectric or paraelectric (FE or PE) dielectric film is a range of 1 nm to 20 nm. In at least one embodiment, ferroelectric or paraelectric dielectric material 513 includes any one of materials discussed herein for ferroelectrics or paraelectric. In at least one embodiment, central region 502 of non-planar capacitor structure 500 is filled with oxide or an insulative material. In at least one embodiment, central region 502 is filled with metal that abuts with bottom electrode 501a to form a thicker bottom electrode.

In at least one embodiment, first conductive oxide 512a is conformally deposited over bottom electrode 501a. In at least one embodiment, ferroelectric or paraelectric dielectric material 513 is conformally deposited over first conductive oxide 512a. In at least one embodiment, second conductive oxide 512b is conformally deposited over ferroelectric or paraelectric dielectric material 513. In at least one embodiment, top electrode 501b is conformally deposited over second conductive oxide 512b. In at least one embodiment, bottom electrode 501a is in center while top electrode 501b is on an outer circumference of non-planar capacitor structure 500.

In at least one embodiment, material for bottom electrode 501a may include one or more of: Cu, Al, Ag, Au, W, or Co, or their alloys. In at least one embodiment, material for first conductive oxide 512a include: $IrO_2$, $RuO_2$, $PdO_2$, $OsO_2$, or $ReO_3$. In at least one embodiment, conductive oxides are of form $A_2O_3$ (e.g., $In_2O_3$, $Fe_2O_3$) and $ABO_3$ type, where 'A' is a rare earth element and 'B' is Mn. In at least one embodiment, material for second conductive oxide 512b may be same as material for first conductive oxide 512a. In at least one embodiment, material for top electrode 501b may include one or more of: Cu, Al, Ag, Au, W, or Co, or their alloys.

In at least one embodiment, a first refractive intermetallic layer (not shown) is formed between dielectric material 513 and first conductive oxide 512a. In at least one embodiment, a second refractive intermetallic layer (not shown) is formed between ferroelectric or paraelectric dielectric material 513 and second conductive oxide 512b. In at least one embodiment, first and second refractive intermetallic layers are directly adjacent to their respective conductive oxide layers and to ferroelectric or paraelectric dielectric material 513. In at least one embodiment, refractive intermetallic maintains capacitive properties of ferroelectric or paraelectric dielectric material 513. In at least one embodiment, refractive intermetallic comprises Ti and Al (e.g., TiAl compound). In at least one embodiment, refractive intermetallic comprises one or more of Ta, W, and/or Co.

In at least one embodiment, refractive intermetallic includes a lattice of Ta, W, and Co. In at least one embodiment, refractive intermetallic includes one of: Ti—Al such as $Ti_3Al$, TiAl, and $TiAl_3$; Ni—Al such as $Ni_3Al$, $NiAl_3$, and NiAl; Ni—Ti, Ni—Ga, and $Ni_2MnGa$; FeGa, and $Fe_3Ga$; borides, carbides, or nitrides. In at least one embodiment, TiAl material comprises Ti-(45-48)Al-(1-10)M (at X trace amount %), with M being at least one element from: V, Cr, Mn, Nb, Ta, W, and Mo, and with trace amounts of 0.1% to 5% of Si, B, and/or Mg. In at least one embodiment, TiAl is a single-phase alloy γ(TiAl). In at least one embodiment, TiAl is a two-phase alloy γ(TiAl)+α2(Ti3Al). In at least one embodiment, single-phase γ alloys contain third alloying elements such as Nb or Ta that promote strengthening and additionally enhance oxidation resistance. In at least one embodiment, a role of third alloying elements in two-phase alloys is to raise ductility (V, Cr, Mn), oxidation resistance (Nb, Ta), or combined properties. In at least one embodiment, additions such as Si, B, or Mg can markedly enhance other properties. In at least one embodiment, thicknesses of layers of non-planar capacitor structure 500 in x-axis are in range of 1 nm to 30 nm. In at least one embodiment, refractive intermetallic layers are not used for non-planar capacitor structure 500.

Figure 5B:
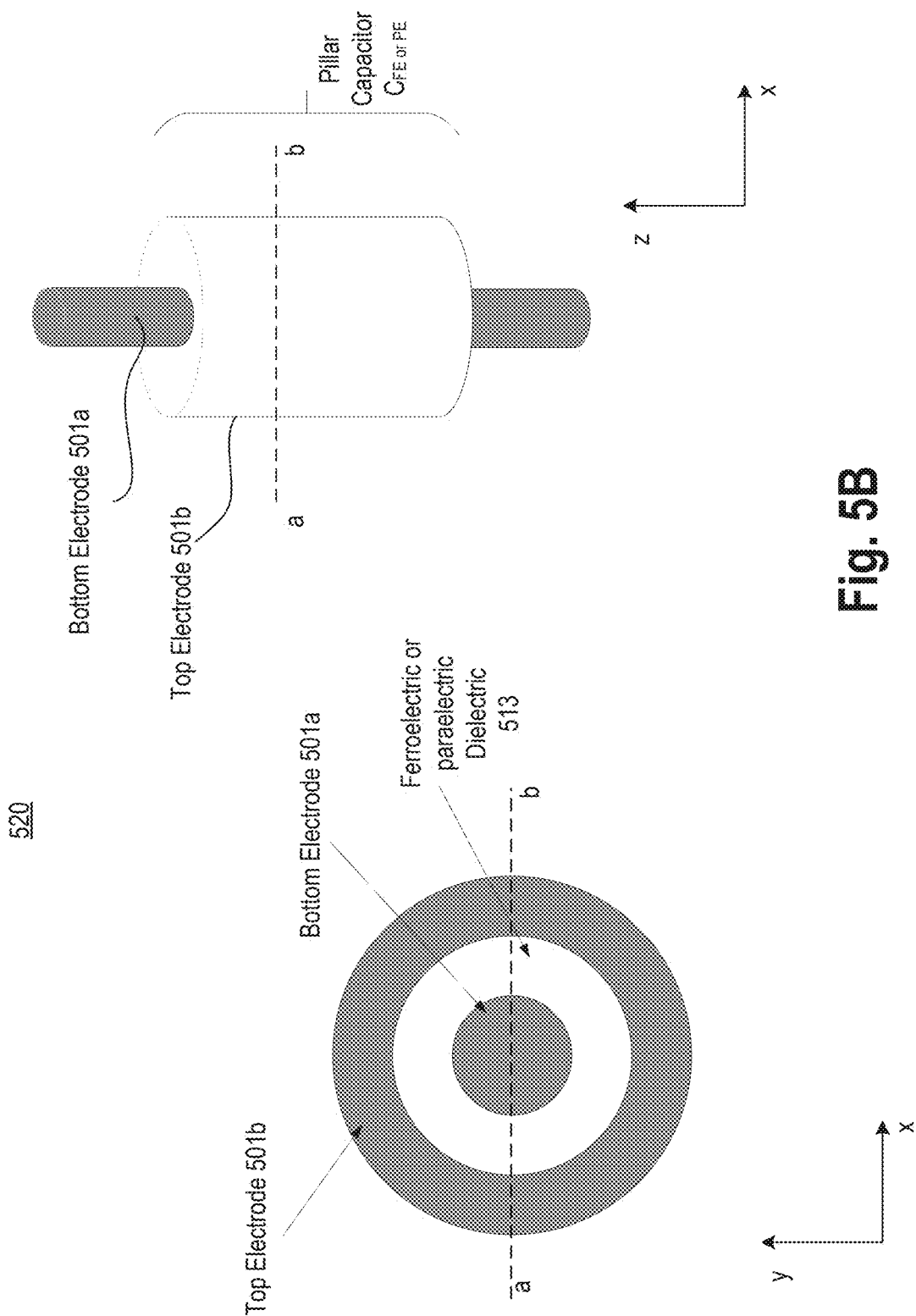
FIG. 5B illustrates a non-planar ferroelectric or a paraelectric capacitor structure without conductive oxides, in accordance with at least one embodiment.

FIG. 5B illustrates a non-planar ferroelectric or a paraelectric capacitor structure 520 without conductive oxides, in accordance with at least one embodiment. Compared to non-planar capacitor structure 500, here first conductive oxide 512a and second conductive oxide 512b are removed and ferroelectric material 513 is adjacent to top electrode 501b and bottom electrode 501a as shown, in at least one embodiment.

In at least one embodiment, ferroelectric material can be replaced with anti-ferroelectric material. In at least one embodiment, anti-ferroelectric (AFE) material includes lead zirconate titanate (PZT) with high Zr doping, La-doped PZT with high Zr doping, $HfSiO_2$ with high Si doping, $HfZrO_2$ (HZO) with high Zr doping, $ZrO_2$, $PbZrO_3$ (lead zirconate), $NH_4H_2PO_4$ (ammonium dihydrogen phosphate (ADP)), $NaNbO_3$ (sodium niobate), and K doped $NaNbO_3$, etc. Table 1 describes some bulk anti-ferroelectric materials, with various physical/chemical modifications for enhancing energy storage density, in at least one embodiment.

TABLE 1

| Material name | Physical/ Chemical Modifications | Energy Density (J/cm³) | Electric Field (kV/cm) |
|---|---|---|---|
| (Pb0.97La0.02)(Zr0.97Ti0.03)O3 | 3 wt % glass (PbO—B2O3—SiO2—ZnO) | 3.1 | 581 |
| (Pb0.97La0.02)(Zr0.97Ti0.03)O3 | without glass | 1.4 | 581 |
| Pb0.99Nb0.02[(Zr0.57Sn0.43)1-yTiy]0.98O3 | with half electrode | 1.30 | 70 |
| Pb0.99Nb0.02[(Zr0.57Sn0.43)1-yTiy]0.98O3 | with full electrode | 1.19 | 70 |
| (Pb0.94-xLa0.04Bax) [(Zr0.60Sn0.40)0.84Ti0.16]O3 | x = 0 (0 MPa) | 0.35 | 30 |
| (Pb0.94-xLa0.04Bax) [(Zr0.60Sn0.40)0.84Ti0.16]O3 | x = 0.02 (20 MPa) | 0.38 | 30 |
| Pb0.99Nb0.02 [(Zr0.60Sn0.40)0.95Ti0.05]O3 | — | 0.62 | 56 |
| Pb0.97La0.02(Zr0.56Sn0.35Ti0.09)O3 | 4 wt % glass (CdO—Bi2O3—PbO—ZnO—Al2O3—B2O3—SiO2) | 3.3 | 150 |
| Pb0.97La0.02(Zr0.56Sn0.35Ti0.09)O3 | Without glass | 1.9 | 110 |
| (Pb:97La0:02)(Zr0:92Sn0:05Ti0:03)O3 | 3% glass (0.8PbO—0.2B2O3) | 7.4 | 475 |
| (Pb:97La0:02)(Zr0:92Sn0:05Ti0:03)O3 | Without glass | 4.5 | 320 |
| Pb0.97La0.02(Zr0.95Ti0.05)O3 | — | 12.4 | 1120 |
| (Pb0.85Ba0.08Sr0.03La0.03) (Zr0.74Sn0.22Ti0.04) | — | 1.2 | 100 |
| (Bi1/2Na1/2)0.94Ba0.06]La0.8Zr0.2TiO3 | — | 1.58 | 85 |
| (Ba0.1La0.02)(Zr0.675Sn0.275Ti0.05)O3 | — | 2.05 | 70 |
| 0.75(0.80Bi1/2Na1/2TiO3—0.20Bi1/2K1/2TiO3)—0.25SrTiO3 | — | 0.84 | 100 |
| Pb0.97La0.02(Zr0.50Sn0.45Ti0.05)O3 | — | 5.6 | 400 |
| (Pb0.858Ba0.1La0.02Y0.008) (Zr0.65Sn0.3Ti0.05)O3—(Pb0.97La0.02)(Zr0.9Sn0.05Ti0.05)O3 | — | 4.65 | 200 |
| 0.89Bi0.5Na0.5TiO3-0.06BaTiO3—0.05K0.5Na0.5NbO3 | double stage sintering | 0.90 | 100 |
| (Pb0.858Ba0.1La0.02Y0.008) (Zr0.65Sn0.3Ti0.05)O3—(Pb0.97La0.02)(Zr0.9Sn0.05Ti0.05)O3 | spark plasma sintering | 6.40 | 275 |
| (Pb0.858Ba0.1La0.02Y0.008) (Zr0.65Sn0.3Ti0.05)O3—(Pb0.97La0.02)(Zr0.9Sn0.05Ti0.05)O3 | conventional sintering | 4.65 | 200 |
| (Na1 xCax)(Nb1 xZrx)O3 x = 0.04 | conventional sintering | 0.91 | 130 |
| (Pb0.92La0.04Ba0.02) [(Zr0.60Sn0.40)0.84Ti0.16]O3 | at 90 MPa | 0.91 | 60 |
| 0.91(Bi0.5Na0.5)TiO3-0.07BaTiO3—0.02(K0.5Na0.5)NbO3 | at 100 MPa | 0.387 | 60 |
| (Pb0.96La0.04)(Zr0.90Ti0.10)O3 | at 100 MPa | 0.698 | 60 |

Figure 6A:
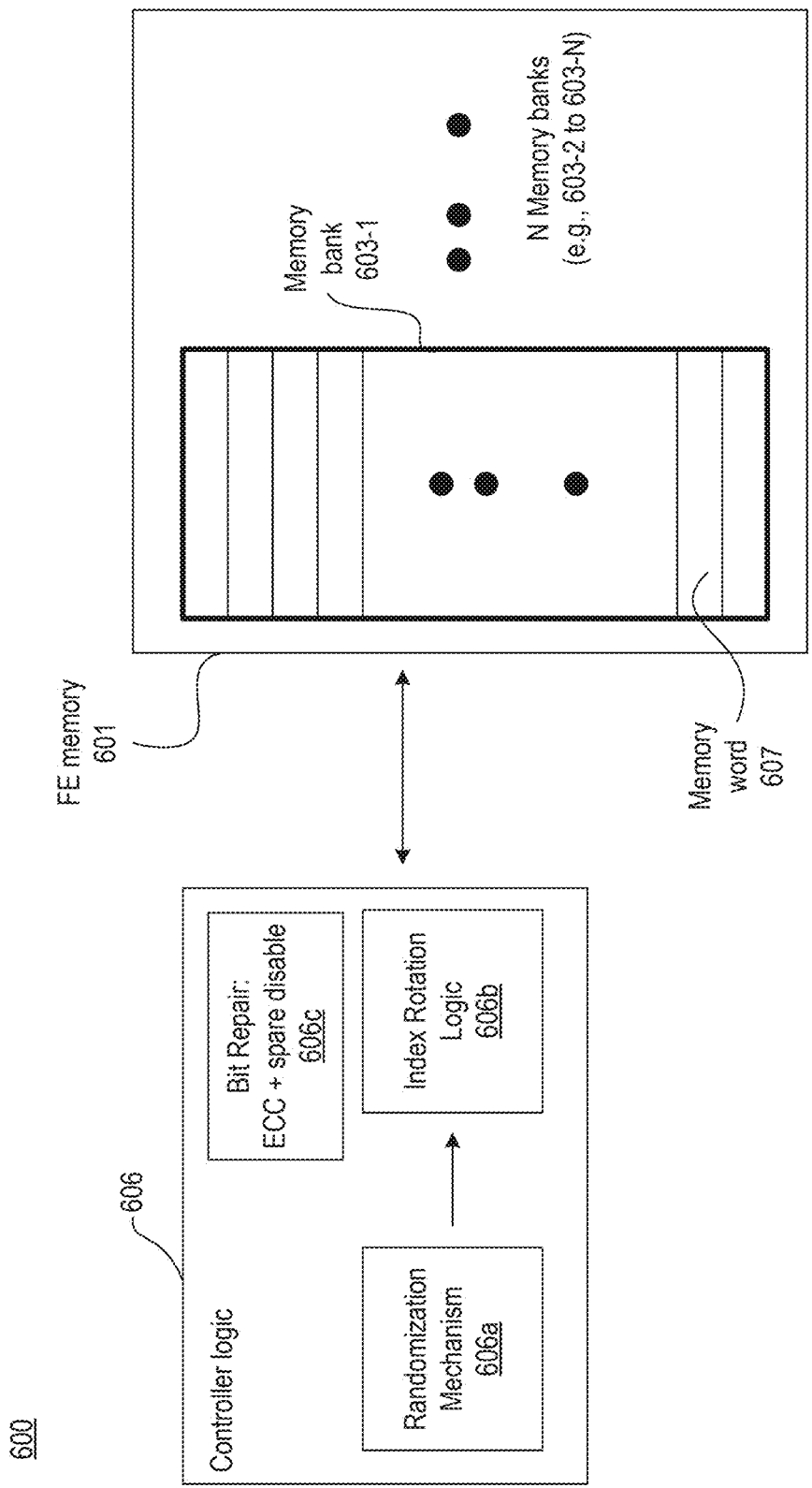
FIG. 6A illustrates a high-level endurance enhancement architecture for a paraelectric (PE) or a ferroelectric (FE) memory, in accordance with at least one embodiment.

FIG. 6A illustrates high-level endurance enhancement architecture 600 for paraelectric (PE) or ferroelectric (FE) memory, in accordance with at least one embodiment. In at least one embodiment, architecture 600 comprises memory array 601 and controller logic 606. In at least one embodiment, memory array 601 is memory with non-linear polar material. In at least one embodiment, memory array 601 includes bit-cells that comprise at least one transistor and at least one capacitor coupled to it, where capacitor has non-linear polar material.

In at least one embodiment, FE memory array 601 includes a plurality of memory banks (e.g., 603-1 through 603-N, where 'N' is a number). In at least one embodiment, each memory bank (e.g., 603-1) includes a plurality of memory words (e.g., memory word 607). In at least one embodiment, each memory word includes a plurality of memory bit-cells. For sake of simplicity, other memory components are not shown such as write drivers, column multiplexers, sense-amplifiers, etc.

In at least one embodiment, controller logic 606 comprises endurance hardware and/or software to provide memory endurance to memory array 601. In at least one embodiment, memory endurance is used to ensure write and/or read operations from memory array 601 are reliable. Write endurance is number of programs and erase cycles that when applied to a memory block, bank, or word before memory block, bank, or word, becomes unreliable. In at least one embodiment, endurance mechanisms include a wear leveling scheme that uses index rotation, outlier compensation to handle weak bits, and random swap injection to mitigate wear out attacks. For sake of simplicity, memory banks are generally referred to as reference 603 instead of a particular memory bank reference (e.g., 603-1, 603-2, etc.). At least one embodiment described to general reference are applicable to an individual particular reference. In at least one embodiment, description of memory bank 603 is applicable for memory banks 603-1, 603-2, through 603-N.

In at least one embodiment, controller logic 606 (also referred to as refresh logic) comprises random invertible bit matrix 606a, index rotation logic 606b, and bit repair logic 606c. In at least one embodiment, index rotation logic 606b enables random swap injection which randomizes index rotation to obfuscate mapping from addresses to rotated indexes. In at least one embodiment, index rotation logic 606b randomizes rotation of gap words in memory bank 603. Malicious users (or attackers) may write programs that deliberately track wear leveling scheme described herein. These attackers may attempt to alter a memory reference pattern to continue to stress a single physical line even as wear leveling scheme assigns that physical line to different addresses. In at least one embodiment, index rotation logic 606b provides a facility to make tracking of physical lines difficult. In at least one embodiment, this facility makes a random decision (e.g., using an externally generated random number) to either swap or not each time a swap opportunity arises. In at least one embodiment, over time randomness injected into swapping process makes tracking cache lines more difficult.

In at least one embodiment, index rotation logic 606b is used for implementing a wear leveling scheme. In at least one embodiment, index rotation logic 606b rotates addresses throughout memory bank 603 to perform a wear leveling function. In various embodiments, index rotation logic 606b ensures that memory requests are spread across memory locations rather than a single memory location.

In at least one embodiment, bit repair logic 606c includes double error correcting, or triple error detecting error correction code (ECC) to discover new bit errors and spare disable which eliminate memory words with particularly high error rates. In at least one embodiment, spare disable involves having a buffer of spare cache lines. In at least one embodiment, when cache lines are particularly unreliable, spare disable can swap out unreliable cache lines for reliable spares. In at least one embodiment, spares may be implemented with memory technology other than FE memory such as static random-access memory (SRAM). In at least one embodiment, bit repair logic 606c addresses problem of weak memory bits. In at least one embodiment, each cache line or word 607 in memory bank 603 includes a valid bit. In at least one embodiment, valid bit indicates whether data associated with that line/word is stored in memory or redundant word array. In at least one embodiment, redundant word array comprises spares that can be used to compensate for defective words in memory. In at least one embodiment, when accessing memory, controller logic 606 checks valid bit, if valid bit is set then data is stored in redundant memory rather than memory array or bank 603. In at least one embodiment, ECC is used to identify and/or correct bit errors in both memory array and redundant memory. In at least one embodiment, as ECC discovers bit errors, additional lines may be marked valid and data stored in redundant memory location rather than memory. In at least one embodiment, various endurance mechanisms discussed herein can be used in any combination or order. In at least one embodiment, some memory products may select one or more endurance mechanisms instead of all three discussed herein. In at least one embodiment, some memory products may apply all three endurance mechanisms to achieve most endurance for FE memory array 601. In at least one embodiment, endurance mechanisms are applied to FE memory array 601 to maximize usage of such memory.

Figure 6B:
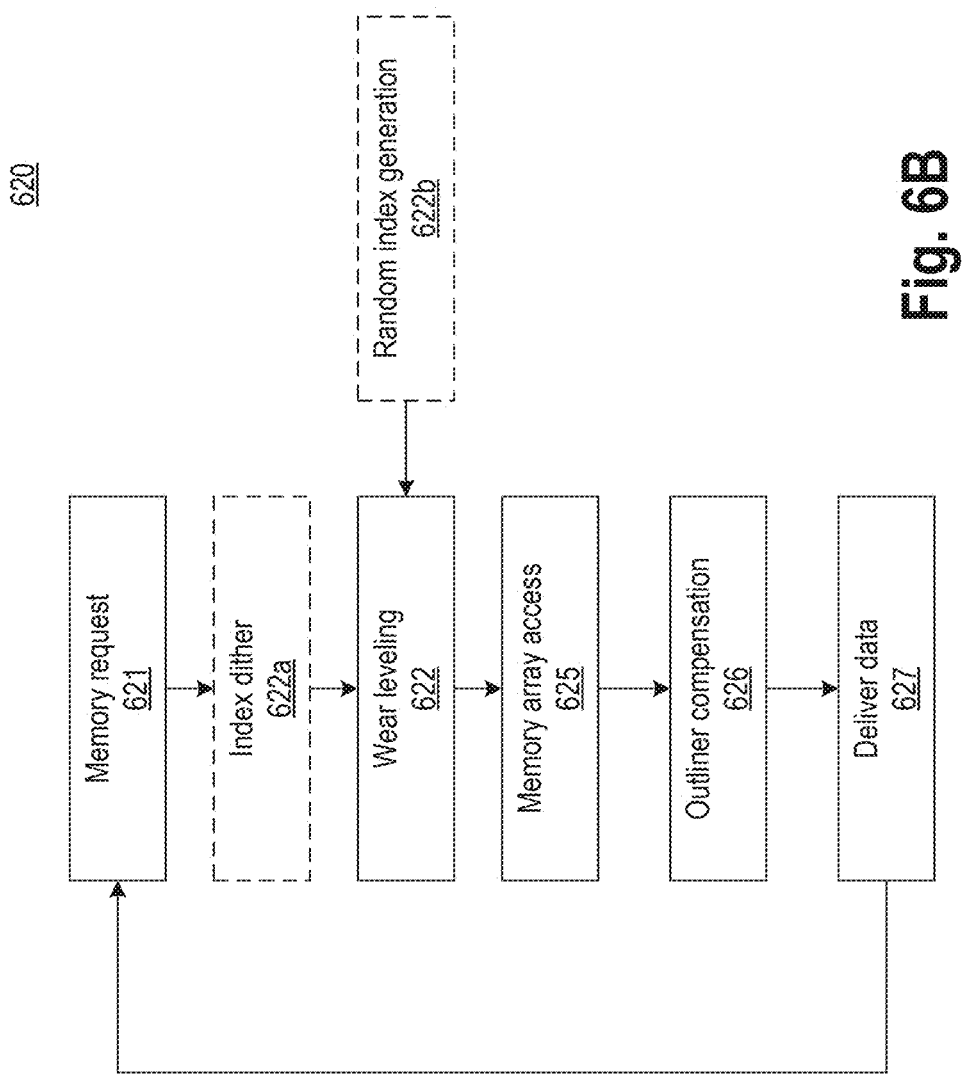
FIG. 6B illustrates a flowchart of memory endurance for PE and FE memory, in accordance with at least one embodiment.

FIG. 6B illustrates flowchart 620 of memory endurance for PE and FE memory, in accordance with at least one embodiment. While blocks in flowchart 620 are illustrated in a particular order, order can be modified, in at least one embodiment. In at least one embodiment, some blocks may be performed before others based on whether read or write operations are being performed. In at least one embodiment, various blocks can be implemented in hardware, software, or a combination of them.

At block 621, in at least one embodiment, controller logic 606 sends a memory request to memory array 601. In at least one embodiment, this request may be a read request or a write request. In at least one embodiment, if it is a write request, controller logic 606 applies wear leveling scheme at block 622. In at least one embodiment, wear leveling scheme is linear in that a gap word or gap cache line is swapped with an adjacent word or cache line. In at least one embodiment, wear leveling is dithered as indicated by block 622a. In at least one embodiment, index or pointer to gap word or gap cache line is used to swap gap word or gap cache line with either an adjacent cell with one higher index or address or with an adjacent cell with one lower index or address. As such, in at least one embodiment, wear leveling is dithered.

In at least one embodiment, wear leveling is randomized. In at least one embodiment, a random index is generated at block 622b. In at least one embodiment, random index is then used to swap gap word or gap cache line with an adjacent or a non-adjacent word or cache line. In at least one embodiment, random index is dithered. In at least one embodiment, dithered random index is then used for wear leveling.

In at least one embodiment, if memory request is a read access (as indicated by block 625), outlier compensation is applied as indicated by block 626. At block 626, in at least one embodiment, controller logic 606 addresses problem of weak memory bits by checking a valid bit for memory word being addressed or accessed. In at least one embodiment, valid bit indicates whether data associated with that line or word is stored in memory or redundant word array. In at least one embodiment, redundant word array comprises spares that can be used to compensate for defective words in memory. In at least one embodiment, when accessing memory, controller logic 606 checks valid bit, if valid bit is set then data is stored in redundant memory rather than memory array or bank 603. In at least one embodiment, ECC is used to identify and/or correct bit errors in both memory array and redundant memory. In at least one embodiment, as ECC discovers bit errors, additional lines may be marked valid and data stored in redundant memory location rather than memory. In at least one embodiment, after ECC is applied, requested data is provided to controller logic 606 as indicated by block 627. In at least one embodiment, memory endurance for non-linear polar material based memory is enhanced by endurance mechanisms. In at least one embodiment, this allows more read and write operations to memory before any memory block, bank, or word becomes unreliable. In at least one embodiment, capacitors for each bit-cell in FE memory 601 (which can also be a PE memory) are arranged in a stack and fold manner.

Figure 7:
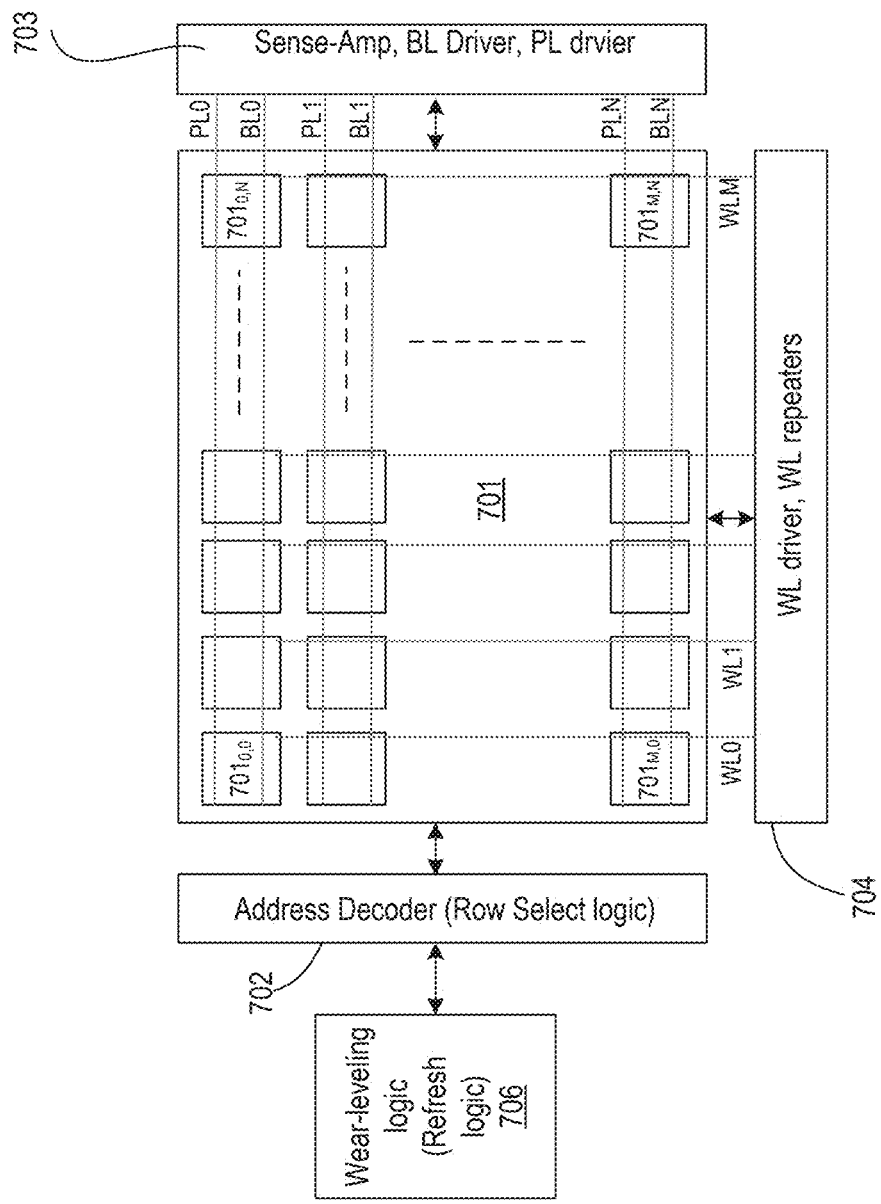
FIG. 7 illustrates an M×N memory array of bit-cells and corresponding periphery circuitry, in accordance with at least one embodiment.

FIG. 7 illustrates apparatus 700 comprising an M×N memory array of bit-cells and corresponding periphery circuitry, in accordance with at least one embodiment. In at least one embodiment, apparatus 700 comprises M×N memory array 701 of bit-cells, logic circuitry 702 for address decoding, and logic circuitry 703 for sense amplifier, write drivers, and plate-line (PL) drivers. In at least one embodiment, plate-lines PL0, PL1, through PLN are parallel to word-lines WL0, WL1, through WLM while bit-lines BL0, BL1, through BLN are orthogonal to plate-lines and word-lines, where 'N' is a number greater than 1. In at least one embodiment, plate-lines PL0, PL1, through PLN are parallel to bit-lines BL0, BL1, through BLN, while word-lines WL0, WL1, through WLM are orthogonal to plate-lines and bit-lines, where 'N' is a number greater than 1. In at least one embodiment, individual memory bit-cells in memory array 701 are organized in rows and columns. For example, memory bit-cells $701_{0,0}$ through $701_{M,N}$ are organized in an array.

In at least one embodiment, an individual memory bit-cell (e.g., $701_{0,0}$) is a 1T1C bit-cell. An example of a 1T1C bit-cell is described with reference to FIG. 8. In at least one embodiment, an individual memory bit-cell (e.g., $701_{0,0}$) is a 1TnC bit-cell. An example of a 1TnC bit-cell is described with reference to FIG. 14. In at least one embodiment, an individual memory bit-cell (e.g., $701_{0,0}$) is a multi-element FE gain bit-cell. An example of a 1TnC bit-cell is described with reference to FIG. 15, in accordance with at least one embodiment. In at least one embodiment, an individual memory bit-cell (e.g., $701_{0,0}$) is a multi-element FE gain bit-cell, where an individual capacitor of bit-cell is connected to a transistor switch. An example of such a memory bit-cell is described with reference to FIG. 16, in accordance with at least one embodiment. In at least one embodiment, an individual memory bit-cell (e.g., $701_{0,0}$) is a multi-element gain bit-cell where capacitor is replaced with a memory element. An example of such a memory bit-cell is described with reference to FIG. 18, in accordance with at least one embodiment.

Figure 8:
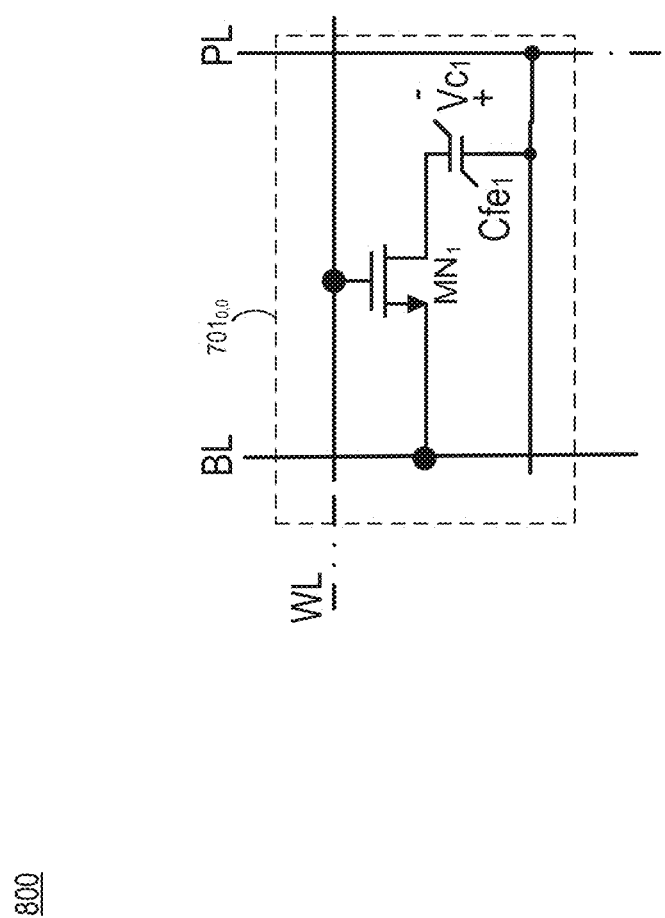
FIG. 8 illustrates 1T1C bit-cell where bit-line (BL) is parallel to plate-line (PL), in accordance with at least one embodiment.

FIG. 8 illustrates 1T1C bit-cell 800 (e.g., $701_{0,0}$) where bit-line (BL) is parallel to plate-line (PL), in accordance with at least one embodiment. In at least one embodiment, 1T1C bit-cell 800 comprises a transistor and a capacitor. In at least one embodiment, transistor is an n-type transistor with a gate terminal coupled or controllable by WL, a source terminal coupled to BL, and a drain terminal coupled to a first terminal of a capacitor. In at least one embodiment, a second terminal of capacitor is coupled to PL. In at least one embodiment, transistor is a p-type transistor. In at least one embodiment, capacitor of 1T1C bit-cell 800 is a capacitor according to any one of FIG. 2, FIG. 3A, FIG. 3B, FIGS. 4A-C, FIG. 5A, or FIG. 5B. In at least one embodiment, capacitor of 1T1C bit-cell 800 is replaced with a memory element. In at least one embodiment, memory element is an MTJ.

Figure 9:
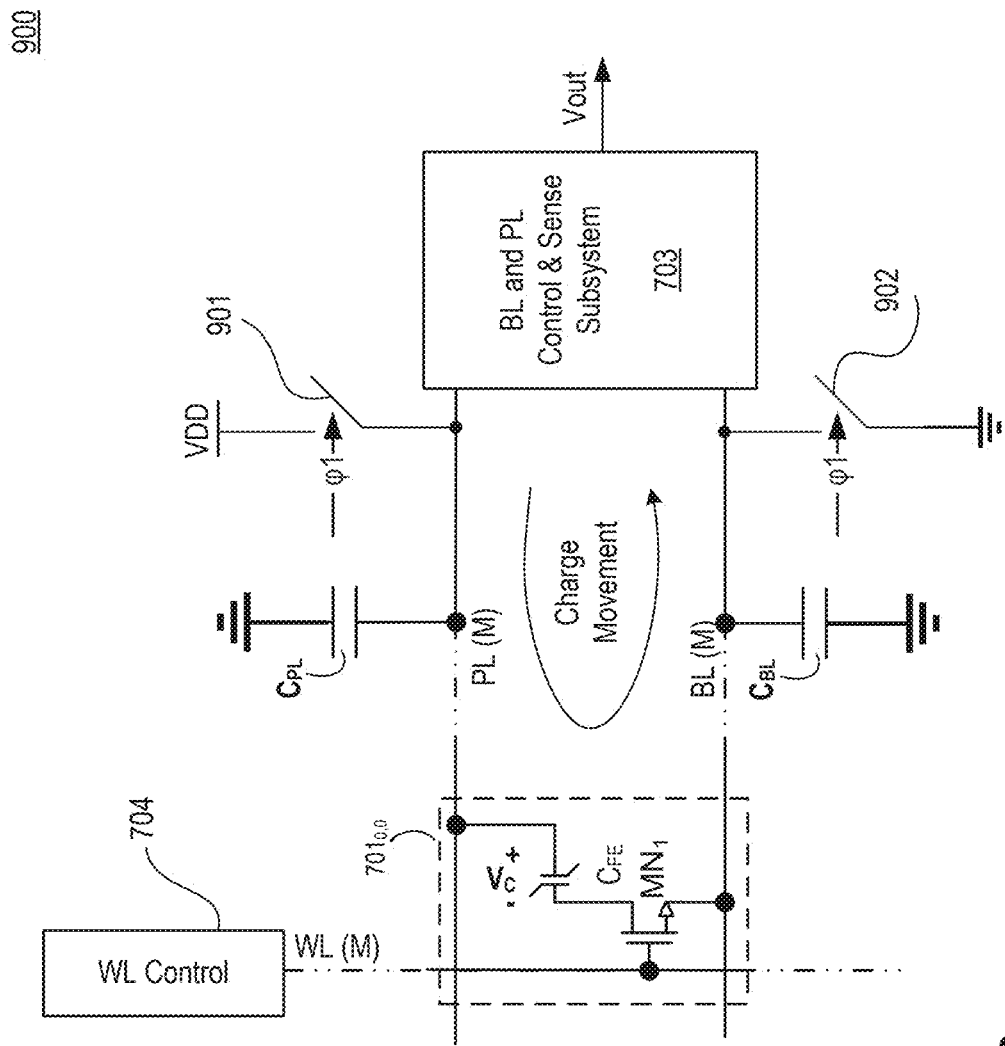
FIG. 9 illustrates a memory apparatus with a sensing scheme that senses PL and BL to sense a bit value, in accordance with at least one embodiment.

FIG. 9 illustrates memory apparatus 900 with a sensing scheme that senses PL and BL to sense a bit value, in accordance with at least one embodiment. In at least one embodiment, memory apparatus 900 includes a bit-cell (e.g., bit-cell $701_{0,0}$), a sense circuitry 703, a WL control circuitry 704, a PL, a BL, a first switch 901, and a second switch 902. In at least one embodiment, first switch 901 is coupled to a first reference (e.g., Vdd). In at least one embodiment, second switch 902 is coupled to a second reference (e.g., ground). In at least one embodiment, first reference has a voltage which is greater than 0V. In at least one embodiment, second reference has a voltage which is less than a voltage of first reference. PL capacitance (e.g., parasitic capacitance) is illustrated as $C_{PL}$ while BL capacitance (e.g., parasitic capacitance) is illustrated by $C_{BL}$.

In at least one embodiment, sense circuitry 703 is to sense a bit-value stored in bit-cell $701_{0,0}$ based, at least in part, on a first floating charge on PL and a second floating charge on BL. In at least one embodiment, first switch 901 is provided which is coupled to PL and a first reference (e.g., Vdd). In at least one embodiment, second switch 902 is provided which is coupled to BL and a second reference (e.g., ground). In at least one embodiment, first switch 901 is to pre-charge or pre-discharge PL to first reference before sense circuitry 703 is to sense first floating charge on PL. In at least one embodiment, second switch 902 is to pre-charge or pre-discharge BL to second reference before sense circuitry 703 is to sense second floating charge on BL. In at least one embodiment, sense circuitry 703 is to detect a difference between first floating charge and second floating charge. In at least one embodiment, WL is enabled (to turn on transistor $MN_1$ of bit-cell $701_{0,0}$ which is coupled to PL and BL) by WL control circuitry 704 to allow development of voltages on PL and BL.

In at least one embodiment, when first reference is higher than second reference, then PL discharges through capacitor (e.g., capacitor $C_{FE}$) of bit-cell $701_{0,0}$, and this discharge passes through BL. In at least one embodiment, when first reference is lower than second reference, then BL discharges through capacitor (e.g., capacitor $C_{FE}$) of bit-cell $701_{0,0}$, and this discharge passes through PL.

In at least one embodiment, assuming first reference being higher than second reference, after PL discharges, PL develops a floating voltage. In at least one embodiment, voltage difference between PL and BL indicates stored value in bit-cell $701_{0,0}$.

In at least one embodiment, voltage difference (e.g., PL-BL) movement can be approximated as:

$$\Delta V \approx \frac{Q_{FE}}{C_{BL}} + \frac{Q_{FE}}{C_{PL}}$$

where $Q_{FE}$ is charged stored in capacitor $C_{FE}$ of bit-cell $701_{0,0}$, $C_{BL}$ is capacitance of BL, and $C_{PL}$ is capacitance of PL.

In at least one embodiment, sense circuitry 703 senses a voltage difference between PL and BL against a reference voltage to determine whether bit-cell $701_{0,0}$ has a stored value of 0 or 1. In at least one embodiment, sense circuitry 703 comprises a difference amplifier to compare a voltage difference between voltages on PL and BL against a reference voltage. In at least one embodiment, sense circuitry 703 comprises a switch capacitor circuit to sense voltages on PL and BL, and to determine a value stored in bit-cell $701_{0,0}$.

Figure 10:
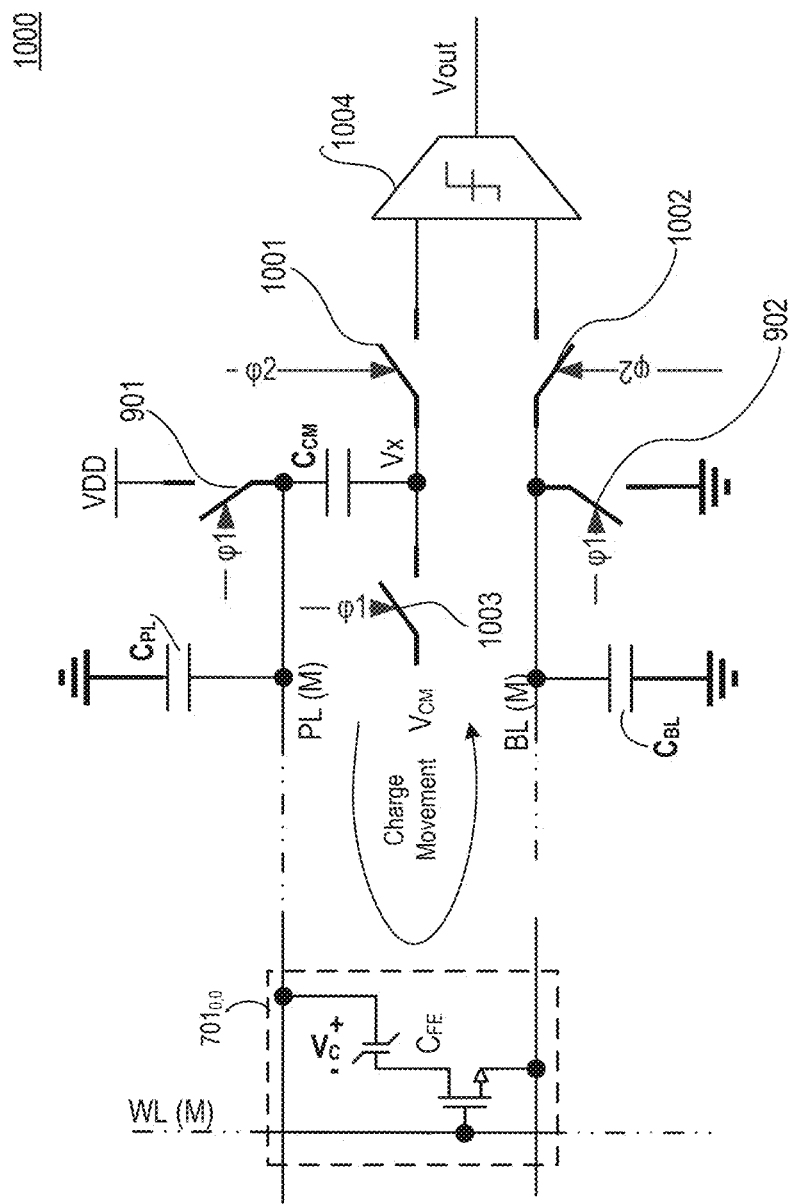
FIG. 10 illustrates a memory apparatus with a sensing circuitry that senses PL and BL to sense a bit value, in accordance with at least one embodiment.

FIG. 10 illustrates memory apparatus 1000 with a sensing circuitry that senses PL and BL to sense a bit value, in accordance with at least one embodiment. In at least one embodiment, apparatus 1000 includes a bit-cell (e.g., bit-cell $701_{0,0}$), a WL, a PL, a BL, a first switch 901, a second switch 902, a third switch 1001, a fourth switch 1002, a fifth switch 1003, and an amplifier 1004. In at least one embodiment, first switch 901 is coupled to a first reference (e.g., Vdd). In at least one embodiment, second switch 902 is coupled to a second reference (e.g., ground). In at least one embodiment, first reference has a voltage which is greater than 0V. In at least one embodiment, second reference has a voltage which is less than a voltage of first reference. In at least one embodiment, first reference is a programmable reference. In at least one embodiment, second reference is a programmable reference. In at least one embodiment, first reference is a fixed reference (e.g., tied to Vdd or ground). In at least one embodiment, second reference is a fixed reference (e.g., tied to Vdd or ground). In at least one embodiment, first reference and/or second reference can be generated by a bias circuit, a resistor divider, a capacitor divider, a voltage divider, etc. PL capacitance (e.g., parasitic capacitance) is illustrated as $C_{PL}$ while BL capacitance (e.g., parasitic capacitance is illustrated by $C_{BL}$).

In at least one embodiment, first switch 901 is controllable by a first control ϕ1 or a complement or inverse of first control φ1. In at least one embodiment, first control causes switch 901 to couple or decouple first reference with PL. In at least one embodiment, first switch 901 comprises an n-type transistor having a gate terminal controllable by first control φ1 and a source terminal coupled to PL and a drain terminal coupled to first reference. In at least one embodiment, first switch 901 comprises a p-type transistor having a gate terminal controllable by complement or inverse of first control φ1 and a source terminal coupled to first reference and a drain terminal coupled to PL. In at least one embodiment, first switch 901 comprises a combination of n-type and p-type transistors, where gate terminals of n-type and p-type transistors are controllable by first control φ1 and complement or inverse of first control φ1, respectively. In at least one embodiment, combination of n-type and p-type transistors of first switch 901 comprise a transmission gate.

In at least one embodiment, second switch 902 is controllable by a first control φ1 or complement or inverse of first control φ1. In at least one embodiment, second control causes switch 902 to couple or decouple second reference with BL. In at least one embodiment, second switch 902 comprises an n-type transistor having a gate terminal controllable by first control φ1 and a source terminal coupled to second reference and a drain terminal coupled to BL. In at least one embodiment, second switch 902 comprises a p-type transistor having a gate terminal controllable by complement or inverse of first control φ1 and a source terminal coupled to BL and a drain terminal coupled to second reference. In at least one embodiment, second switch 902 comprises a combination of n-type and p-type transistors, where gate terminals of n-type and p-type transistors are controllable by first control φ1 and complement or inverse of first control φ1, respectively. In at least one embodiment, combination of n-type and p-type transistors of second switch 902 comprise a transmission gate.

In at least one embodiment, third switch 1001 is controllable by a second control φ2 or complement or inverse of second control φ2. In at least one embodiment, second control φ2 causes third switch 1001 to couple or decouple node Vx with a first input of amplifier 1004. In at least one embodiment, apparatus 1000 comprises a capacitive device $C_{CM}$ coupled to node Vx and PL. In at least one embodiment, a first terminal of capacitive device $C_{CM}$ is connected to node Vx. In at least one embodiment, a second terminal of capacitive device $C_{CM}$ is connected to PL.

In at least one embodiment, a capacitive device $C_{CM}$ comprises a capacitor comprising non-linear polar material. In at least one embodiment, a capacitive device $C_{CM}$ comprises a capacitor comprising linear dielectric material. In at least one embodiment, capacitive device $C_{CM}$ comprises a capacitor according to any one of FIG. 2, FIG. 3A, FIG. 3B, FIGS. 4A-C, FIG. 5A, or FIG. 5B. In at least one embodiment, capacitive device $C_{CM}$ comprises a transistor configured as a capacitor.

In at least one embodiment, third switch 1001 comprises an n-type transistor having a gate terminal controllable by second control φ2 and a source terminal coupled to node Vx and a drain terminal coupled to first input of amplifier 1004. In at least one embodiment, third switch 1001 comprises a p-type transistor having a gate terminal controllable by complement or inverse of second control φ2 and a source terminal coupled to node Vx and a drain terminal coupled to first input of amplifier 1004. In at least one embodiment, third switch 1001 comprises a combination of n-type and p-type transistors, where gate terminals of n-type and p-type transistors are controllable by second control φ2 and complement or inverse of second control φ2, respectively. In at least one embodiment, combination of n-type and p-type transistors of third switch 1001 comprise a transmission gate.

In at least one embodiment, fourth switch 1002 is controllable by a second control φ2 or complement or inverse of second control φ2. In at least one embodiment, second control φ2 causes fourth switch 1002 to couple or decouple BL with a second input of amplifier 1004. In at least one embodiment, fourth switch 1002 comprises an n-type transistor having a gate terminal controllable by second control φ2 and a source terminal coupled to BL and a drain terminal coupled to second input of amplifier 1004. In at least one embodiment, fourth switch 1002 comprises a p-type transistor having a gate terminal controllable by complement or inverse of second control φ2 and a source terminal coupled to BL and a drain terminal coupled to second input of amplifier 1004. In at least one embodiment, fourth switch 1002 comprises a combination of n-type and p-type transistors, where gate terminals of n-type and p-type transistors are controllable by second control 2 and complement or inverse of second control φ2, respectively. In at least one embodiment, combination of n-type and p-type transistors of fourth switch 1002 comprise a transmission gate.

In at least one embodiment, fifth switch 1003 is controllable by first control φ1 or complement or inverse of first control φ1. In at least one embodiment, first control φ1 causes fifth switch 1003 to couple or decouple a third reference (e.g., voltage) to node Vx. In at least one embodiment, third reference is a common mode voltage $V_{CM}$. In at least one embodiment, third reference is programmable (e.g., by software, hardware, or a combination of them). In at least one embodiment, third reference is fixed. In at least one embodiment, third reference is self-generated. In at least one embodiment, third reference is self-generated using an adjacent memory array. In at least one embodiment, third reference is self-generated by averaging two states stored in a bit-cell (e.g., 0 and 1) in an adjacent memory array. In at least one embodiment, third reference is self-generated by generating an average difference between PL and BL of two different bit-cells of another memory array (e.g., an adjacent memory array). In at least one embodiment, control and sense circuitry 702 generates first control φ1 and second control φ2.

In at least one embodiment, capacitive device $C_{CM}$ is used to perform voltage subtraction. In at least one embodiment, common mode voltage $V_{CM}$ is pre-charged when PL and BL are being pre-charged or pre-discharged by switches 901 and 902, respectively. In at least one embodiment, after common mode voltage $V_{CM}$ is pre-charged, common mode voltage $V_{CM}$ is subtracted from voltage on PL to develop voltage on first input of amplifier 1004. In at least one embodiment, BL of selected memory bit-cell (e.g., $701_{0,0}$) is discharged to second voltage reference (e.g., ground) by turning switch 902 on by first control φ1.

In at least one embodiment, fifth switch 1003 comprises an n-type transistor having a gate terminal controllable by first control φ1 and a source terminal coupled to node Vx and a drain terminal coupled to third reference. In at least one embodiment, fifth switch 1003 comprises a p-type transistor having a gate terminal controllable by complement or inverse of first control φ1 and a source terminal coupled to node Vx and a drain terminal coupled to third reference. In at least one embodiment, third switch 1001 comprises a combination of n-type and p-type transistors, where gate terminals of n-type and p-type transistors are controllable by first control φ1 and complement or inverse of first control φ1.

In at least one embodiment, combination of n-type and p-type transistors of fifth switch 1003 comprise a transmission gate.

In at least one embodiment, during pre-charge state, BL of memory bit-cell (e.g., $701_{0,0}$) which is to be read, is discharged to second reference (e.g., ground) while PL of memory bit-cell (e.g., $701_{0,0}$) which is to be read, is charged to first reference (e.g., Vdd). In at least one embodiment, during a same pre-charge state, node Vx is charged to predetermined, common-mode voltage ($V_{CM}$). In at least one embodiment, during evaluation state, BL, PL, and node Vx are floated before WL of selected memory bit-cell (e.g., $701_{0,0}$) is enabled (e.g., asserted if access transistor of bit-cell is an n-type transistor). In at least one embodiment, after BL, PL, and node Vx are floated, charge on memory element (e.g., $C_{FE}$) of memory bit-cell (e.g., $701_{0,0}$) sinks a charge from PL and discharge into BL.

In at least one embodiment, amplifier 1004 is a sense amplifier that compares its first input with its second input, and generates an output Vout. In at least one embodiment, amplifier 1004 is a single stage amplifier. In at least one embodiment, amplifier 1004 is a multi-stage amplifier.

In at least one embodiment, apparatus 1000 can increase sense margin for a bit-cell. In at least one embodiment, charge and/or polarization density requirements for memory element (e.g., capacitor $C_{FE}$) of bit-cell are reduced because sense margin is increased. In at least one embodiment, by increasing sense margin, memory array size can be increased which allows for more load on PL and BL. In at least one embodiment, by increasing sense margin, sensitivity of amplifier 1004 can be reduced which can result in lower power consumption and smaller amplifier 1004. In at least one embodiment, sense margin improves by approximately $1+C_{BL}/C_{PL}$.

FIG. 11A illustrates timing diagram 1100 that shows operation of sensing circuitry of FIG. 10, in accordance with at least one embodiment. In at least one embodiment, reading or sensing data in a bit-cell comprises a pre-charge state, an evaluation state, and a sensing state. In at least one embodiment, during pre-charge state, assuming a p-type transistor for first switch 901, and an n-type transistor for second switch 902, first control $1 is asserted. In at least one embodiment, during pre-charge state, PL is charged to first reference (e.g., Vdd) while BL is discharged to second reference (e.g., Vss or ground). In at least one embodiment, during pre-charge state, fifth switch 1003 is closed which allows node Vx to be charged to common mode voltage $V_{CM}$. In at least one embodiment, access transistor of bit-cell is unselected during pre-charge state. In at least one embodiment, WL is de-asserted during pre-charge state to cause access transistor of bit-cell to be off. In at least one embodiment, during pre-charge state, amplifier 1004 is disconnected or decoupled from nodes Vx and BL. In at least one embodiment, before WL is deasserted, BL and PL may be brought to zero volts, to prevent development of history on a node. In at least one embodiment, before WL is deasserted, BL and PL may be brought to zero volts, to prevent development of history on a node. In at least one embodiment, prior to pre-charge phase, WL can be '0' or '1' as indicated by 'X'. In at least one embodiment, there is a high-impedance phase (HiZ) between pre-charge phase and evaluation phase. In at least one embodiment, HiZ phase ensures that sense charge on BL and PL is not lost prior to evaluation phase. In at least one embodiment, time duration of HiZ phase is such that there is no race condition with respect to word-line assertion and de-assertion of first control φ1.

In at least one embodiment, during evaluation state, first switch 901, second switch 902, and fifth switch 1003 are opened by first control φ1. In at least one embodiment, during evaluation phase, PL and BL are floated. In at least one embodiment, during evaluation state, WL is asserted to turn on access transistor of bit-cell to be read (assuming access transistor to be an n-type transistor). In at least one embodiment, third switch 1001 and fourth switch 1002 remain open during evaluation phase. In at least one embodiment, voltage on PL begins to discharge towards BL through bit-cell, and this establishes a voltage on node Vx and BL depending on value stored in memory device (e.g., $C_{FE}$) of bit-cell. In at least one embodiment, voltage on PL drops while voltage on BL increases during evaluation phase. In at least one embodiment, amount of charge being transferred from PL to BL is different for a stored value of 0 or 1 in bit-cell. In at least one embodiment, voltage on PL may drop and voltage on BL may rise during evaluation phase. In at least one embodiment, a voltage rise on BL and a voltage fall on PL may indicate a logic value stored in bit-cell. In at least one embodiment, during evaluation phase, node Vx is connected to PL through capacitive device $C_{CM}$, which is a floating device.

In at least one embodiment, voltage on node Vx drops by approximately voltage amount as drop in voltage on PL. In at least one embodiment, third reference $V_{CM}$ is a programmable voltage (e.g., programmable by software, hardware, or a combination of them). In at least one embodiment, third reference $V_{CM}$ is selected such that voltage difference on voltage on node Vx and BL have opposite polarity for stored value of 0 or 1.

Figure 11B:
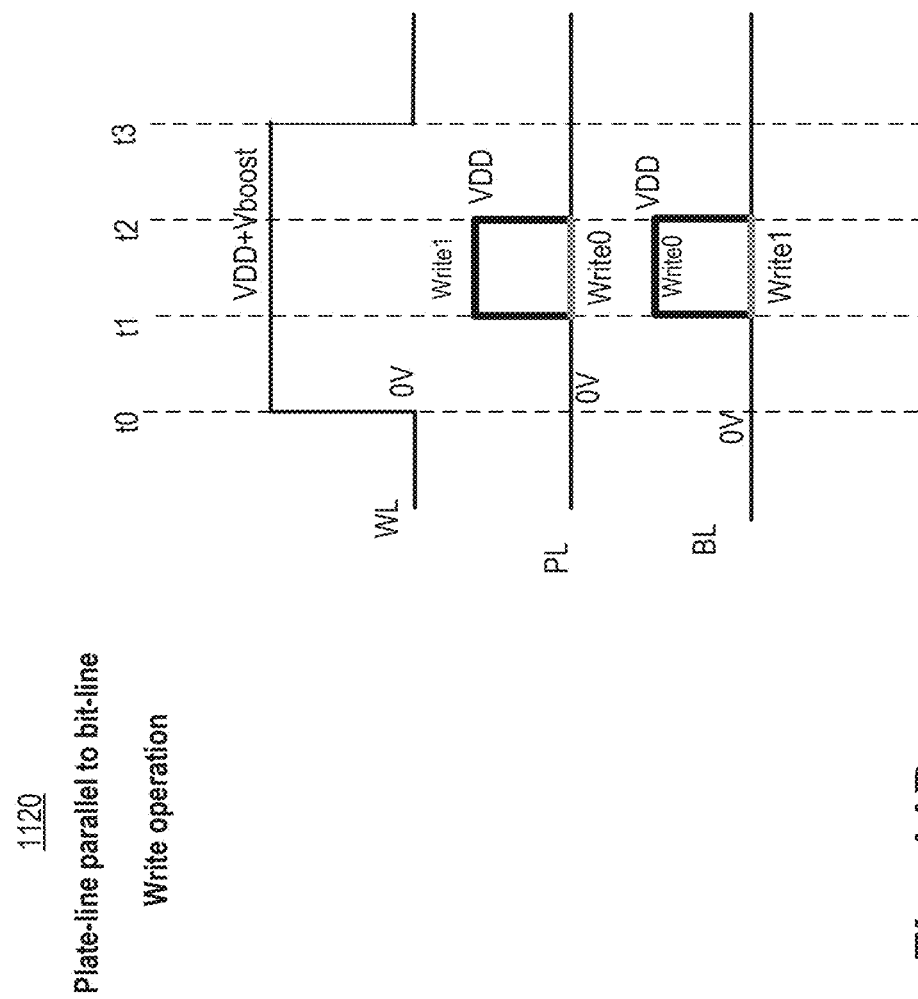
FIG. 11B illustrates a timing diagram that shows write operation, in accordance with at least one embodiment.

In at least one embodiment, during sensing state, first switch 901, second switch 902, and fifth switch 1003 remain open. In at least one embodiment, during sensing state, third switch 1001 and fourth switch 1002 are closed, which connects node Vx to first input of amplifier 1004 and BL to second input of amplifier 1004. In at least one embodiment, during sensing state, access transistor of bit-cell is turned off by de-asserting WL (assuming access transistor is n-type transistor). In at least one embodiment, amplifier 1004 detects difference between voltages on node Vx and BL, and generates an output Vout which indicates value (0 or 1) stored in bit-cell. In at least one embodiment, difference between voltages on node Vx and BL is large enough relative to second reference (e.g., ground) to determine values stored in bit-cell with high confidence, resulting in higher sense margin. In at least one embodiment, after evaluation phase, WL can be set according to an implementation specific for writeback (e.g., WL is represented by 'X' for WL after evaluation phase, where 'X' refers to either '0' or '1'). In at least one embodiment, PL and BL can be set to zero after sensing phase. In at least one embodiment, PL and BL can be set to zero after sensing phase with or without writeback. In at least one embodiment, signals described in FIG. 11A are asynchronous signals. In at least one embodiment, signals described in FIG. 11A are synchronous signals. In at least one embodiment, signals described in FIG. 11A are asynchronous signals or synchronous signals. In at least one embodiment, a writeback operation as discussed with reference to FIG. 11B follows read operation of FIG. 11A. In at least one embodiment, during writeback operation, pulsing of PL and BL are determined based on sensed value from read operation.

FIG. 11B illustrates a timing diagram 1120 that shows write operation, in accordance with at least one embodiment. In at least one embodiment, PL is parallel to BL. Depending on whether logic 1 (Write 1) or logic 0 (Write 0) is being written to a selected capacitor with non-linear polar material, BL or PL associated with that capacitor of bit-cell is asserted from 0V to Vdd (power supply level).

In at least one embodiment, write operation begins when WL is asserted and boosted above Vdd. In at least one embodiment, boost level is Vboost which may be 10% to 50% of Vdd. In at least one embodiment, Vboost is about equal to a threshold voltage of transistor $MN_1$ of 1T1C bit-cell. In at least one embodiment, WL boosting ensures that full voltage swing is seen by ferroelectric capacitor of the 1T1C bit-cell, negating the threshold (Vth) drop on n-type transistor $MN_1$. In at least one embodiment, WL boosting enables an overall lower voltage operation on BL and PL drivers. This may use higher signal conditioning on WL.

In at least one embodiment, since select transistor $MN_1$ in these configurations is an n-channel device, it is good at passing 0V and signals closer to 0V. In at least one embodiment, signal applied through BL when it is at Vdd, may not pass through transistor $MN_1$ in full. As such, there is a Vt drop across transistor $MN_1$ if WL is driven to Vdd. In at least one embodiment, to help get full range of signaling (e.g., 0 to Vdd) across capacitor Cfe1, WL-boosting helps negate Vt drop across transistor such that BL when driven to Vdd, internal node will also see Vdd, as opposed to Vdd-Vt.

In at least one embodiment, asserted WL is boosted for write operation (e.g., to Vdd+Vboost), and then selected BL and selected PL are toggled to write a logic 1 or logic 0 to capacitor Cfe1. In at least one embodiment, BL and PL are toggled. In at least one embodiment, to write a logic 1, BL is toggled to Vss when WL is boosted. In at least one embodiment, PL is set to logic 1 to allow storage of logic 1 value in capacitor Cfe1. In at least one embodiment, to write a logic 0, BL is kept at Vdd when WL is boosted. In at least one embodiment, PL is set to logic 0 to allow storage of logic 0 value in capacitor Cfe1. In at least one embodiment, duration of pulse widths of BL and PL is sufficient to change polarization state of capacitor Cfe1.

In at least one embodiment, when a particular bit-cell $701_{0,0}$ is being written (in this case using WL0), WL for unselected bit-cells (e.g., WL1 through WLm) remains at 0. In at least one embodiment, same is done for unselected BLs and PLs by column multiplexers. In at least one embodiment, BL or PLs are asserted and de-asserted within a pulse width of boosted WL. In at least one embodiment, voltage swing for selected BL and PL is 0 to Vdd. In at least one embodiment, BL or PL pulse is generated after a predetermined or programmable time from when WL boost starts, and BL or PL pulse ends within WL pulse. In at least one embodiment, WL boosting is not performed. In at least one embodiment, Vboost is 0V.

Figure 12:
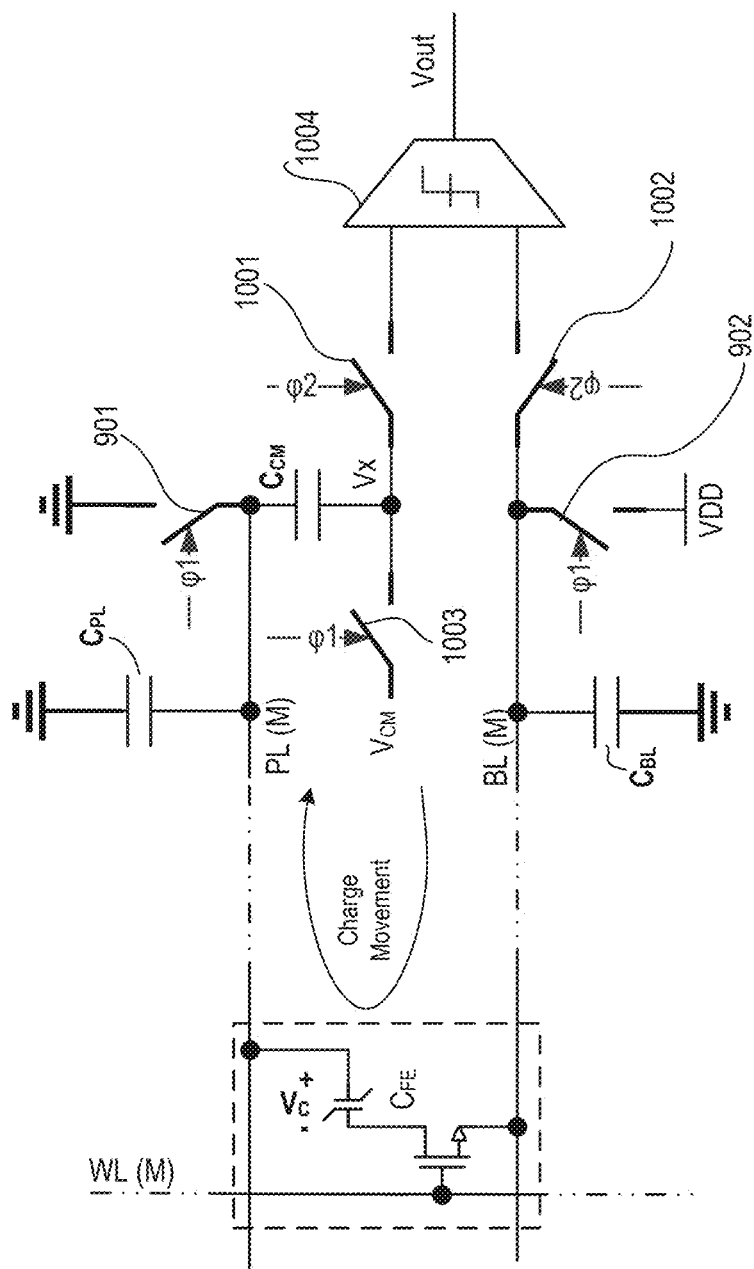
FIG. 12 illustrates a memory apparatus with a sensing circuitry that senses PL and BL to sense a bit value, in accordance with at least one embodiment.

FIG. 12 illustrates memory apparatus 1200 with a sensing circuitry that senses PL and BL to sense a bit value, in accordance with at least one embodiment. In at least one embodiment, first reference (ground) is lower than second reference (e.g., Vdd). In at least one embodiment, voltage on BL discharges towards PL through access transistor of bit-cell during evaluation phase. In at least one embodiment, first switch 901, when closed, couples first reference (e.g., ground) to PL. In at least one embodiment, second switch 902, when closed, couples second reference (e.g., Vdd) to BL.

FIG. 13A illustrates timing diagram 1300 that shows operation of sensing circuitry of FIG. 12, in accordance with at least one embodiment. In at least one embodiment, timing diagram 1300 is similar to timing diagram 1100 but for polarity of voltage on PL and BL during pre-charge and evaluation states.

In at least one embodiment, during pre-charge state, assuming an n-type transistor for first switch 901, a p-type transistor for second switch 902, first control φ1 is asserted. In at least one embodiment, during pre-charge state, PL is discharged to first reference (e.g., ground or Vss) while BL is charged to second reference (e.g., power supply level or Vdd). In at least one embodiment, during pre-charge state, fifth switch 1003 is closed which allows node Vx to be charged to common mode voltage $V_{CM}$. In at least one embodiment, access transistor of bit-cell is unselected during pre-charge state. In at least one embodiment, WL is de-asserted during pre-charge state to cause access transistor of bit-cell to be off. In at least one embodiment, during pre-charge state, amplifier 1004 is disconnected or decoupled from node Vx and BL. In at least one embodiment, prior to pre-charge phase, WL can be '0' or '1' as indicated by 'X'. In at least one embodiment, there is a high-impedance phase (HiZ) between pre-charge phase and evaluation phase. In at least one embodiment, HiZ phase ensures that sense charge on BL and PL is not lost prior to evaluation phase. In at least one embodiment, time duration of HiZ phase is such that there is no race condition with respect to word-line assertion and de-assertion of first control φ1.

In at least one embodiment, during evaluation state, first switch 901, second switch 902, and fifth switch 1003 are opened by first control φ1. In at least one embodiment, during evaluation phase, PL and BL are floated. In at least one embodiment, during evaluation state, WL is asserted to turn on access transistor of bit-cell to be read (assuming access transistor to be an n-type transistor). In at least one embodiment, WL is de-asserted to turn on access transistor of bit-cell to be read (assuming access transistor to be a p-type transistor). In at least one embodiment, third switch 1001 and fourth switch 1002 remain open during evaluation phase. In at least one embodiment, voltage on PL begins to discharge towards BL through bit-cell, and this establishes a voltage on node Vx and BL depending on value stored in memory device (e.g., $C_{FE}$) of bit-cell. In at least one embodiment, voltage on PL rises while voltage on BL drops during evaluation phase. In at least one embodiment, amount of charge being transferred from BL to PL is different for a stored value of 0 or 1 in bit-cell. In at least one embodiment, voltage on BL may drop and voltage on PL may rise during evaluation phase. In at least one embodiment, a voltage rise on PL and a voltage fall on BL may indicate a logic value stored in bit-cell. In at least one embodiment, during evaluation phase, node Vx is connected to PL through capacitive device $C_{CM}$, which is a floating device.

In at least one embodiment, voltage on node Vx rises by same voltage amount as rise in voltage on PL. In at least one embodiment, third reference $V_{CM}$ is a programmable voltage (e.g., programmable by software, hardware, or a combination of them). In at least one embodiment, third reference $V_{CM}$ is selected such that voltage difference on node Vx and BL have opposite polarity for stored value of 0 or 1.

Figure 13B:
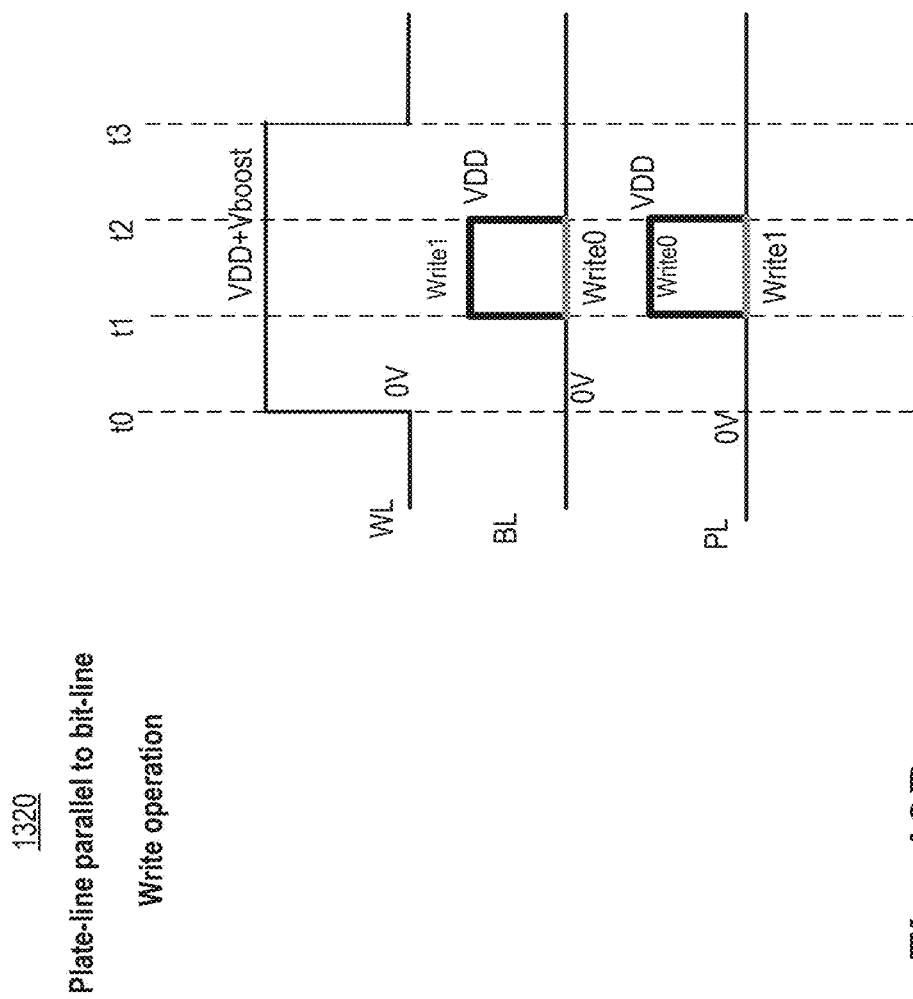
FIG. 13B illustrates a timing diagram that shows write operation, in accordance with at least one embodiment.

In at least one embodiment, during sensing state, first switch 901, second switch 902, and fifth switch 1003 remain open. In at least one embodiment, during sensing state, third switch 1001 and fourth switch 1002 are closed, which connects node Vx to first input of amplifier 1004 and BL to second input of amplifier 1004. In at least one embodiment, during sensing state, access transistor of bit-cell is turned off by de-asserting WL (assuming access transistor is n-type transistor). In at least one embodiment, amplifier 1004 detects difference between voltages on node Vx and BL, and generates an output Vout which indicates value (0 or 1) stored in bit-cell. In at least one embodiment, difference between voltages on node Vx and BL is large enough relative to second reference (e.g., ground) to determine values stored in bit-cell with high confidence, resulting in higher sense margin. In at least one embodiment, after evaluation phase, WL can be set according to an implementation specific for writeback (e.g., WL is represented by 'X' for WL after evaluation phase, where 'X' refers to either '0' or '1'). In at least one embodiment, PL and BL can be set to zero after sensing phase. In at least one embodiment, PL and BL can be set to zero after sensing phase with or without writeback. In at least one embodiment, signals described in FIG. 13A are asynchronous signals. In at least one embodiment, signals described in FIG. 13A are synchronous signals. In at least one embodiment, signals described in FIG. 13A are asynchronous signals or synchronous signals. In at least one embodiment, a writeback operation as discussed with reference to FIG. 13B follows read operation of FIG. 13A. In at least one embodiment, during writeback operation, pulsing of PL and BL are determined based on sensed value from read operation.

In at least one embodiment, depending on type of bit-cell (e.g., one of bit-cells described with reference to FIG. 14, FIG. 15, FIG. 16, or FIG. 18), sense and control circuitry 703 can be modified. In at least one embodiment, sense and control circuitry 703 can include controls for additional PLs for multi-PL bit-cell. In at least one embodiment, sensing process is performed per memory element (e.g., MTJ, capacitor comprising non-linear polar material, etc.) of a bit-cell. In at least one embodiment, PL of selected memory element is coupled to amplifier of sense and control circuitry 703. In at least one embodiment, PL of selected memory element is coupled to amplifier 1004 through node Vx via capacitive device $C_{CM}$.

FIG. 13B illustrates timing diagram 1320 that shows write operation, in accordance with at least one embodiment. In at least one embodiment, PL is parallel to BL. Depending on whether logic 1 (Write 1) or logic 0 (Write 0) is being written to a selected capacitor with non-linear polar material, BL or PL associated with that capacitor of bit-cell is asserted from 0V to Vdd (power supply level).

In at least one embodiment, write operation begins when WL is asserted and boosted above Vdd. In at least one embodiment, boost level is Vboost which may be 10% to 50% of Vdd. In at least one embodiment, Vboost is about equal to a threshold voltage of transistor $MN_1$ of 1T1C bit-cell. In at least one embodiment, WL boosting ensures that full voltage swing is seen by ferroelectric capacitor of 1T1C bit-cell, negating threshold (Vth) drop on n-type transistor $MN_1$. In at least one embodiment, WL boosting enables an overall lower voltage operation on BL and PL drivers. This may use higher signal conditioning on WL.

In at least one embodiment, since select transistor $MN_1$ in these configurations is an n-channel device, it is good at passing 0V and signals closer to 0V. In at least one embodiment, signal applied through BL when it is at Vdd, may not pass through transistor $MN_1$ in full. As such, there is a Vt drop across transistor $MN_1$ if WL is driven to Vdd. In at least one embodiment, to help get full range of signaling (e.g., 0 to Vdd) across capacitor Cfe1, WL-boosting helps negate Vt drop across transistor such that BL when driven to Vdd, internal node will also see Vdd, as opposed to Vdd-Vt.

In at least one embodiment, asserted WL is boosted for write operation (e.g., to Vdd+Vboost), and then selected BL and selected PL are toggled to write a logic 1 or logic 0 to capacitor Cfe1. In at least one embodiment, BL and PL are toggled. In at least one embodiment, to write a logic 1, BL is toggled to Vdd when WL is boosted. In at least one embodiment, PL is set to logic 0 to allow storage of logic 1 value in capacitor Cfe1. In at least one embodiment, to write a logic 0, BL is kept at Vss when WL is boosted. In at least one embodiment, PL is set to logic 1 to allow storage of logic 0 value in capacitor Cfe1. In at least one embodiment, duration of pulse widths of BL and PL is sufficient to change polarization state of capacitor Cfe1.

In at least one embodiment, when a particular bit-cell 701$_{0,0}$ is being written (in this case using WL0), WL for unselected bit-cells (e.g., WL1 through WLm) remains at 0. In at least one embodiment, same is done for unselected BLs and PLs by column multiplexers. In at least one embodiment, BL or PLs are asserted and de-asserted within a pulse width of boosted WL. In at least one embodiment, voltage swing for selected BL and PL is 0 to Vdd. In at least one embodiment, BL or PL pulse is generated after a predetermined or programmable time from when WL boost starts, and BL or PL pulse ends within WL pulse. In at least one embodiment, WL boosting is not performed. In at least one embodiment, Vboost is 0V.

Figure 14:
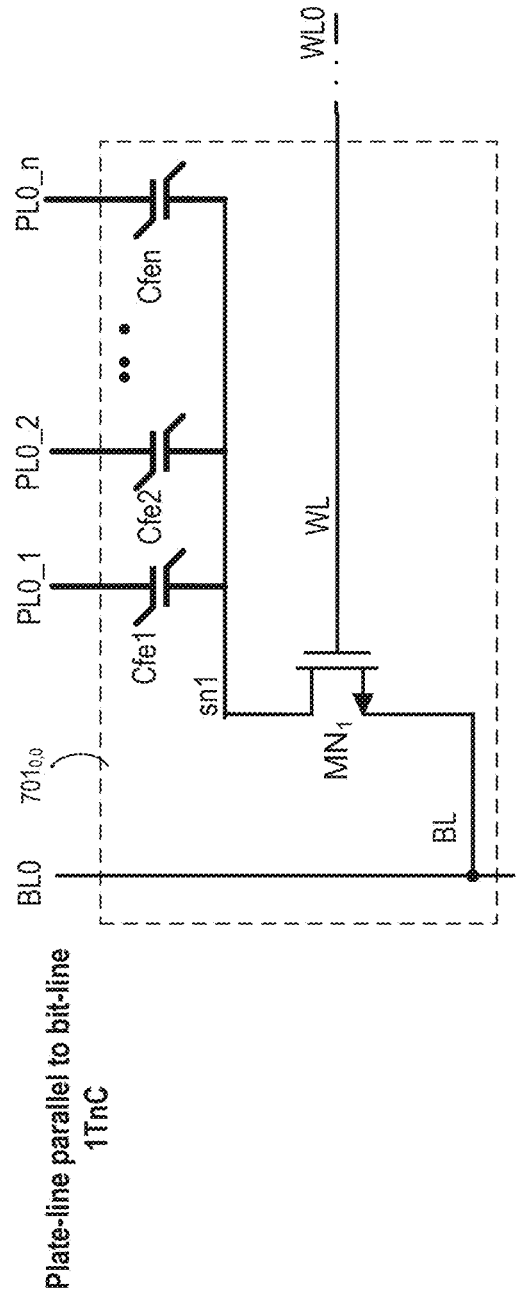
FIG. 14 illustrates a 1TnC bit-cell comprising non-linear polar material for its capacitors, where the plate-lines are parallel to the bit-line, in accordance with at least one embodiment.

FIG. 14 illustrates a 1TnC bit-cell comprising non-linear polar material for its capacitors, where plate-lines are parallel to bit-line, in accordance with at least one embodiment. In at least one embodiment, memory bit-cell 1400 (e.g., bit-cell 701$_{0,0}$) comprises one select transistor $MN_1$ and a plurality of capacitors Cfe1, Cfe2, through Cfen (where 'n' is a number greater than 1) comprising non-linear polar material (e.g., ferroelectric, paraelectric, or non-linear dielectric). In at least one embodiment, capacitors can be a planar or a non-planar capacitor. In at least one embodiment, plurality of capacitors Cfe1, Cfe2, through Cfen are stacked and folded capacitors.

In at least one embodiment, gate terminal of transistors $MN_1$ is controllable by WL. In at least one embodiment, BL is coupled to a source or drain terminal of transistor $MN_1$. In at least one embodiment, an individual PL of a plurality of PLs is coupled to an individual capacitor. In at least one embodiment, capacitor Cfe1 is coupled to plate-line PL0_1, capacitor Cfe2 is coupled to plate_line PL0_2, and capacitor Cfen is coupled to plate_line PL0_n. In at least one embodiment, plurality of capacitors is coupled to storage node sn1, which is coupled to a drain or source terminal of transistor $MN_1$. In at least one embodiment, a first terminal of capacitor Cfe1 is coupled to PL0_1 and a second terminal of capacitor Cfe1 is coupled to storage node sn1. In at least one embodiment, apparatus 700 has n-number of PLs (e.g., PL0_1 through PL0_n) per column which are parallel to a BL for that column.

While at least one embodiment is illustrated with reference to an n-type transistor, at least one embodiment is also applicable to a p-type transistor or a combination of n-type or p-type transistors. In at least one embodiment, when a transistor of a different conductivity type is used than what is shown in FIG. 14, then driving logic for BL, PLS, and/or WL may also change for proper read and/or write operations. In at least one embodiment, PLs are parallel to BL. In at least one embodiment, PL0_1, PL0_2, . . . . PL0_n are parallel to BL. In at least one embodiment, transistor $MN_1$ is fabricated on frontend of die and capacitors are stacked over transistor $MN_1$. In at least one embodiment, capacitors are stacked along z-direction and folded along x-axis. Capacitors can be planar or non-planar capacitors. As such, in at least one embodiment, a taller and wider bit-cell is formed with a footprint comparable to footprint of transistor $MN_1$. In at least one embodiment, x-y footprint is determined by size of transistor $MN_1$ and its connections to BL, WL, and storage node sn1.

In at least one embodiment, PL (e.g., PL0_1, PL0_2, . . . . PL0_n) controls which capacitor of bit-cell is programmed, and value of programming. In at least one embodiment, BL acts as a sense-line. In at least one embodiment, voltage on BL (e.g., sense voltage) can create disturbance on other bit-lines during read operation. To mitigate such disturbances, in at least one embodiment, 1TnC bit-cell is periodically refreshed (e.g., every 1 second). In at least one embodiment, periodic refresh is minimized by refreshing in active mode of operation. In at least one embodiment, in standby mode (e.g., low power mode), 1TnC bit-cell may not be refreshed as there is no disturb mechanism during standby. In at least one embodiment, wear-leveling logic 706 provides one or more endurance mechanisms for 1TnC memory bit-cells.

In 1TnC bit-cell (e.g., bit-cell $701_{0,0}$) with PL parallel to BL, activities seen on an unselected or unintended bit-cell while performing read/write operations on same column as that of selected bit-cell can have large disturb effects on unselected or unintended bit-cells. This may be true if PL, within a same column, toggles (during read or write) a particular value to a desired bit-cell. This signal on PL of that column, which is shared with other unselected cells, can create a field across non-linear polar material based capacitors or devices of unselected cells. Field across unselected non-linear polar material based capacitors or devices is a function of dielectric component of individual non-linear polar material based capacitors or devices and total capacitance on storage node sn1 of those bit-cells. Since in 1TnC bit-cells storage capacitor has much larger capacitance load, activity seen on unselected bit-line can result into almost all voltage getting dropped across ferroelectric capacitors (e.g., Vfe=Vpl*(Cp/(Cfed+Cp), which creates a disturb effect, which in turn causes unintentional modification of polarization stage of ferroelectric capacitor. In at least one embodiment, one of endurance mechanisms involves refreshing of data content in capacitor(s).

Figure 15:
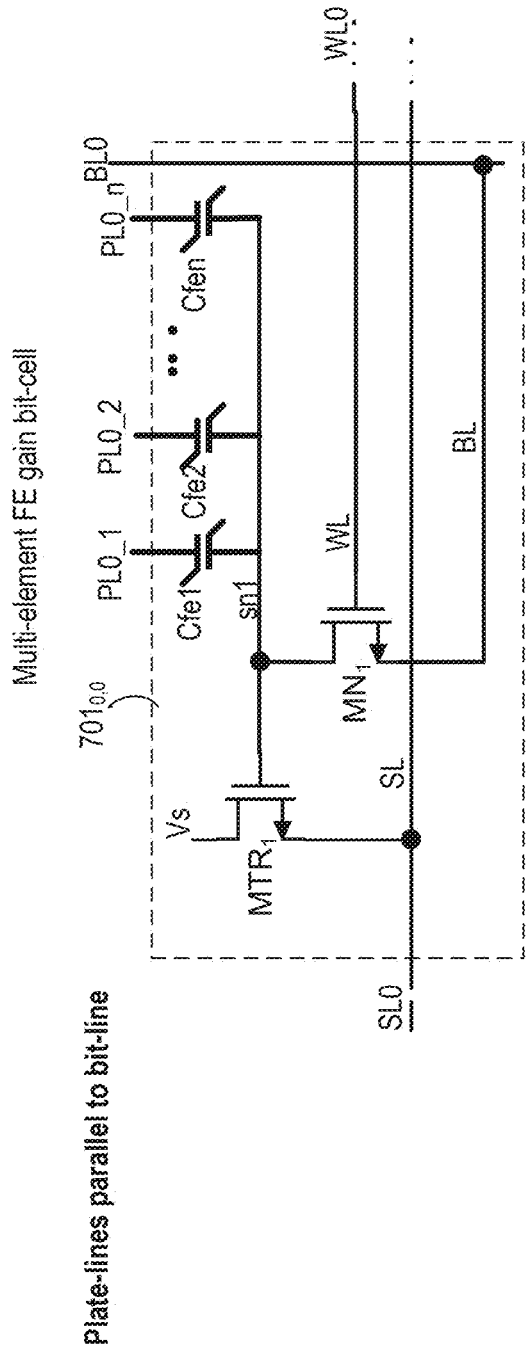
FIG. 15 illustrates a multi-element FE gain bit-cell with plate-lines parallel to the bit-line, in accordance with at least one embodiment.

FIG. 15 illustrates a multi-element FE gain bit-cell with plate-lines parallel to bit-line, in accordance with at least one embodiment. In at least one embodiment, bit-cell 1500 (e.g., 701$_{0,0}$) comprises an n-type select transistor $MN_1$, an n-type transistor $MTR_1$, a bit-line (BL), a word-line (WL), a sense-line (SL), and 'n' number of ferroelectric (or paraelectric) capacitors Cfe1 through Cfen. In at least one embodiment, gate terminal of n-type transistor $MN_1$ is coupled to WL (e.g., WL1). In at least one embodiment, drain or source terminal of n-type transistor $MN_1$ is coupled to BL. In at least one embodiment, first terminals of each of capacitors Cfe1 through Cfen is coupled to a storage node sn1. In at least one embodiment, storage node sn1 is coupled to a source or drain terminal of n-type transistor $MN_1$ and to a gate of transistor $MTR_1$. In at least one embodiment, drain or source terminal of $MTR_1$ is coupled to a bias voltage Vs. In at least one embodiment, Vs is a programmable voltage that can be generated by any suitable source. In at least one embodiment, Vs voltage helps in biasing gain transistor in conjunction with sense-voltage that builds at sn1 node. In at least one embodiment, source or drain terminal of transistor $MTR_1$ is coupled to SL (e.g., SL1). In at least one embodiment, a p-type transistor can be used as well for gain.

In at least one embodiment, second terminals of each of capacitors Cfe1 through Cfen is coupled to a corresponding plate-line (PL). In at least one embodiment, second terminal of Cfe1 is coupled to PL0_1, second terminal of Cfe2 is coupled to PL0_2, and so on. In at least one embodiment, apparatus 700 has n-number of PLs (e.g., PL0_1 through PL0_n) per column which are parallel to a BL for that column. In at least one embodiment, SL is parallel to PL. In at least one embodiment, SL is parallel to WL.

In at least one embodiment, ferroelectric (or paraelectric) capacitors Cfe1 through Cfen are planar capacitors such as those discussed herein. In at least one embodiment, ferroelectric (or paraelectric) capacitors Cfe1 through Cfen are pillar capacitors such as those discussed herein. In at least one embodiment, ferroelectric (or paraelectric) capacitors Cfe1 through Cfen are vertically stacked and horizontally folded allowing for tall bit-cells (e.g., higher in z-direction) but with x-y footprint of two transistors. In at least one embodiment, by folding capacitors, diffusion capacitance on BL reduces for a given array size, which improves reading speed. In at least one embodiment, folding capacitors lower effective routing capacitance on BL. In at least one embodiment, larger footprint in x-y direction of multi-element FE gain bit-cell compared to footprint in x-y direction of 1TnC bit-cell, vertical height of capacitor can be reduced as capacitors can expand in x-y direction more than before for a given height. As such, in at least one embodiment, capacitors are folded more effectively. In at least one embodiment, n/2 capacitors per metal or via layer can be packed. In at least one embodiment, more capacitors can be stacked in multi-element FE gain bit-cell because storage node sn1 is decoupled from BL. In at least one embodiment, multi-element FE gain bit-cell reduces thickness scaling requirement for a pillar capacitor. In at least one embodiment, polarization density requirements are reduced for multi-element FE gain bit-cell compared to a 1TnC bit-cell.

In at least one embodiment, x-y footprint is determined by size of transistor $MN_1$ and its connections to BL, WL, and storage node sn1. In at least one embodiment, footprint can still be decided by other factors such as: number of capacitors that connect to node; how capacitors are arranged, e.g., more folding on same node versus stacking; effective size constraints on those capacitors; and number of capacitors that share same bit-cell. In at least one embodiment, PL (e.g., PL0_1, PL0_2, . . . . PL_n) controls which cell within same access transistor gets programmed, and value of programming. In at least one embodiment, BL acts as a sense-line. In at least one embodiment, voltage on BL (e.g., sense voltage) can create disturbance on other bit-lines during read operation. In at least one embodiment, to mitigate such disturbances, multi-element FE gain bit-cell (e.g., 701$_{0,0}$) may be periodically refreshed (e.g., every 1 second). In at least one embodiment, periodic refresh may be minimized by refreshing an active mode of operation that can be coupled with advance schemes for wear leveling. In at least one embodiment, in standby mode (e.g., low power mode), multi-element FE gain bit-cell (e.g., 701$_{0,0}$) may not be refreshed as there is no disturb mechanism during standby. In at least one embodiment, multi-element FE gain bit-cell (e.g., 701$_{0,0}$) relies on isolating read mode from BL or SL capacitance by isolating through access transistor $MN_1$, where $MN_1$ transistor facilitates pre-charging sn1 node, prior to read operation.

In at least one embodiment, there may be a possibility of disturbance at storage node sn1 during read operation. In at least one embodiment, PL is toggled for other capacitors to average value of disturbance that will be seen on sn1 node, e.g., when a read pulse of some polarity is applied at PL of capacitor to be read, a non-zero voltage is applied on other PLs of multi-element FE gain bit-cell (e.g., 701$_{0,0}$), that matches expected disturbance seen on a shared node. In at least one embodiment, PL driver is configured to support driving different voltage levels on different PLs. In at least one embodiment, wear-leveling logic 706 provides one or more endurance mechanisms for multi-element FE gain bit-cells. In at least one embodiment, one of endurance mechanisms involves refreshing of data content in capacitor(s).

Figure 16:
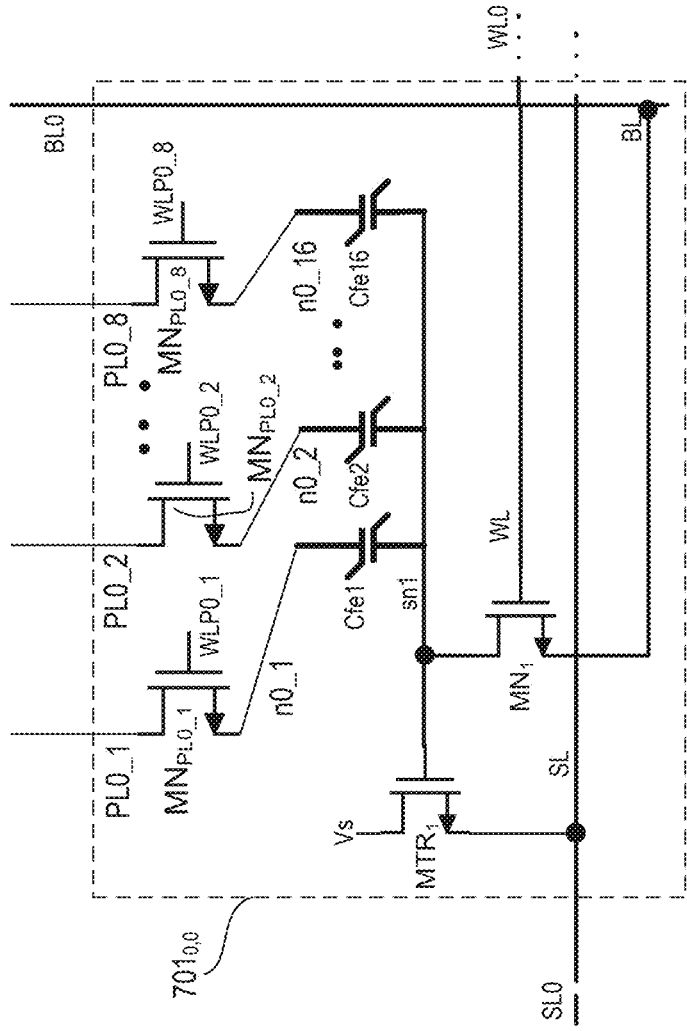
FIG. 16 illustrates a multi-element FE gain bit-cell with plate-line switches, in accordance with at least one embodiment.

FIG. 16 illustrates a multi-element FE gain bit-cell with plate-line switches, in accordance with at least one embodiment. In at least one embodiment, bit-cell 1600 is like bit-cell 1500, but with switches in path of plate-lines and hence a different kind of memory bit-cell. In at least one embodiment, these switches are added to remove charge disturb effect of unselected bit-cells when bit-lines are arranged parallel to plate-lines. In at least one embodiment, charge disturb effect here is on stored state of capacitors with non-linear polar material. In at least one embodiment, by adding switches, plate-lines are no longer directly affecting charge disturb effect because of corresponding WLs that control switches.

In at least one embodiment, n-type transistor $MN_{PLO\_1}$ is coupled to Cfe1 and plate-line PL0_1. In at least one embodiment, n-type transistor $MN_{PLO\_2}$ is coupled to Cfe2 and plate-line PL0_2. In at least one embodiment, n-type transistor $MN_{PLO\_n}$ is coupled to Cfen and plate-line PL0_$n$. In at least one embodiment, each transistor (or switch) is controlled separately. In at least one embodiment, transistor $MN_{PLO\_1}$ is controllable by WLP0_1, transistor $MN_{PLO\_2}$ is controllable by WLP0_2, and so on. In at least one embodiment, transistor $MN_{PLO\_n}$ is controllable by WLP0_$n$. In at least one embodiment, WLP0_1 . . . . WLP0_$n$ are extensions of an address space. In at least one embodiment, depending upon which storage element is being programmed or read, corresponding WLP0_1 . . . . WLP0_$n$ are kept high (e.g., Vdd) whenever plate-line voltage of 0V or Vdd is applied, while unselected storage element sees 0V.

While at least one embodiment is illustrated with reference to an n-type transistor or switch, at least one embodiment is also applicable to a p-type transistor or a combination of n-type or p-type transistors. In at least one embodiment, when a transistor of a different conductivity type is used than what is shown in FIG. 16, then driving logic for BL, PLs, WL, and/or WLPs may also change for proper read and/or write operations.

In at least one embodiment, switches added to plate-lines are fabricated in different layers of a die. In at least one embodiment, transistor $MN_1$ is fabricated on frontend of die while transistors $MN_{PLO\_1}$, $MN_{PLO\_2}$, . . . and $MN_{PLO\_n}$, are fabricated in backend of die. In at least one embodiment, capacitor Cfe is fabricated between frontend and backend of die. In at least one embodiment, capacitors Cfe are vertically stacked capacitors and horizontally folded. In at least one embodiment, each switch and its corresponding coupled capacitor is formed in backend of die. In at least one embodiment, each switch and its corresponding coupled capacitor is stacked vertically. In at least one embodiment, transistor $MN_{PLO\_1}$ and capacitor Cfe1 are stacked vertically in a first vertical stack, and transistor $MN_{PLO\_2}$ and capacitor Cfe2 are stacked vertically in a second vertical stack. In at least one embodiment, capacitors Cfe1 and Cfe2 are stacked and folded. In at least one embodiment, backed transistors or switches can be fabricated using any suitable technology such as IGZO (indium gallium zinc oxide).

Figure 17:
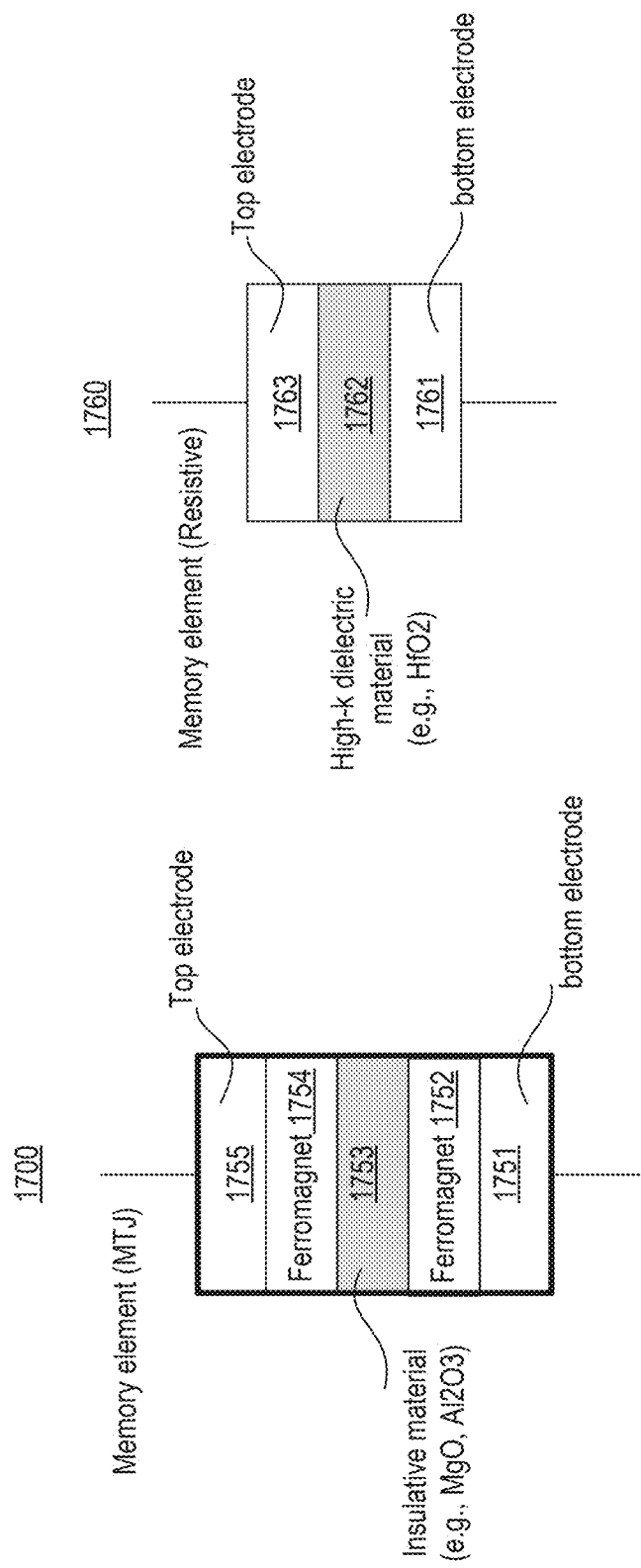
FIG. 17 illustrates memory elements (MEs) for use in memory bit-cells, in accordance with at least one embodiment.

FIG. 17 illustrates memory elements (MEs) for use in memory bit-cells, in accordance with at least one embodiment. In at least one embodiment, planar memory element structures are resistive elements. In at least one embodiment, planar memory element structures are magnetic tunnel junctions (MTJs). In at least one embodiment, planar memory element structures are phase change memory (PCM) memories.

In at least one embodiment, MTJ 1700 comprises a bottom electrode 1751, a free ferromagnetic layer 1752, an insulative material 1753 (e.g., tunnel barrier materials such as MgO, $Al_2O_3$, or $SrTiO_3$), a fixed ferromagnetic layer 1754, and a top electrode 1755. In at least one embodiment, free ferromagnetic layer 1752 comprises one or more of CrO2, Heusler alloys, Fe, or CoFeB. In at least one embodiment, insulative material 1753 (also referred to as tunnel barrier) includes one of: MgO, AlOx (where x is a number or fraction), or $SrTiO_3$. In at least one embodiment, fixed ferromagnetic layer 1754 includes one of $CrO_2$, Heusler alloys, FeCo(001), CoFeB. In at least one embodiment, an anti-ferromagnetic layer (not shown) is formed over fixed ferromagnetic layer 1754. In at least one embodiment, anti-ferromagnetic (AFM) layer comprises Ru or Ir. In at least one embodiment, AFM layer comprises a super lattice of Co and Pt coupled with Ru or Ir. In at least one embodiment, bottom electrode 1751 and top electrode 1755 includes one or more of: Al, Ti, Cu, Ag, Pt, TiN, TaN, Al doped ZnO, Ga-doped ZnO, or indium tin oxide (ITO). In at least one embodiment, bottom electrode 1751 and top electrode 1755 are symmetric. In at least one embodiment, bottom electrode 1751 and top electrode 1755 are asymmetric. In at least one embodiment, bottom electrode 1751 and top electrode 1755 may have same materials as those discussed with reference to electrodes in FIG. 4B.

In at least one embodiment, resistive memory 1760 (Re-RAM) comprises bottom electrode 1761, insulative material 1762, and top electrode 1763. In at least one embodiment, insulative material 1762 includes: $HfO_x$, $TiO_x$, TaOx, NiO, $ZnO_x$, $Zn_2TiO_4$, $KnO_x$, MgO, $AlO_x$, $ZrO_x$, $Cu_xO_y$, $SnO_2$, $GeO_x$, $LaO_x$, $YO_x$, $MoO_x$, or $CoO_x$ (where 'x' and 'y' are a number or a fraction). In at least one embodiment, insulative material 1762 for ReRAM includes oxides of: Mg, Ce, Y, La, Ti, Zr, Hf, V, Nb, Tn, Cr, Mo, W, Mn, Fe, Gd, Co, Ni, Cu, Zn, Al, Ga, Si, Ge, Sn, Yb, or Lu. In at least one embodiment, bottom electrode 1761 and top electrode 1763 includes one or more of: Al, Ti, Cu, Ag, Pt, TiN, TaN, Al doped ZnO, Ga-doped ZnO, or indium tin oxide (ITO). In at least one embodiment, bottom electrode 1761 and top electrode 1763 are symmetric. In at least one embodiment, bottom electrode 1761 and top electrode 1763 are asymmetric. In at least one embodiment, bottom electrode 1761 and top electrode 1763 may have same materials as those discussed with reference to electrodes in FIG. 4B.

In at least one embodiment, in ReRAM systems that use forming of filaments, an initial operation may begin by applying a voltage pulse with an increasing magnitude, between top electrode 1763 and bottom electrode 1761. In at least one embodiment, magnitude of voltage pulse may be substantially greater than a voltage level utilized to cycle ReRAM device during regular course of programming. In at least one embodiment, a high voltage pulse may be utilized to perform an intentional one-time breakdown process, known as forming. In at least one embodiment, forming process creates one or more conductive filaments that provide pathways for electron transport during device operation.

In at least one embodiment, resistive memory 1760 is a phase-change memory (PC-RAM). In at least one embodiment, resistive memory 1760 comprises bottom electrode 1761, insulative material 1762, and top electrode 1763. In at least one embodiment, insulative material 1762 is a phase-change material. In at least one embodiment, phase-change material comprises phase-change chalcogenides. In at least one embodiment, phase-change material includes one of: (GeTe)m(Sb2Te3)n, Ge2Sb2Te$_5$, Ge2Sb2Te4, AgInSbTe, super lattices of GeTe, Sb2Te3, super lattices of TiTe2 and Sb2Te3, WSe2, WS2, or PtSe2 (where m and n are numbers or fractions). In at least one embodiment, phase-change material includes binary transition metal oxides such as NiO or TiO$_2$, perovskites such as Sr(Zr)TiO$_3$ or PCMO, solid-state electrolytes such as GeS, GeSe, SiO$_x$, or Cu$_2$S, organic materials such as AIDCN, or layered materials, such as hexagonal boron nitride.

In at least one embodiment, when ME structures are not capacitors (as those described with reference to at least one embodiment herein), current based pulsing scheme(s) are used to drive (e.g., write) and for sensing (e.g., read). In at least one embodiment, plate-lines flow current to configure or read ME structures. In at least one embodiment, ME structures may be a mix of various types of ME structures (e.g., ferroelectric based capacitors, paraelectric based capacitors, MTJ, ReRAM, or PC-RAM). In at least one embodiment, all ME structures for an array are of same type.

Figure 18:
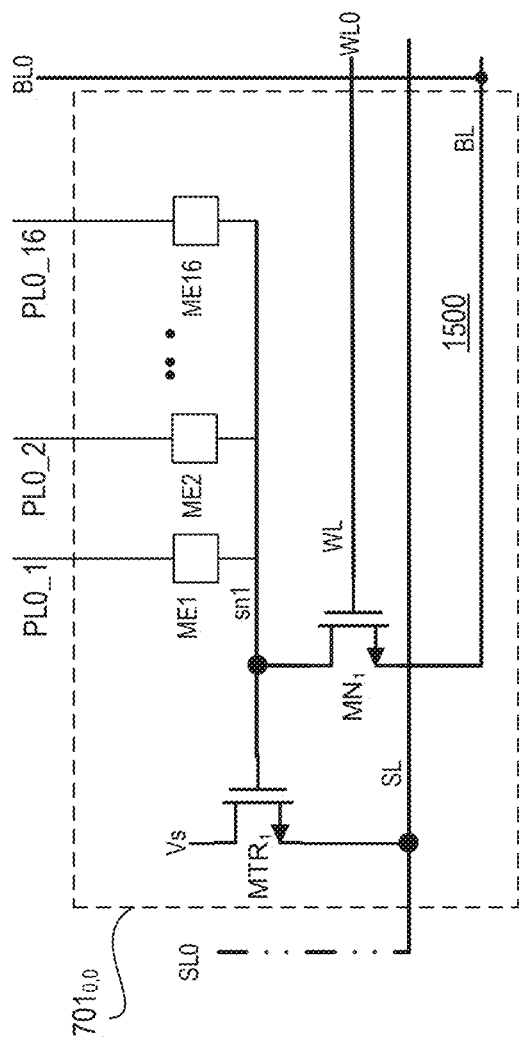
FIG. 18 illustrates a multi-element gain bit-cell with plate-lines parallel to the bit-line, in accordance with at least one embodiment.

FIG. 18 illustrates a multi-element gain bit-cell with plate-lines parallel to bit-line, in accordance with at least one embodiment. Multi-element gain bit-cell 1800 is same as multi-element FE gain bit-cell described herein, but with 16 memory elements and 16 associated plate-lines. In this case, plate-lines are parallel to bit-line.

Figure 19:
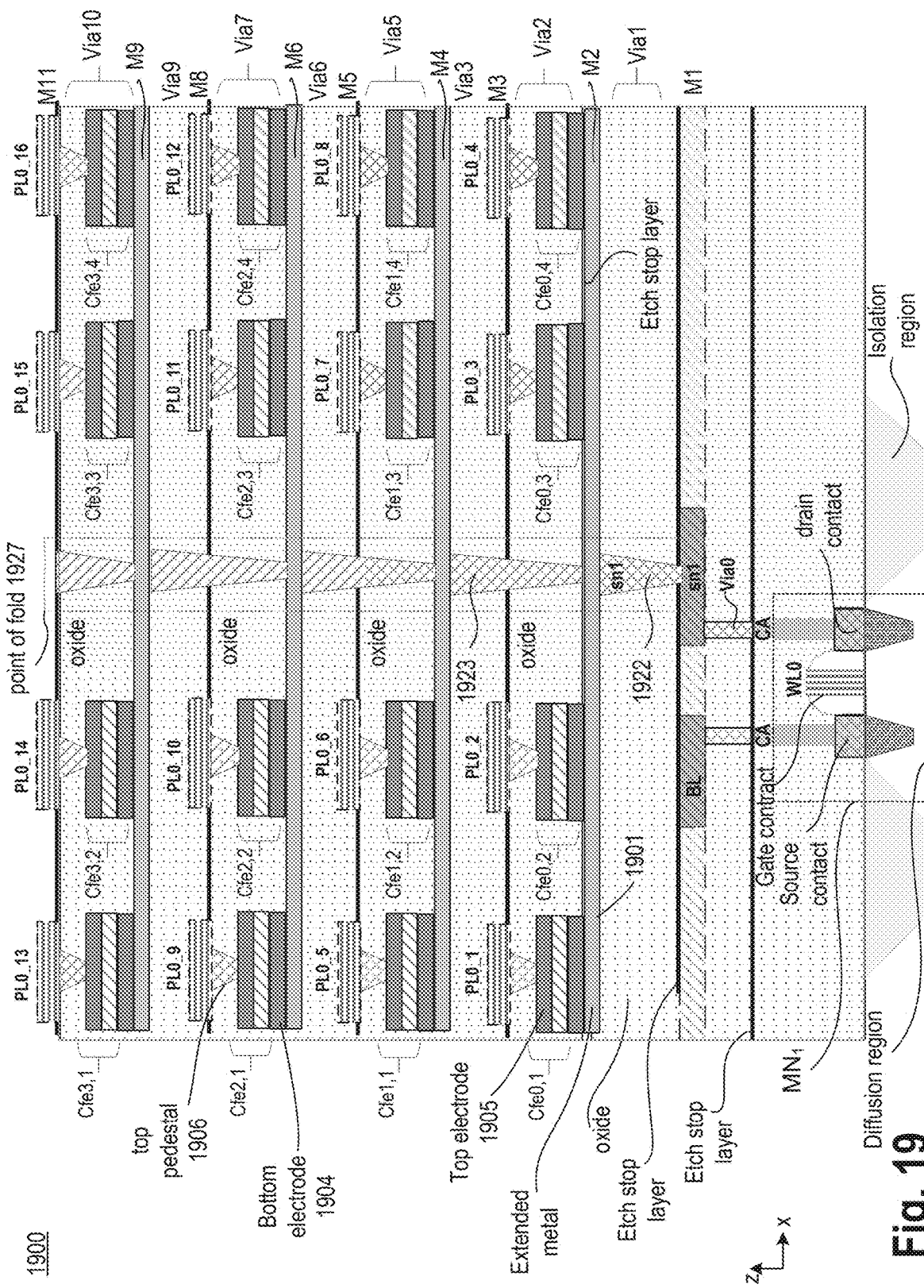
FIG. 19 illustrates a cross-section of a memory bit-cell with folded and stacked capacitors or memory elements, in accordance with at least one embodiment.

FIG. 19 illustrates a cross-section of memory bit-cell 1900 with folded and stacked capacitors or memory elements, in accordance with at least one embodiment. In at least one embodiment, memory bit-cell comprises one transistor MN$_1$ having a gate terminal controllable by WL0. In at least one embodiment, source and drain terminals or contacts of transistor are coupled to respective contacts (CA). In at least one embodiment, etch stop layer is used in fabrication of vias (via0) to connect one of source or drain contacts of transistor to storage node sn1 on metal-1 (M1) layer, and another one of source or drain contacts of transistor to BL on M1 layer. In at least one embodiment, another etch stop layer is formed over M1 layer to fabricate vias (via1) to couple to respective M1 layers.

In at least one embodiment, 1TnC memory bit-cell has 16 capacitors. In at least one embodiment, any number of capacitors may be used for 1TnC memory bit-cell. In at least one embodiment, an individual capacitor has a bottom shared electrode 1901 which is coupled to storage node sn1 1922, and top electrode 1905 which is coupled to a respective plate-line. In at least one embodiment, instead of or in addition to shared bottom electrode 1901, an individual capacitor may include a bottom electrode 1904. In at least one embodiment, top electrode 1905 is coupled to plate-line via pedestal 1906. In at least one embodiment, in stack and fold configuration, N number of capacitors can be divided in L number of stack layers such that there are N/L capacitors in each cap layer. In at least one embodiment, 16 capacitors (Cfe0,1, Cfe0,2, Cfe0,3, Cfe0,4, Cfe1,1, Cfe1,2, Cfe1,3, Cfe1,4, Cfe2,1, Cfe2,2, Cfe2,3, Cfe2,4, Cfe3,1, Cfe3,2, Cfe3,3, and Cfe3,4) are divided in four numbers of stacked layers such that there are 16/4 capacitors in each stacked layer. In at least one embodiment, each capacitor has a first terminal coupled to a common node sn1 1922, and a second terminal coupled to a respective plate-line. In at least one embodiment, common node sn1 1922 thus becomes a point of fold 1927.

In at least one embodiment, planar capacitors are illustrated with three layers: a top electrode, a dielectric, and a bottom electrode. In at least one embodiment, capacitors can include any of planar capacitor configurations discussed herein. In at least one embodiment, planar capacitors can be any one of capacitors of FIGS. 4A-B or memory elements described with reference to FIG. 17.

Referring to FIG. 19, in at least one embodiment, capacitors are positioned symmetrically relative to point of fold 1927 and common node sn1. In at least one embodiment, equal number of capacitors are positioned on either sides of common node sn1 and in stack. In at least one embodiment, capacitors are not positioned symmetrically relative to point of fold. In at least one embodiment, there may be more capacitors on one side of storage node sn1 relative to another side. In at least one embodiment, each layer may also have a symmetric or non-symmetric arrangement of capacitors. In at least one embodiment, capacitors are spaced substantially at equilateral (horizontal x-plane) distance L1. In at least one embodiment, capacitors are separated by non-equilateral distance.

In at least one embodiment, in a stacked configuration, capacitors would be vertically stacked resulting in a tall memory cell. In at least one embodiment, depending on process technology node, number of capacitors may be limited by number of metal layers available by process technology node. In at least one embodiment, in stack and fold configuration, capacitors are vertically stacked as well as horizontally placed by sharing a common electrode, which in turn couples to a shared node (e.g., storage node sn1). In at least one embodiment, first terminals of capacitors are coupled to shared node sn1.

In at least one embodiment, in first row, second terminal of Cfe0,1 is coupled to plate-line PL0_1, second terminal of Cfe0,2 is coupled to plate-line PL0_2, second terminal of Cfe0,3 is coupled to plate-line PL0_3, and second terminal of Cfe0,4 is coupled to plate-line PL0_4. In at least one embodiment, in second row, second terminal of Cfe1,1 is coupled to plate-line PL0_5, second terminal of Cfe1,2 is coupled to plate-line PL0_6, second terminal of Cfe1,3 is coupled to plate-line PL0_7, and second terminal of Cfe1,4 is coupled to plate-line PL0_8. In at least one embodiment, in third row, second terminal of Cfe2,1 is coupled to plate-line PL0_9, second terminal of Cfe2,2 is coupled to plate-line PL0_10, second terminal of Cfe2,3 is coupled to plate-line PL0_11, and second terminal of Cfe2,4 is coupled to plate-line PL0_12. In at least one embodiment, in fourth row, second terminal of Cfe3,1 is coupled to plate-line PL0_13, second terminal of Cfe3,2 is coupled to plate-line PL0_14, second terminal of Cfe3,3 is coupled to plate-line PL0_15, and second terminal of Cfe3,4 is coupled to plate-line PL0_16.

In at least one embodiment, each capacitor structure includes a shared bottom electrode 1901 which couples to capacitors of that row and to common node sn1 1922. In at least one embodiment, multiple vias are used for common node sn1 to connect common node sn1 on M1 to shared bottom electrode 1901. In at least one embodiment, multiple vias are used for storage node sn1 to couple to shared bottom electrode 1901 to reduce reliability issues like electromigration. In at least one embodiment, a vertical tower of vias and metal layers are used to extend storage node sn1 to higher levels along vertical direction.

In at least one embodiment, shared bottom electrode 1901 (or extended bottom electrode) can be a metal electrode or a first conductive oxide, or a combination of a second conductive oxide and a barrier or insulative material, in accordance with at least one embodiment. In at least one embodiment, barrier material or insulative material can be any one of insulative materials discussed herein. In at least one embodiment, shared bottom electrode 1901 comprises a reflective intermetallic material. By using a shared bottom electrode, fabrication steps for fabricating each capacitor are reduced. Further, vertical height is also reduced for memory bit-cell. In at least one embodiment, shared bottom electrode 1901 is indirectly coupled to ferroelectric material or memory material.

In at least one embodiment, a metal layer is formed over top electrode of each capacitor to connect to a respective input. In at least one embodiment, a pedestal is formed between top electrode and metal layer connected to respective input. In at least one embodiment, metal layer over a pedestal which is adjacent to top electrode of capacitor Cfe0,1 is connected to plate-line PL0_1. In at least one embodiment, metal layer over a pedestal which is adjacent to top electrode of capacitor Cfe1,1 is connected to plate-line PL0_5 and so on. In at least one embodiment, pedestals have a barrier material on its sidewalls as discussed with reference to FIG. 4C.

Referring to FIG. 19, in at least one embodiment, metal layers coupled to bottom electrodes of capacitors are coupled to storage node sn1 through respective vias. In at least one embodiment, multiple vias connect bottom extended electrode of each capacitor stack. In at least one embodiment, multiple vias are connected to storage node sn1. In at least one embodiment, multiple vias, connected to metal layer (e.g., M3) for sn1 as storage node, connect to extended bottom electrode of higher capacitors in stack. In at least one embodiment, vias 1923 are misaligned. In at least one embodiment, vias 1923 are aligned. Here "misaligned" may generally refer to vias or pedestals that are not continuous in their vertical extension and have side branches as vias couple to metal layers and other vias to extend vertically up. Conversely, term "aligned" here generally refers to vias or pedestals that are continuous in their vertical extension. term continuous here generally means that via or pedestal extends without interruption. In at least one embodiment, "continuous" may refer to extension of via or pedestal with nominal interruption (such as an intervening metal layer) but subsequent via or pedestal on metal layer is along a same vertical line of extension as via below metal line.

In at least one embodiment, metal-2 (M2) is deposited over vias (via1). M2 layer is then polished. In at least one embodiment, capacitors can be moved further up in stack, where capacitor level processing is done between different layers. In at least one embodiment, oxide is deposited over etch stop layer. Thereafter, in at least one embodiment, dry or wet etching is performed to form holes for pedestals. In at least one embodiment, holes are filled with metal, and land on respective M2 layers. In at least one embodiment, fabrication processes such as interlayer dielectric (ILD) oxide deposition followed by ILD etch (to form holes for pedestals), deposition of metal into holes, and subsequent polishing of surface are used to prepare for post pedestal fabrication.

In at least one embodiment, number of fabrication processes of deposition, lithography, and etching takes place to form stack of layers for planar capacitor. In at least one embodiment, capacitors are formed in a backend of die. In at least one embodiment, deposition of ILD is followed by surface polish.

In at least one embodiment, after polishing surface, ILD is deposited. Thereafter, in at least one embodiment, holes are etched through ILD to expose top electrodes of capacitors. In at least one embodiment, holes are then filled with metal. In at least one embodiment, followed by filling holes, top surface is polished. In at least one embodiment, capacitors are connected to plate-lines and storage node sn1 (through pedestals).

In at least one embodiment, ILD is deposited over a polished surface. In at least one embodiment, holes for via are then etched to contact M2 layer. In at least one embodiment, holes are filled with metal to form vias (via2). In at least one embodiment, top surface is then polished. In at least one embodiment, process of depositing metal over vias (via2), depositing ILD, etching holes to form pedestals for next capacitors of stack, forming capacitors, and then forming vias that contact M3 layer, are repeated. In at least one embodiment, this process is repeated to form various capacitors in stack.

In at least one embodiment, top electrode of each capacitor is allowed to directly contact metal above. In at least one embodiment, pedestals that connect to top electrodes are removed. In at least one embodiment, height of stacked capacitors is lowered, and fabrication process is simplified because extra steps for forming pedestals are removed.

Figure 20:
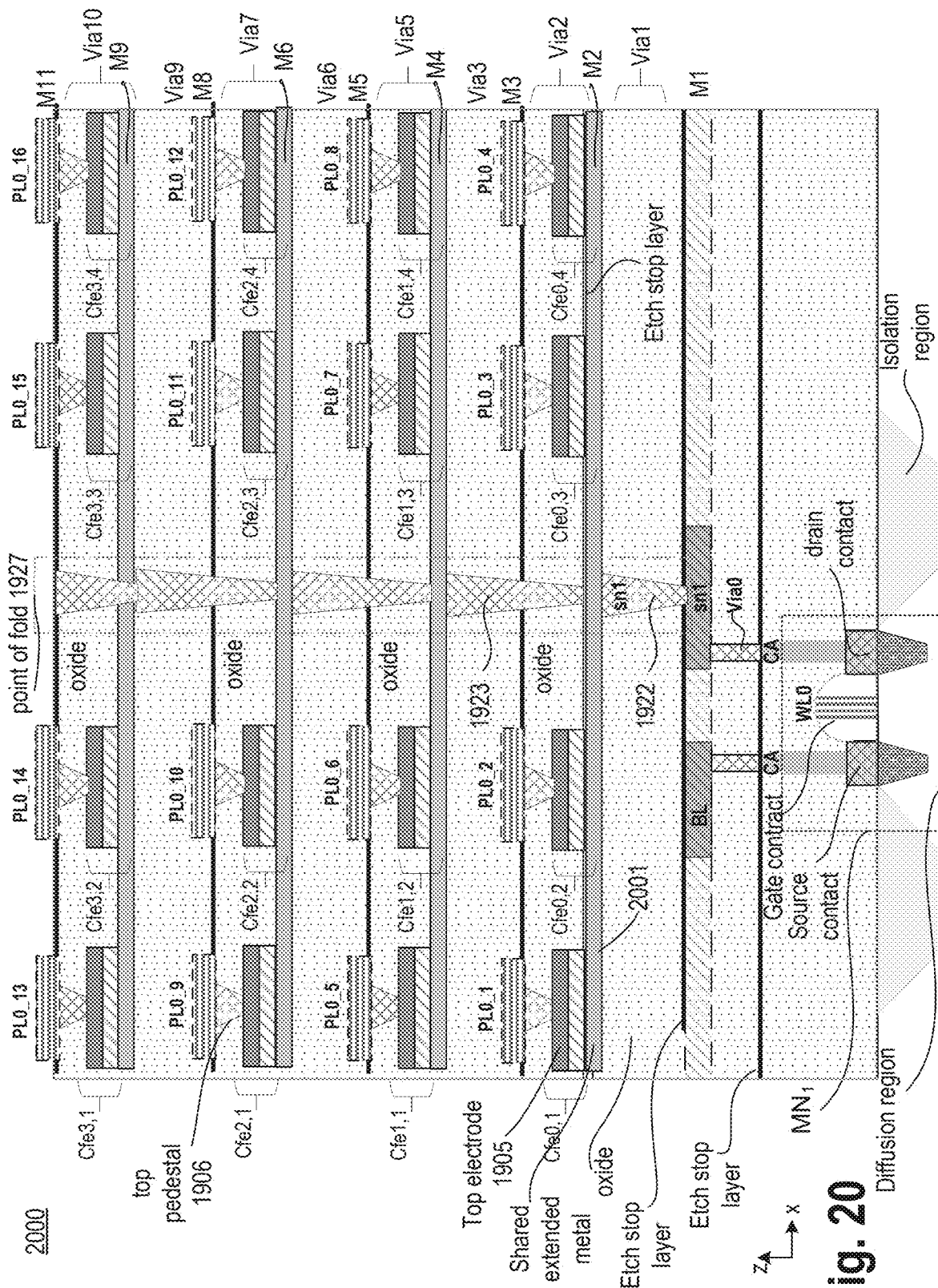
FIG. 20 illustrates a cross-section of a memory bit-cell with folded and stacked capacitors or memory elements, and with shared bottom electrode, in accordance with at least one embodiment.

FIG. 20 illustrates a cross-section of a memory bit-cell 2000 with folded and stacked capacitors or memory elements, and with shared bottom electrode, in accordance with at least one embodiment. In at least one embodiment, shared bottom electrode 2001 is in direct contact with ferroelectric material or memory material. In at least one embodiment, shared bottom electrode 2001 has same materials as those discussed with reference to shared bottom electrode 1901.

Figure 21:
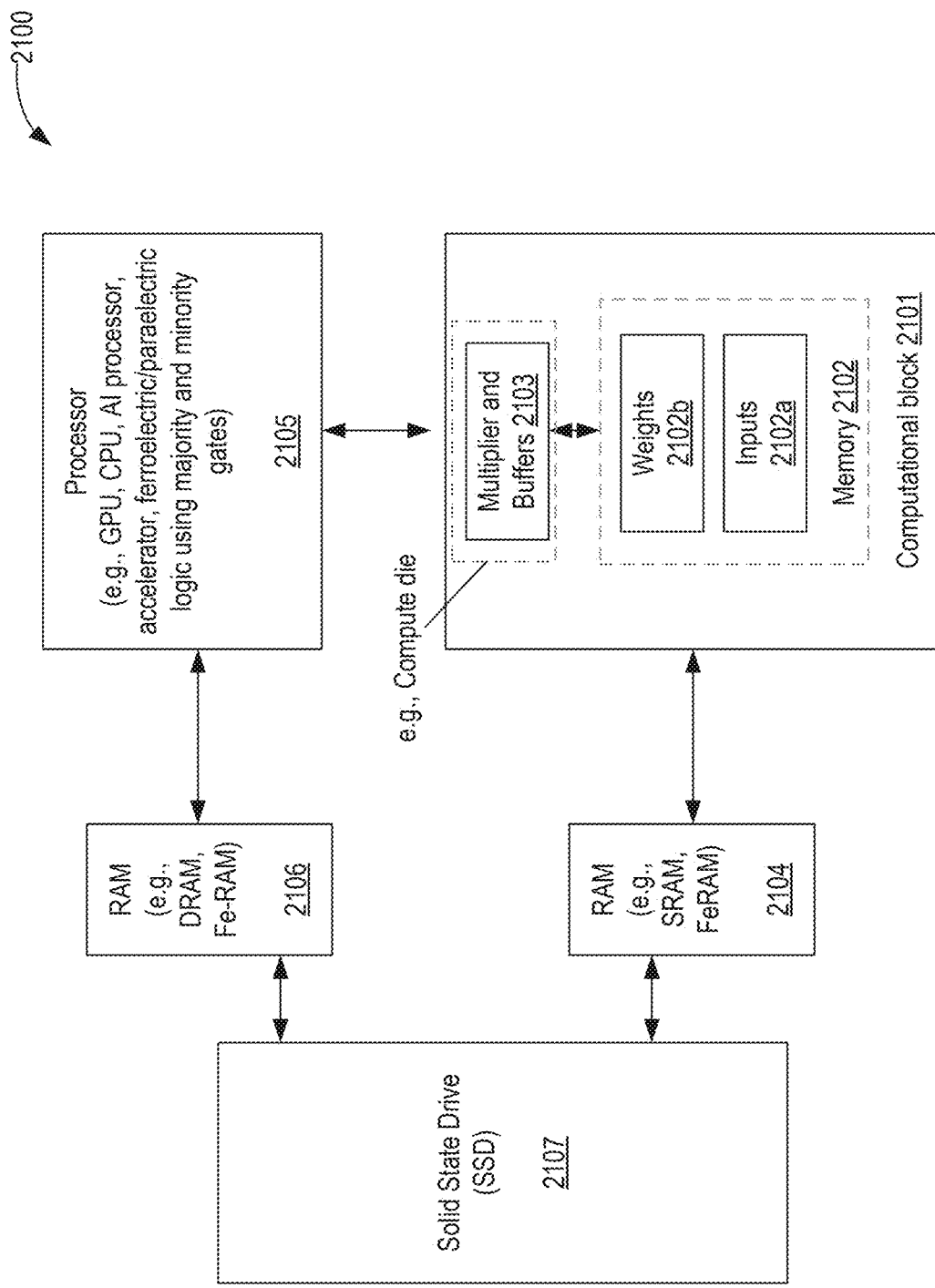
FIG. 21 illustrates a high-level architecture of an artificial intelligence (AI) machine comprising a compute die stacked over a memory die, where the memory die includes memory arrays having bit-cells which are sensed using voltages on PL and BL, in accordance with at least one embodiment.

FIG. 21 illustrates a high-level architecture of an artificial intelligence (AI) machine comprising a compute die stacked over a memory die, where memory die includes memory arrays having bit-cells which are sensed using voltages on PL and BL, in accordance with at least one embodiment.

In at least one embodiment, AI machine 2100 comprises computational block 2101 or processor having random-access memory (RAM) 2102 and multiplier and buffers 2103; first random-access memory 2104 (e.g., static RAM (SRAM), ferroelectric or paraelectric RAM (FeRAM), ferroelectric or paraelectric static random-access memory (FeSRAM)), main processor 2105, second random-access memory 2106 (dynamic RAM (DRAM), FeRAM), and solid-state memory or drive (SSD) 2107. In at least one embodiment, some or all components of AI machine 2100 are packaged in a single package forming a system-on-chip (SoC). In at least one embodiment, SoC can be configured as a logic-on-logic configuration, which can be in a 3D configuration or a 2.5D configuration.

In at least one embodiment, computational block 2101 is packaged in a single package and then coupled to processor 2105 and memories 2104, 2106, and 2107 on a printed circuit board (PCB). In at least one embodiment, computational block 2101 is configured as a logic-on-logic configuration, which can be in a 3D configuration or a 2.5D configuration. In at least one embodiment, computational block 2101 comprises a special purpose compute die 2103 or microprocessor. In at least one embodiment, compute die 2103 is a compute chiplet that performs a function of an accelerator or inference. In at least one embodiment, memory 2102 is DRAM which forms a special memory/cache for special purpose compute die 2103. In at least one embodiment, DRAM can be embedded DRAM (eDRAM) such as 1T1C (one transistor and one capacitor) based memories. In at least one embodiment, RAM 2102 is ferroelectric or paraelectric RAM (Fe-RAM).

In at least one embodiment, compute die 2103 is specialized for applications such as Artificial Intelligence, graph processing, and algorithms for data processing. In at least one embodiment, compute die 2103 further has logic computational blocks, for multipliers and buffers, a special data memory block (e.g., buffers) comprising DRAM, FeRAM, or a combination of them. In at least one embodiment, RAM 2102 has weights and inputs stored to improve computational efficiency. In at least one embodiment, interconnects between processor 2105 (also referred to as special purpose processor), first RAM 2104, and compute die 2103 are optimized for high bandwidth and low latency. In at least one embodiment, architecture of FIG. 21 allows efficient packaging to lower energy, power, or cost, and provides for ultra-high bandwidth between RAM 2104 and compute chiplet 2103 of computational block 2101.

In at least one embodiment, RAM 2102 is partitioned to store input data (or data to be processed) 2102a and weight factors 2102b. In at least one embodiment, input data 2102a is stored in a separate memory (e.g., separate memory die) and weight factors 2102b are stored in a separate memory (e.g., separate memory die).

In at least one embodiment, computational logic or compute chiplet 2103 comprises matrix multiplier, adder, concatenation logic, buffers, and combinational logic. In at least one embodiment, compute chiplet 2103 performs multiplication operation on inputs 2102a and weights 2102b. In at least one embodiment, weights 2102b are fixed weights. In at least one embodiment, processor 2105 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes weights for a training model. Once weights are computed, they are stored in memory 2102. In at least one embodiment, input data that is to be analyzed using a trained model is processed by computational block 2101 with computed weights 2102b to generate an output (e.g., a classification result).

In at least one embodiment, first RAM 2104 is ferroelectric or paraelectric based SRAM. For example, a six transistor (6T) SRAM bit-cell having ferroelectric or paraelectric transistors are used to implement a non-volatile FeSRAM. In at least one embodiment, SSD 2107 comprises NAND flash cells. In at least one embodiment, SSD 2107 comprises NOR flash cells. In at least one embodiment, SSD 2107 comprises multi-threshold NAND flash cells.

In at least one embodiment, non-volatility of FeRAM is used to introduce new features such as security, functional safety, and faster reboot time of AI machine 2100. In at least one embodiment, non-volatile FeRAM is a low power RAM that provides fast access to data and weights. FeRAM 2104 can also serve as fast storage for computational block 2101 (which can be an inference die or an accelerator), which typically has low capacity and fast access requirements.

In at least one embodiment, FeRAM (FeDRAM or FeSRAM) includes ferroelectric or paraelectric material. In at least one embodiment, ferroelectric or paraelectric material may be in a transistor gate stack or in a capacitor of memory. In at least one embodiment, ferroelectric material can be any suitable low voltage FE material discussed herein. While at least one embodiment here is described with reference to ferroelectric material, at least one embodiment is applicable to any of nonlinear polar materials described herein.

Figure 22:
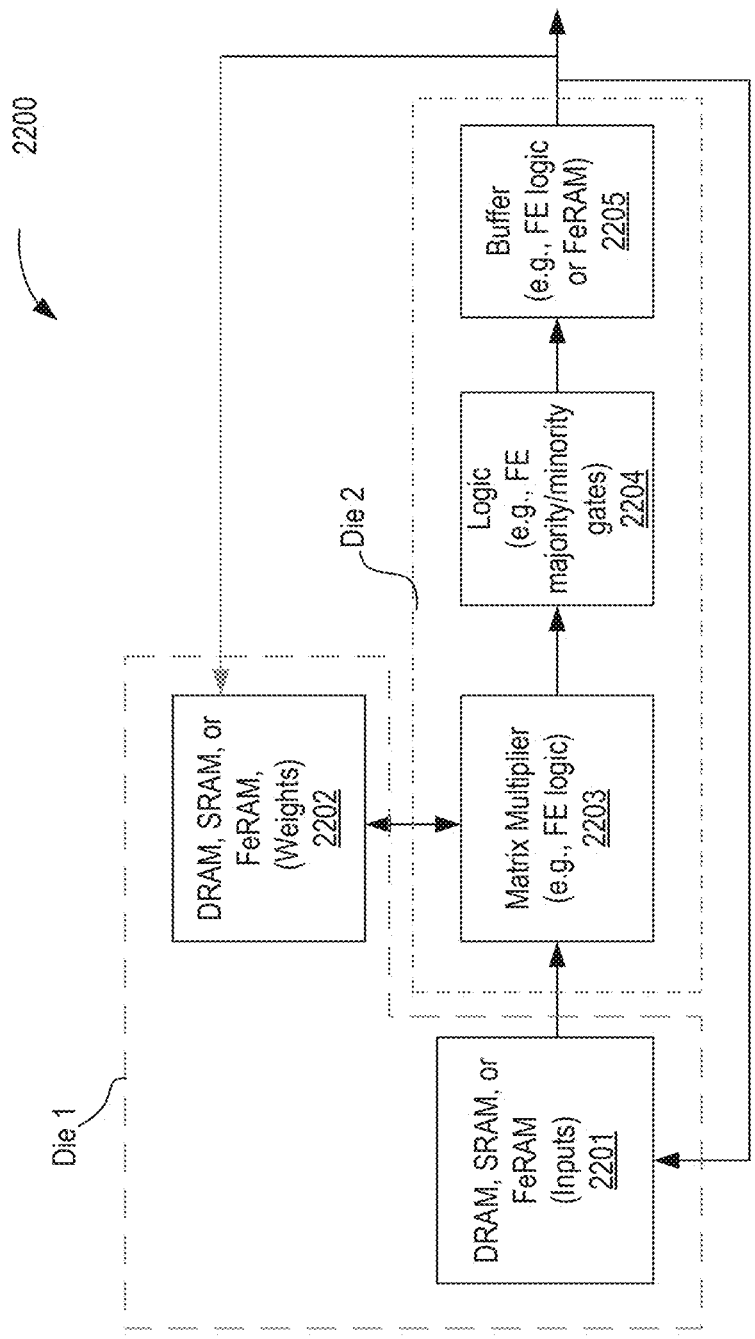
FIG. 22 illustrates an architecture of a computational block comprising a compute die stacked with a memory die, wherein the memory die includes memory arrays having bit-cells which are sensed using voltages on PL and BL, in accordance with at least one embodiment.

FIG. 22 illustrates an architecture of a computational block comprising a compute die stacked with a memory die, wherein memory die includes memory arrays having bit-cells which are sensed using voltages on PL and BL, in accordance with at least one embodiment. In at least one embodiment, architecture of FIG. 22 illustrates an architecture for a special purpose compute die where RAM memory buffers for inputs and weights are split on die-1 and logic and optional memory buffers are split on die-2.

In at least one embodiment, memory die (e.g., Die 1) is positioned below compute die (e.g., Die 2) such that a heat sink or thermal solution is adjacent to compute die. In at least one embodiment, memory die is embedded in an interposer. In at least one embodiment, memory die behaves as an interposer in addition to its basic memory function. In at least one embodiment, memory die is a high bandwidth memory (HBM) which comprises multiple dies of memories in a stack and a controller to control read and write functions to stack of memory dies. In at least one embodiment, memory die comprises a first die 2201 to store input data and a second die 2202 to store weight factors. In at least one embodiment, memory die is a single die that is partitioned such that first partition 2201 of memory die is used to store input data and second partition 2202 of memory die is used to store weights. In at least one embodiment, memory die comprises DRAM. In at least one embodiment, memory die comprises FE-SRAM or FE-DRAM. In at least one embodiment, memory die comprises MRAM. In at least one embodiment, memory die comprises SRAM. In at least one embodiment, memory partitions 2201 and 2202, or memory dies 2201 and 2202 include one or more of: DRAM, FE-SRAM, FE-DRAM, SRAM, and/or MRAM. In at least one embodiment, input data stored in memory partition or die 2201 is data to be analyzed by a trained model with fixed weights stored in memory partition or die 2202.

In at least one embodiment, compute die comprises ferroelectric or paraelectric logic (e.g., majority, minority, and/or threshold gates) to implement matrix multiplier 2203, logic 2204, and temporary buffer 2205. In at least one embodiment, matrix multiplier 2203 performs multiplication operation on input data 'X' and weights 'W' to generate an output 'Y'. In at least one embodiment, this output may be further processed by logic 2204. In at least one embodiment, logic 2204 performs a threshold operation, pooling and drop out operations, and/or concatenation operations to complete AI logic primitive functions.

In at least one embodiment, output of logic 2204 (e.g., processed output 'Y') is temporarily stored in buffer 2205. In at least one embodiment, buffer 2205 is memory such as one or more of: DRAM, Fe-SRAM, Fe-DRAM, MRAM, resistive RAM (Re-RAM) and/or SRAM. In at least one embodiment, buffer 2205 is part of memory die (e.g., Die 1). In at least one embodiment, buffer 2205 performs function of a re-timer. In at least one embodiment, output of buffer 2205 (e.g., processed output 'Y') is used to modify weights in memory partition or die 2202. In at least one embodiment, computational block 2200 not only operates as an inference circuitry, but also as a training circuitry to train a model. In at least one embodiment, matrix multiplier 2203 includes an array of multiplier cells, wherein DRAMs 2201 and 2202 include arrays of memory bit-cells, respectively, wherein each multiplier cell is coupled to a corresponding memory bit-cell of DRAM 2201 and/or DRAM 2202. In at least one embodiment, computational block 2200 comprises an interconnect fabric coupled to array of multiplier cells such that each multiplier cell is coupled to interconnect fabric.

In at least one embodiment, architecture 2200 provides reduced memory access for compute die (e.g., die 2) by providing data locality for weights, inputs, and outputs. In at least one embodiment, data from and to AI computational blocks (e.g., matrix multiplier 2203) is locally processed within a same packaging unit. In at least one embodiment, architecture 2200 also segregates memory and logic operations onto a memory die (e.g., Die 1) and a logic die (e.g., Die 2), respectively, allowing for optimized AI processing. In at least one embodiment, desegregated dies allow for improved yield of dies. In at least one embodiment, a high-capacity memory process for Die 1 allows reduction of power of external interconnects to memory, reduces cost of integration, and results in a smaller footprint.

Figure 23:
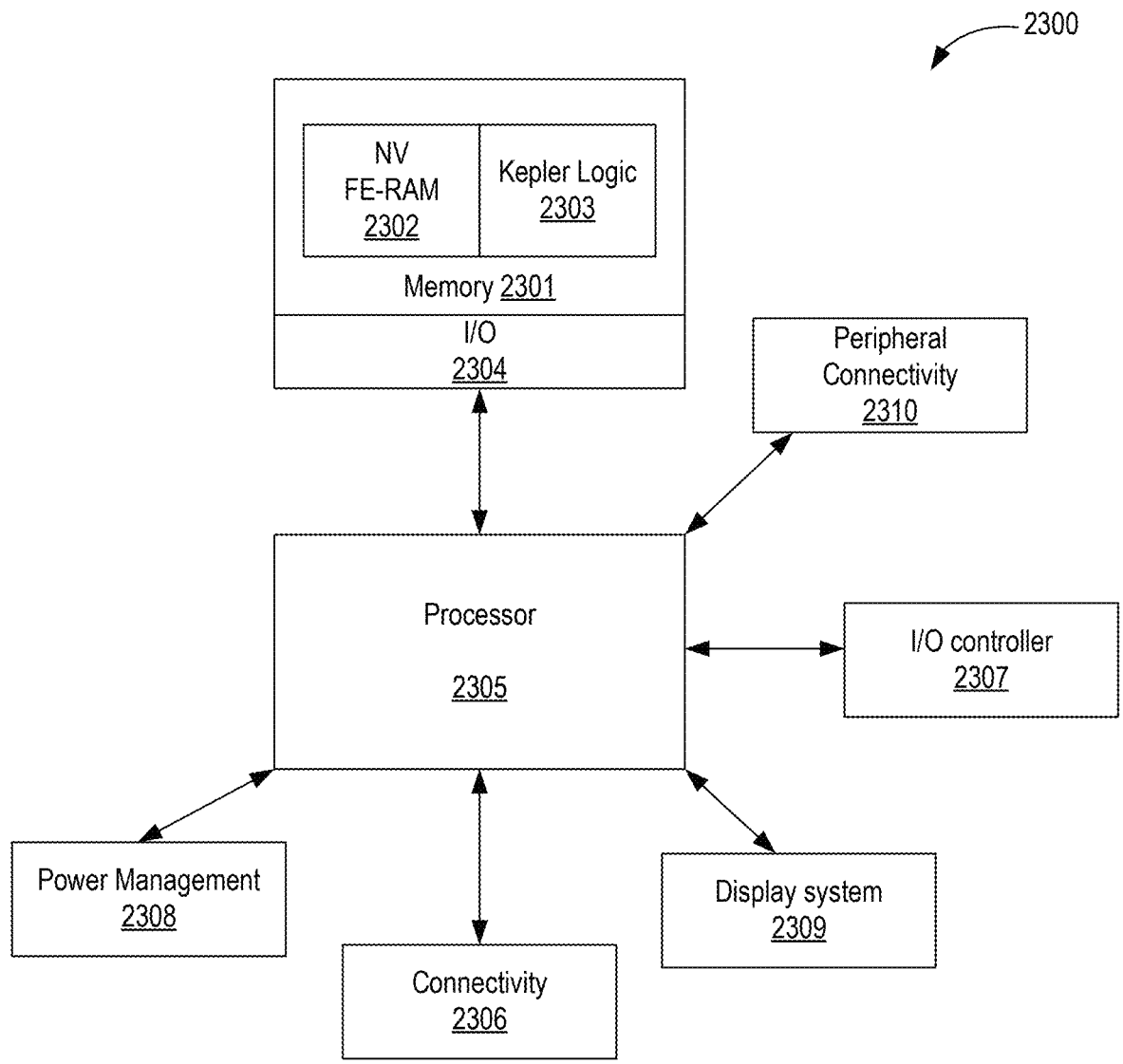
FIG. 23 illustrates a system-on-chip (SOC) that uses memory arrays including memory arrays having bit-cells which are sensed using voltages on PL and BL, in accordance with at least one embodiment.

FIG. 23 illustrates a system-on-chip (SoC) that uses memory arrays including memory arrays having bit-cells which are sensed using voltages on PL and BL, in accordance with at least one embodiment. In at least one embodiment, SoC 2300 comprises memory 2301 having static random-access memory (SRAM) or FE based random-access memory FE-RAM, or any other suitable memory. In at least one embodiment, memory can be non-volatile (NV) or volatile memory. In at least one embodiment, memory 2301 may also comprise logic 2303 to control memory 2302. In at least one embodiment, write and read drivers are part of logic 2303. In at least one embodiment, these drivers and other logic are implemented using majority or threshold gates discussed herein. In at least one embodiment, logic 2303 can comprise majority or threshold gates and traditional logic (e.g., CMOS based NAND, NOR etc.).

In at least one embodiment, SoC further comprises a memory I/O (input-output) interface 2304. In at least one embodiment, interface may be a double-data rate (DDR) compliant interface or any other suitable interface to communicate with a processor. In at least one embodiment, processor 2305 of SoC 2300 can be a single core or multiple core processor. In at least one embodiment, processor 2305 can be a general-purpose processor (CPU), a digital signal processor (DSP), or an Application Specific Integrated Circuit (ASIC) processor. In at least one embodiment, processor 2305 is an artificial intelligence (AI) processor (e.g., a dedicated AI processor, a graphics processor configured as an AI processor). In at least one embodiment, processor 2305 executes instructions that are stored in memory 2301.

In at least one embodiment, AI is a broad area of hardware and software computations where data is analyzed, classified, and then a decision is made regarding data. In at least one embodiment, a model describing classification of data for a certain property or properties is trained over time with large amounts of data. In at least one embodiment, process of training a model requires large amounts of data and processing power to analyze data. In at least one embodiment, when a model is trained, weights or weight factors are modified based on outputs of model. In at least one embodiment, once weights for a model are computed to a high confidence level (e.g., 95% or more) by repeatedly analyzing data and modifying weights to get expected results, model is deemed "trained." In at least one embodiment, trained model with fixed weights is then used to make decisions about new data. In at least one embodiment, training a model and then applying trained model for new data is hardware intensive activity. In at least one embodiment, AI processor has reduced latency of computing training model and using training model, which reduces power consumption of such AI processor systems.

In at least one embodiment, processor 2305 may be coupled to number of other chiplets that can be on same die as SoC 2300 or on separate dies. In at least one embodiment, these chiplets include connectivity circuitry 2306, I/O controller 2307, power management 2308, display system 2309, and connectivity circuitry 2306 (e.g., peripheral connectivity).

In at least one embodiment, connectivity circuitry 2306 represents hardware devices and software components for communicating with other devices. In at least one embodiment, connectivity circuitry 2306 may support various connectivity circuitries and standards. In at least one embodiment, connectivity circuitry 2306 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In at least one embodiment, connectivity circuitry 2306 may support non-cellular standards such as WiFi.

In at least one embodiment, I/O controller 2307 represents hardware devices and software components related to interaction with a user. In at least one embodiment, I/O controller 2307 is operable to manage hardware that is part of an audio subsystem and/or display subsystem. In at least one embodiment, input through a microphone or other audio device can provide input or commands for one or more applications or functions of SoC 2300. In at least one embodiment, I/O controller 2307 illustrates a connection point for additional devices that connect to SoC 2300 through which a user might interact with system. In at least one embodiment, devices that can be attached to SoC 2300 might include microphone devices, speaker or stereo systems, video systems or other display devices, keyboard or keypad devices, or other I/O devices for use with specific applications such as card readers or other devices.

In at least one embodiment, power management 2308 represents hardware or software that performs power management operations, e.g., based at least in part on receiving measurements from power measurement circuitries, temperature measurement circuitries, charge level of battery, and/or any other appropriate information that may be used for power management. In at least one embodiment, by using majority and threshold gates discussed herein, non-volatility is achieved at output of these logic. In at least one embodiment, power management 2308 may accordingly put such logic into low power state without worry of losing data. In at least one embodiment, power management may select a power state according to Advanced Configuration and Power Interface (ACPI) specification for one or all components of SoC 2300.

In at least one embodiment, display system 2309 represents hardware (e.g., display devices) and software (e.g., drivers) components that provide a visual and/or tactile display for a user to interact with processor 2305. In at least one embodiment, display system 2309 includes a touch screen (or touch pad) device that provides both output and input to a user. In at least one embodiment, display system 2309 may include a display interface, which includes particular screen or hardware device used to provide a display to a user. In at least one embodiment, display interface includes logic separate from processor 2305 to perform at least some processing related to display.

In at least one embodiment, peripheral connectivity 2310 may represent hardware devices and/or software devices for connecting to peripheral devices such as printers, chargers, cameras, and etc. In at least one embodiment, peripheral connectivity 2310 may support communication protocols, e.g., PCIe (Peripheral Component Interconnect Express), USB (Universal Serial Bus), Thunderbolt, High-Definition Multimedia Interface (HDMI), Firewire, and etc.

In at least one embodiment, SoC 2300 includes a coherent cache or memory-side buffer chiplet (not shown) which includes ferroelectric or paraelectric memory. In at least one embodiment, coherent cache or memory-side buffer chiplet can be coupled to processor 2305 and/or memory 2301 as described herein (e.g., via silicon bridge or vertical stacking).

Here, "device" may generally refer to an apparatus according to context of usage of that term. In at least one embodiment, a device may refer to a stack of layers or structures, a single structure or layer, a connection of various structures having active and/or passive elements, etc. Generally, a device is a three-dimensional structure with a plane along x-y direction and a height along z direction of an x-y-z Cartesian coordinate system. In at least one embodiment, plane of device may also be plane of an apparatus, which comprises device.

Throughout specification, and in claims, "connected" may generally refer to a direct connection, such as electrical, mechanical, or magnetic connection between things that are connected, without any intermediary devices.

Here, "coupled" may generally refer to a direct or indirect connection, such as a direct electrical, mechanical, or magnetic connection between things that are connected or an indirect connection, through one or more passive or active intermediary devices.

Here, "adjacent" may generally refer to a position of a thing being next to (e.g., immediately next to or close to with one or more things between them) or adjoining another thing (e.g., abutting it).

Here, "circuit" or "module" may generally refer to one or more passive and/or active components that are arranged to cooperate with one another to provide a desired function.

Here, "signal" may generally refer to at least one current signal, voltage signal, magnetic signal, or data/clock signal. Here, meaning of "a," "an," and "the" include plural references. Here, meaning of "in" includes "in" and "on."

Here, "analog signal" generally refers to any continuous signal for which time varying feature (variable) of signal is a representation of some other time varying quantity, e.g., analogous to another time varying signal.

Here, "digital signal" may generally refer to a physical signal that is a representation of a sequence of discrete values (a quantified discrete-time signal), for example of an arbitrary bit stream, or of a digitized (sampled and analog-to-digital converted) analog signal.

Here, "scaling" may generally refer to converting a design (schematic and layout) from one process technology to another process technology and subsequently being reduced in layout area. Here, "scaling" may generally refer to downsizing layout and devices within same technology node. Here, "scaling" may also generally refer to adjusting (e.g., slowing down or speeding up—e.g., scaling down, or scaling up respectively) of a signal frequency relative to another parameter, for example, power supply level.

Here, terms "substantially," "close," "approximately," "near," and "about," generally refer to being within +/−10% of a target value. For example, unless otherwise specified in explicit context of their use, terms "substantially equal," "about equal" and "approximately equal" mean that there is no more than incidental variation between among things so described. In at least one embodiment, such variation is typically no more than +/−10% of a predetermined target value.

Here, "stack and fold" generally refers to a configuration of devices that are stacked vertically (substantially directly above or with a horizontal offset) such that one terminal of devices is shared to a common node, and further capacitors are placed along both sides of common node. In at least one embodiment, common node thus becomes a point of fold. In at least one embodiment, devices here are capacitors. At least one embodiment is not limited to capacitors and are applicable to any devices with a common node. In at least one embodiment, N number of capacitors can be divided in L number of stack layers such that there are N/L capacitors in each stacked layer. In at least one embodiment, N/L capacitor's one terminal can be shorted together with an electrode (e.g., bottom electrode). In at least one embodiment, electrodes can be a metal, a conducting oxide, or a combination of a conducting oxide and a barrier (or insulative material).

In at least one embodiment, capacitors are stacked and folded, and also vertically offset relative to lower capacitors in stack. In at least one embodiment, offset allows for routing metal electrodes coupled to top electrodes of capacitors through space created by offset while reducing parasitic to capacitor(s) underneath. In at least one embodiment, various metal electrodes are parallel to one another with limited jogs, for example.

In at least one embodiment, capacitors are staggered while sharing a same bottom electrode or shared metal layer. In at least one embodiment, capacitors are staggered by having offsets in an x-direction and a y-direction relative to one another. In at least one embodiment, offsets allow for routing metal electrodes coupled to top electrodes of capacitors through space created by offset. In at least one embodiment, various metal electrodes are parallel to one another with limited jogs. At least one embodiment, can be combined with at least one other embodiment. Hence, all possible permutations of combinations are not shown, but are within scope of this disclosure.

Here, "staggered configuration" or "staggered" may generally refer to placement of devices (e.g., capacitors) relative to one another such that devices are offset from one another in a horizontal plane and/or a vertical plane. In at least one embodiment, when devices are offset in a horizontal plane, devices may be diagonally away from one another (e.g., having an x-offset and a y-offset in a x-y horizontal plane). In at least one embodiment, when devices are offset in a vertical plane, devices may be diagonally away from one another (e.g., having an x-offset and a z-offset in a x-z vertical plane). In at least one embodiment, devices can be staggered both horizontally and vertically. In at least one embodiment, devices are staggered horizontally. In at least one embodiment, devices are staggered vertically.

Unless otherwise specified use of ordinal adjectives "first," "second," "third," and etc., to describe a common object, merely indicate that different instances of like objects are being referred to and are not intended to imply that objects so described must be in a given sequence, either temporally, spatially, in ranking or in any other manner.

For purposes of present disclosure, phrases "A and/or B" and "A or B" mean (A), (B), or (A and B). In at least one embodiment, phrase "A, B, and/or C" means (A), (B), (C), (A and B), (A and C), (B and C), or (A, B and C).

Here, "left," "right," "front," "back," "top," "bottom," "over," "under," and the like in description and in claims, if any, are used for descriptive purposes and not necessarily for describing permanent relative positions. In at least one embodiment, "over," "under," "front side," "back side," "top," "bottom," "over," "under," and "on" as used herein refer to a relative position of one component, structure, or material with respect to other referenced components, structures or materials within a device, where such physical relationships are noteworthy. In at least one embodiment, these terms are employed herein for descriptive purposes only and predominantly within context of a device z-axis and therefore may be relative to an orientation of a device. In at least one embodiment, a first material "over" a second material in context of a figure provided herein may also be "under" second material if device is oriented upside-down relative to context of figure provided. In context of materials, one material disposed over or under another may be directly in contact or may have one or more intervening materials. Moreover, one material disposed between two materials may be directly in contact with two layers or may have one or more intervening layers. In at least one embodiment, a first material "on" a second material is in direct contact with that second material. Similar distinctions are to be made in context of component assemblies.

Here, "between" may be employed in context of z-axis, x-axis or y-axis of a device. In at least one embodiment, a material that is between two other materials may be in contact with one or both of those materials, or it may be separated from both of other two materials by one or more intervening materials. In at least one embodiment, a material "between" two other materials may therefore be in contact with either of other two materials, or it may be coupled to other two materials through an intervening material. In at least one embodiment, a device that is between two other devices may be directly connected to one or both of those devices, or it may be separated from both of other two devices by one or more intervening devices.

Here, multiple non-silicon semiconductor material layers may be stacked within a single fin structure. In at least one embodiment, multiple non-silicon semiconductor material layers may include one or more "P-type" layers that are suitable (e.g., offer higher hole mobility than silicon) for P-type transistors. In at least one embodiment, multiple non-silicon semiconductor material layers may further include one or more "N-type" layers that are suitable (e.g., offer higher electron mobility than silicon) for N-type transistors. In at least one embodiment, multiple non-silicon semiconductor material layers may further include one or more intervening layers separating N-type from P-type layers. In at least one embodiment, intervening layers may be at least partially sacrificial, for example to allow one or more of a gate, source, or drain to wrap completely around a channel region of one or more of N-type and P-type transistors. In at least one embodiment, multiple non-silicon semiconductor material layers may be fabricated, at least in part, with self-aligned techniques such that a stacked CMOS device may include both a high-mobility N-type and P-type transistor with a footprint of a single FET (field effect transistor).

Here, "backend" or back-end-of-line (BOEL) may generally refer to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of backend of die. Here, "frontend" may generally refer to a section of die that includes active region (e.g., where transistors are fabricated) and low-level metal layers and corresponding vias that are closer to active region (e.g., metal layer 5 and below in ten-metal stack die, for example).

Reference in specification to "an embodiment," "one embodiment," "in at least one embodiment," "some embodiments," or "other embodiments" means that a particular feature, structure, or characteristic described in connection with embodiments is included in at least some embodiments, but not necessarily all embodiments. Various appearances of "an embodiment," "one embodiment," "in at least one embodiment," or "some embodiments" are not necessarily all referring to same embodiments. If specification states a component, feature, structure, or characteristic "may," "might," or "could" be included, that particular component, feature, structure, or characteristic is not required to be included. If specification or claim refers to "a" or "an" element, that does not mean there is only one of elements. If specification or claims refer to "an additional" element, that does not preclude there being more than one of additional elements.

Furthermore, particular features, structures, functions, or characteristics may be combined in any suitable manner in one or more embodiments. For example, a first embodiment may be combined with a second embodiment anywhere particular features, structures, functions, or characteristics associated with two embodiments are not mutually exclusive.

While at least one embodiment has been described in conjunction with specific embodiments thereof, many alternatives, modifications and variations of such embodiments will be apparent to those of ordinary skill in art in light of foregoing description. At least one embodiment is intended to embrace all such alternatives, modifications, and variations as to fall within broad scope of appended claims.

In addition, well-known power/ground connections to integrated circuit (IC) chips and other components may or may not be shown within presented figures, for simplicity of illustration and discussion, and so as not to obscure any embodiment. Further, arrangements may be shown in block diagram form to avoid obscuring any embodiment, and also in view of fact that specifics with respect to implementation of such block diagram arrangements are highly dependent upon platform within which an embodiment is to be implemented (e.g., such specifics should be well within purview of one skilled in art). Where specific details (e.g., circuits) are set forth to describe example embodiments of disclosure, it should be apparent to one skilled in art that disclosure can be practiced without, or with variation of, these specific details. Description of an embodiment is thus to be regarded as illustrative instead of limiting.

In at least one embodiment, structures described herein can also be described as method(s) of forming those structures or apparatuses, and method(s) of operation of these structures or apparatuses. Following examples are provided that illustrate at least one embodiment. An example can be combined with any other example. As such, at least one embodiment can be combined with at least another embodiment without changing scope of an embodiment.

Example 1: An apparatus comprising: a bit-cell coupled to a plate-line, a word-line, and a bit-line, wherein the plate-line is parallel to the bit-line, and wherein the word-line controls a transistor of the bit-cell; and a sense circuitry coupled to the plate-line and the bit-line, wherein the sense circuitry is to sense a bit-value stored in the bit-cell based, at least in part, on a first floating charge on the plate-line, and a second floating charge on the bit-line.

Example 2: The apparatus of example 1 comprising a first switch to pre-charge or pre-discharge the plate-line to a first reference voltage before the sense circuitry is to sense the first floating charge on the plate-line.

Example 3: The apparatus of example 1 comprising a second switch to pre-charge or pre-discharge the bit-line to a second reference voltage before the sense circuitry is to sense the second floating charge on the bit-line.

Example 4: The apparatus of example 1, wherein the sense circuitry is to detect a difference between the first floating charge and the second floating charge.

Example 5: The apparatus of example 1, wherein the bit-cell comprises a capacitor having a first terminal coupled to the plate-line and a second terminal coupled to the transistor, wherein a gate of the transistor is coupled to the word-line, and wherein a source or drain terminal of the transistor is coupled to the bit-line.

Example 6: The apparatus of example 5, wherein the capacitor comprises a non-linear polar material.

Example 7: The apparatus of example 6, wherein the non-linear polar material is one of a ferroelectric, a paraelectric, or a non-linear dielectric material.

Example 8: The apparatus of example 6, wherein the non-linear polar material is doped one or more elements of a 3d, 4d, 5d, 6d, 4f, and 5f series of a periodic table.

Example 9: The apparatus of example 6, wherein the non-linear polar material includes one of: a perovskite material which includes one of: $BaTiO_3$, $PbTiO_3$, $KNbO_3$, or $NaTaO_3$; bismuth ferrite (BFO); barium titanate (BTO); BFO doped with one of: Sc, Ti, V, Cr, Mn, Fe, Co, Ni, Cu, or Zn; BTO doped with one of: Sc, Ti, V, Cr, Mn, Fe, Co, Ni, Cu, or Zn; LBFO doped with Mn; lead zirconium titanate (PZT), or PZT with a doping material, wherein the first doping material is one of La, Nb, Mn, or 5d series elements; bismuth ferrite (BFO) with a second doping material, wherein the second doping material is one of lanthanum, elements from lanthanide series of a periodic table, or elements of a 3d, 4d, 5d, 6d, 4f and 5f series of the periodic table; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a hexagonal ferroelectric which includes one of: $YMnO_3$ or $LuFeO_3$; hexagonal ferroelectrics of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides such as $Hf1-x\ Ex\ Oy$, where E can be Al, Ca, Ce, Dy, Er, Gd, Ge, La, Sc, Si, Sr, Sn, Zr, or Y; Al (1-x) Sc (x) N, Ga(1-x)Sc(x)N, Al(1-x)Y(x)N or Al(1-x-y)Mg(x)Nb(y)N, Ey doped $HfO_2$, where x includes one of: Al, Ca, Ce, Dy, Er, Gd, Ge, La, Sc, Si, Sr, Sn, or Y, wherein 'x' or 'y' is a fraction; or niobate type compounds $LiNbO_3$, $LiTaO_3$, lithium iron tantalum oxyfluoride, barium strontium niobate, sodium barium niobate, or potassium strontium niobate; an improper ferroelectric material which includes one of: [PTO/STO]n or [LAO/STO]n, wherein 'n' is between 1 and 100, or a paraelectric material that comprises $SrTiO_3$, $Ba(x)Sr(y)TiO_3$, $HfZrO_2$, Hf—Si—O, La-substituted $PbTiO_3$, or a PMN-PT based relaxor ferroelectrics; or a paraelectric material that comprises $SrTiO_3$, $Ba(x)Sr(y)TiO_3$, $HfZrO_2$, Hf—Si—O, or a PMN-PT based relaxor ferroelectrics.

Example 10: The apparatus of example 1, wherein the bit-cell comprises two or more capacitors, wherein a first capacitor of the two or more capacitors has a first terminal coupled to the plate-line and a second terminal coupled to the transistor, wherein a gate of the transistor is coupled to the word-line, and wherein a source or drain terminal of the transistor is coupled to the bit-line.

Example 11: The apparatus of example 10, wherein the two or more capacitors are planar capacitors that are arranged in a stacked and/or folded configuration.

Example 12: The apparatus of example 1, wherein the transistor is a first transistor, wherein the first transistor is coupled to a storage node, wherein the bit-cell comprises: a second transistor coupled to the first transistor, wherein the second transistor includes a second gate terminal coupled to the storage node, a second source terminal couple to a sense line, and a second drain terminal coupled to a bias; and a plurality of capacitors having a first terminal coupled to the storage node, wherein a second terminal of a first capacitor of the plurality of capacitors is coupled to the plate-line, wherein the plurality of capacitors are planar capacitors that are arranged in a stacked and/or folded configuration.

Example 13: An apparatus comprising: one or more circuitries coupled to a bit-cell, wherein the bit-cell is coupled to a plate-line and a bit-line, wherein the one or more circuitries are to sense a bit-value stored in the bit-cell based, at least in part, on a first floating charge on a plate-line and a second floating charge on a bit-line.

Example 14: The apparatus of example 13 comprising a first switch to pre-charge or pre-discharge the plate-line to a first reference voltage before the one or more circuitries are to sense the first floating charge on the plate-line.

Example 15: The apparatus of example 14 comprising a second switch to pre-charge or pre-discharge the bit-line to a second reference voltage before the one or more circuitries are to sense the second floating charge on the bit-line.

Example 16: The apparatus of example 15, wherein the first reference voltage is substantially higher than the second reference voltage, or the second reference voltage is substantially higher than the first reference voltage.

Example 17: The apparatus of example 13, wherein the one or more circuitries are to detect a difference between the first floating charge and the second floating charge.

Example 18: A system comprising: a memory to store instructions; a processor circuitry to execute the instructions; and a communication interface to allow the processor circuitry to communicate with another device, wherein the memory includes: a bit-cell coupled to a plate-line, a word-line, and a bit-line, wherein the plate-line is parallel to the bit-line, and wherein the word-line controls a transistor of the bit-cell; and a sense circuitry coupled to the plate-line and the bit-line, wherein the sense circuitry is to sense a bit-value stored in the bit-cell based, at least in part, on a first floating charge on the plate-line and a second floating charge on the bit-line.

Example 19: The system of example 18, wherein the memory comprises: a first switch to pre-charge or pre-discharge the plate-line to a first reference voltage before the sense circuitry is to sense the first floating charge on the plate-line; and a second switch to pre-charge or pre-discharge the bit-line to a second reference voltage before the sense circuitry is to sense the second floating charge on the bit-line.

Example 20: The system of example 19, wherein the sense circuitry is to detect a difference between the first floating charge and the second floating charge.

An abstract is provided that will allow reader to ascertain nature and gist of technical disclosure. Abstract is submitted with an understanding that it will not be used to limit scope or meaning of claims. Following claims are hereby incorporated into detailed description, with each claim standing on its own as a separate embodiment.

We claim:

1. An apparatus comprising:
a bit-cell coupled to a plate-line, a word-line, and a bit-line, wherein the plate-line is parallel to the bit-line, and wherein the word-line controls a transistor of the bit-cell; and
a sense circuitry coupled to the plate-line and the bit-line, wherein the sense circuitry is to sense a bit-value stored in the bit-cell based, at least in part, on a first floating charge on the plate-line, and a second floating charge on the bit-line, wherein the bit-cell comprises two or more capacitors, wherein a first capacitor of the two or more capacitors has a first terminal coupled to the plate-line and a second terminal coupled to the transistor, wherein a gate of the transistor is coupled to the word-line, and wherein a source or drain terminal of the transistor is coupled to the bit-line.

2. The apparatus of claim 1 comprising a first switch to pre-charge or pre-discharge the plate-line to a first reference voltage before the sense circuitry is to sense the first floating charge on the plate-line.

3. The apparatus of claim 1 comprising a second switch to pre-charge or pre-discharge the bit-line to a second reference voltage before the sense circuitry is to sense the second floating charge on the bit-line.

4. The apparatus of claim 1, wherein the sense circuitry is to detect a difference between the first floating charge and the second floating charge.

5. The apparatus of claim 1, wherein the bit-cell comprises a capacitor having a first terminal coupled to the plate-line and a second terminal coupled to the transistor, wherein a gate of the transistor is coupled to the word-line, and wherein a source or drain terminal of the transistor is coupled to the bit-line.

6. The apparatus of claim 5, wherein the capacitor comprises a non-linear polar material.

7. The apparatus of claim 6, wherein the non-linear polar material is one of a ferroelectric, a paraelectric, or a non-linear dielectric material.

8. The apparatus of claim 6, wherein the non-linear polar material is doped with one or more elements of a 3d, 4d, 5d, 6d, 4f, or 5f series of a periodic table.

9. The apparatus of claim 6, wherein the non-linear polar material includes one of:
a perovskite material which includes one of: $BaTiO_3$, $PbTiO_3$, $KNbO_3$, or $NaTaO_3$;
bismuth ferrite (BFO);
barium titanate (BTO);
BFO doped with one of: Sc, Ti, V, Cr, Mn, Fe, Co, Ni, Cu, or Zn;
BTO doped with one of: Sc, Ti, V, Cr, Mn, Fe, Co, Ni, Cu, or Zn;
LBFO doped with Mn;
lead zirconium titanate (PZT), or PZT with a doping material, wherein the doping material is one of La, Nb, Mn, or 5d series elements;
bismuth ferrite (BFO) with a doping material, wherein the doping material is one of lanthanum, elements from lanthanide series of a periodic table, or elements of a 3d, 4d, 5d, 6d, 4f or 5f series of the periodic table;
a relaxor ferroelectric material which includes one of; lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);
a hexagonal ferroelectric which includes one of: $YMnO_3$ or $LuFeO_3$;
hexagonal ferroelectrics of a type h-$RMnO_3$, wherein R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides;
hafnium oxides as $Hf_{(1-x)}E_xO_y$, where E can be Al, Ca, Ce, Dy, Er, Gd, Ge, La, Sc, Si, Sr, Sn, Zr, or Y; $Al_{(1-x)}Sc_{(x)}$ N, $Ga_{(1-x)}Sc_{(x)}$ N, $Al_{(1-x)}Y_{(x)}$N or $Al_{(1-x-y)}Mg_{(x)}Nb_{(y)}$N, $E_y$ doped $HfO_2$, where x includes one of: Al, Ca, Ce, Dy, Er, Gd, Ge, La, Sc, Si, Sr, Sn, or Y, wherein 'x' or 'y' is a fraction; or niobate type compounds $LiNbO_3$, $LiTaO_3$, lithium iron tantalum oxyfluoride, barium strontium niobate, sodium barium niobate, or potassium strontium niobate;
an improper ferroelectric material which includes one of: [PTO/STO]n or [LAO/STO]n, wherein 'n' is between 1 and 100, or a paraelectric material that comprises $SrTiO_3$, $Ba_{(x)}Sr_{(y)}TiO_3$, $HfZrO_2$, Hf—Si—O, La-substituted $PbTiO_3$, or a PMN-PT based relaxor ferroelectric; or
a paraelectric material that comprises $SrTiO_3$, $Ba_{(x)}Sr_{(y)}TiO_3$, $HfZrO_2$, Hf—Si—O, or a PMN-PT based relaxor ferroelectric.

10. The apparatus of claim 1, wherein the two or more capacitors are planar capacitors that are arranged in a stacked and/or folded configuration.

11. The apparatus of claim 1, wherein the transistor is a first transistor, wherein the first transistor is coupled to a storage node, wherein the bit-cell comprises:
a second transistor coupled to the first transistor, wherein the second transistor includes a second gate terminal coupled to the storage node, a second source terminal coupled to a sense line, and a second drain terminal coupled to a bias; and
a plurality of capacitors having a first terminal coupled to the storage node, wherein a second terminal of a first capacitor of the plurality of capacitors is coupled to the plate-line, wherein the plurality of capacitors are planar capacitors that are arranged in a stacked and/or folded configuration.

12. An apparatus comprising:
one or more circuitries coupled to a bit-cell, wherein the bit-cell is coupled to a plate-line and a bit-line, wherein the one or more circuitries are to sense a bit-value stored in the bit-cell based, at least in part, on a first floating charge on the plate-line and a second floating charge on the bit-line, wherein the bit-cell comprises two or more capacitors, wherein a first capacitor of the two or more capacitors has a first terminal coupled to the plate-line and a second terminal coupled to the transistor, wherein a gate of the transistor is coupled to the word-line, and wherein a source or drain terminal of the transistor is coupled to the bit-line.

13. The apparatus of claim 12 comprising: a first switch to pre-charge or pre-discharge the plate-line to a first reference voltage before the one or more circuitries are to sense the first floating charge on the plate-line.

14. The apparatus of claim 13 comprising: a second switch to pre-charge or pre-discharge the bit-line to a second reference voltage before the one or more circuitries are to sense the second floating charge on the bit-line.

15. The apparatus of claim 14, wherein the first reference voltage is substantially higher than the second reference voltage, or the second reference voltage is substantially higher than the first reference voltage.

16. The apparatus of claim 12, wherein the one or more circuitries are to detect a difference between the first floating charge and the second floating charge.

17. A system comprising:
a memory to store instructions;
a processor circuitry to execute the instructions; and
a communication interface to allow the processor circuitry to communicate with another device, wherein the memory includes:
a bit-cell coupled to a plate-line, a word-line, and a bit-line, wherein the plate-line is parallel to the bit-line, and wherein the word-line controls a transistor of the bit-cell; and
a sense circuitry coupled to the plate-line and the bit-line, wherein the sense circuitry is to sense a bit-value stored in the bit-cell based, at least in part, on a first floating charge on the plate-line and a second floating charge on the bit-line, wherein the bit-cell comprises two or more capacitors, wherein a first capacitor of the two or more capacitors has a first terminal coupled to the plate-line and a second terminal coupled to the transistor, wherein a gate of the transistor is coupled to the word-line, and wherein a source or drain terminal of the transistor is coupled to the bit-line.

18. The system of claim 17, wherein the memory comprises:
a first switch to pre-charge or pre-discharge the plate-line to a first reference voltage before the sense circuitry is to sense the first floating charge on the plate-line; and
a second switch to pre-charge or pre-discharge the bit-line to a second reference voltage before the sense circuitry is to sense the second floating charge on the bit-line.

19. The system of claim 18, wherein the sense circuitry is to detect a difference between the first floating charge and the second floating charge.

* * * * *